US009905512B2

United States Patent
Iwasaki et al.

(10) Patent No.: US 9,905,512 B2
(45) Date of Patent: Feb. 27, 2018

(54) SEMICONDUCTOR DEVICE CONTAINING MEMORY CELLS WITH A FUSE IN STATIC RANDOM MEMORY CELL (SRAM) DEVICE AND METHOD OF MANUFACTURING SAME

(71) Applicant: Renesas Electronics Corporation, Tokyo (JP)

(72) Inventors: Toshifumi Iwasaki, Ibaraki (JP); Yukio Maki, Ibaraki (JP)

(73) Assignee: Renesas Electronics Corporation, Koutou-Ku, Tokyo (JP)

( * ) Notice: Subject to any disclaimer, the term of this patent is extended or adjusted under 35 U.S.C. 154(b) by 0 days.

(21) Appl. No.: 15/016,360

(22) Filed: Feb. 5, 2016

(65) Prior Publication Data

US 2016/0276270 A1    Sep. 22, 2016

(30) Foreign Application Priority Data

Mar. 17, 2015  (JP) .................................. 2015-053255

(51) Int. Cl.

| H01L 27/11 | (2006.01) |
|---|---|
| H01L 27/06 | (2006.01) |
| H01L 23/52 | (2006.01) |
| H01L 21/76 | (2006.01) |
| H01L 27/02 | (2006.01) |
| H01L 27/08 | (2006.01) |
| H01L 27/10 | (2006.01) |
| H01L 23/525 | (2006.01) |
| H01L 21/768 | (2006.01) |

(52) U.S. Cl.
CPC .... *H01L 23/5256* (2013.01); *H01L 21/76801* (2013.01); *H01L 21/76831* (2013.01); *H01L 27/11* (2013.01)

(58) Field of Classification Search
CPC ........... H01L 23/5256; H01L 21/76897; H01L 27/11; H01L 27/1112; H01L 27/0629; H01L 28/20; H01L 27/0688; H01L 27/0266; H01L 27/0922; H01L 27/088; H01L 27/0251; H01L 27/105; H01L 27/10852; H01L 27/10894
USPC .................................. 257/379; 438/200, 210
See application file for complete search history.

(56) References Cited

U.S. PATENT DOCUMENTS

2005/0006718 A1   1/2005  Hanji et al.
2007/0281461 A1*  12/2007  Jang .................. H01L 21/76804
                                                  438/622

(Continued)

FOREIGN PATENT DOCUMENTS

| JP | 2000-294648 A | 10/2000 |
|---|---|---|
| JP | 2005-032916 A | 2/2005 |

*Primary Examiner* — Allen Parker
*Assistant Examiner* — Didarul Mazumder
(74) *Attorney, Agent, or Firm* — Sughrue Mion, PLLC

(57) ABSTRACT

An object of the invention is to provide a semiconductor device having less cracking or peeling and a method of manufacturing the same. A fuse portion of a semiconductor device has bit lines electrically coupled to a SRAM memory cell. The bit lines are covered by an interlayer insulating film. As the interlayer insulating film, a boron-doped BPTEOS film is formed. The bit lines have thereabove a fuse. The fuse and the bit lines are electrically coupled to each other via contact plugs. The interlayer insulating film that covers the bit lines therewith is separated from the contact plugs.

11 Claims, 52 Drawing Sheets

(56) References Cited

U.S. PATENT DOCUMENTS

| | | | |
|---|---|---|---|
| 2012/0199913 A1* | 8/2012 | Murata | H01L 21/2686 257/369 |
| 2013/0147009 A1* | 6/2013 | Kim | H01L 23/5256 257/529 |
| 2013/0214428 A1* | 8/2013 | Maki | H01L 23/5226 257/774 |
| 2014/0203441 A1* | 7/2014 | Maki | H01L 21/76832 257/773 |

* cited by examiner

SEMICONDUCTOR DEVICE CONTAINING MEMORY CELLS WITH A FUSE IN STATIC RANDOM MEMORY CELL (SRAM) DEVICE AND METHOD OF MANUFACTURING SAME

CROSS-REFERENCE TO RELATED APPLICATIONS

The disclosure of Japanese Patent Application No. 2015-053255 filed on Mar. 17, 2015 including the specification, drawings, and abstract is incorporated herein by reference in its entirety.

BACKGROUND

The present invention relates to a semiconductor device and a method of manufacturing the same, which are suited for use, for example, in a semiconductor device equipped with a memory cell and a fuse.

SRAM (static random access memory) is one of semiconductor memories. A single SRAM memory cell is comprised of two access transistors, two drive transistors, and two load transistors. As one of SRAM, there is a SRAM having a thin-film transistor as two of these six transistors in order to achieve miniaturization and this SRAM is called "advanced SRAM".

In the advanced SRAM, a lower interlayer insulating film covers access transistors and drive transistors and this lower interlayer insulating film has thereon a bit line and the like. An upper interlayer insulating film covers this bit line and the like. The upper interlayer insulating film has therein load transistors, which are thin-film transistors, and a capacitor. The upper interlayer insulating film has thereon predetermined wirings including a wiring for electrically coupling between memory cells and a wiring for electrically coupling a memory cell and a peripheral circuit. These predetermined wirings are made of, for example, aluminum or the like.

Memory cells of the advanced SRAM and the like are equipped with a fuse for switching a memory cell determined to be defective to a normal memory cell. This fuse is in a fuse portion placed around a memory cell portion. The fuse is formed as one of the predetermined wirings and is electrically coupled to a bit line extending from the memory cell or the like.

This means that in the fuse portion, the fuse and the bit line are electrically coupled to each other via a contact plug penetrating through the upper interlayer insulating film and the lower interlayer insulating film. Switching to a normal memory cell is made by exposing a predetermined fuse to a laser light to completely fusion-cut the fuse. This kind of fuse is especially called "LT (laser trimming) fuse".

In the memory cells of the advanced SRAM or the like, not only switching of a memory cell determined to be defective to a normal cell but also switching of a power source or the like is performed using the fuse. Patent documents that have disclosed a semiconductor device equipped with a fuse are, for example, Patent Document 1 and Patent Document 2.

[Patent Document 1] Japanese Unexamined Patent Application Publication No. 2005-32916

[Patent Document 2] Japanese Unexamined Patent Application Publication No. 2000-294648

SUMMARY

For miniaturization, semiconductor devices equipped with memory cells of advanced SRAM or the like are required to have a fuse with a reduced length and thereby have a fuse portion having a smaller occupation area. In addition, a BPTEOS (boro-phosphor-tetra-ethyl-ortho-silicate) film containing boron (B) and the like should be formed as the lower interlayer insulating film in order to completely fill a narrowing space between bit lines of the memory cells.

As described above, a predetermined fuse is completely fusion-cut by a laser light in order to switch a memory cell determined to be defective to a normal memory cell. From the viewpoint of the phenomenon of it, the fuse evaporates and disappears by being exposed to a laser light. Simultaneously with the evaporation of the fuse, a contact plug that couples the fuse with a bit line sometimes evaporates when the fuse has a relatively short length. When the contact plug evaporates, though depending on how it occurs, the BPTEOS film may be exposed from the side wall of a contact hole having therein the contact plug.

An environmental test called "HAST" (highly accelerated temperature and humidity stress test) is made on a semiconductor device equipped with memory cells in order to evaluate its reliability. In this environmental test, the semiconductor device is exposed to a high-temperature and high-humidity environment. The present inventors have confirmed that in a semiconductor device having a BPTEOS film exposed from the side wall of a contact hole, the BPTEOS film under this environment cracks or peels due to its expansion resulting from a reaction between water and boron in the BPTEOS film.

Another object and novel features will be apparent from the description herein and accompanying drawings.

In one embodiment of the invention, there is provided a semiconductor device equipped with a semiconductor substrate, wirings, a fuse, contact plugs, and interlayer insulating films. The wirings are on the main surface of the semiconductor substrate and include a first wiring extending in one direction. The fuse is placed with a distance from the wirings in a direction separating from the main surface. The contact plugs include a first contact plug that is in contact with each of the first wiring and the fuse and electrically couples the first wiring to the fuse. The interlayer insulating films cover the semiconductor substrate and include a first interlayer insulating film that covers the first wiring while being separated from the first contact plug and contains first boron.

In another embodiment, there is provided a semiconductor device equipped with a semiconductor substrate, wirings, a fuse, contact plugs, and interlayer insulating films. The wirings are on the main surface of the semiconductor substrate and include a first wiring extending in one direction. The fuse is placed with a distance from the wirings in a direction separating from the main surface. The contact plugs include a first contact plug that is in contact with each of the first wiring and the fuse and electrically couples the first wiring to the fuse. The interlayer insulating films cover the semiconductor substrate and include a first interlayer insulating film that covers the first wiring and contains boron. This first interlayer insulating film has a first portion that covers the first wiring with a first film thickness and a second portion that covers the first wiring with a second film thickness smaller than the first film thickness. The first contact plug is in contact with the first wiring while penetrating through the second portion.

In a further embodiment, there is provided a method of manufacturing a semiconductor device including: a step of forming, on the main surface of a semiconductor substrate, wirings including a first wiring extending in one direction;

a step of forming interlayer insulating films including a sub-step of forming a first interlayer insulating film containing first boron so as to cover therewith the semiconductor substrate; a step of forming contact plugs including a first contact plug that penetrates the interlayer insulating films and is in contact with the first wiring; a step of forming a fuse in contact with the first contact plug on the surface of the interlayer insulating film; and a step of removing a portion of the first interlayer insulating film located in a region including a place where the first contact plug is in contact with the first wiring while separating the first interlayer insulating film from the first contact plug.

According to the one embodiment, a semiconductor device having less cracking, peeling, or the like can be provided.

According to the another embodiment, a semiconductor device having less cracking, peeling, or the like can be provided.

According to the further embodiment, a method of manufacturing a semiconductor device capable of manufacturing a semiconductor device having less cracking, peeling, or the like can be provided.

DETAILED DESCRIPTION

Each embodiment describes a semiconductor device equipped with advanced SRAM as one example of a memory cell. First, the circuit of a SRAM memory cell is therefore described.

Figure 1:
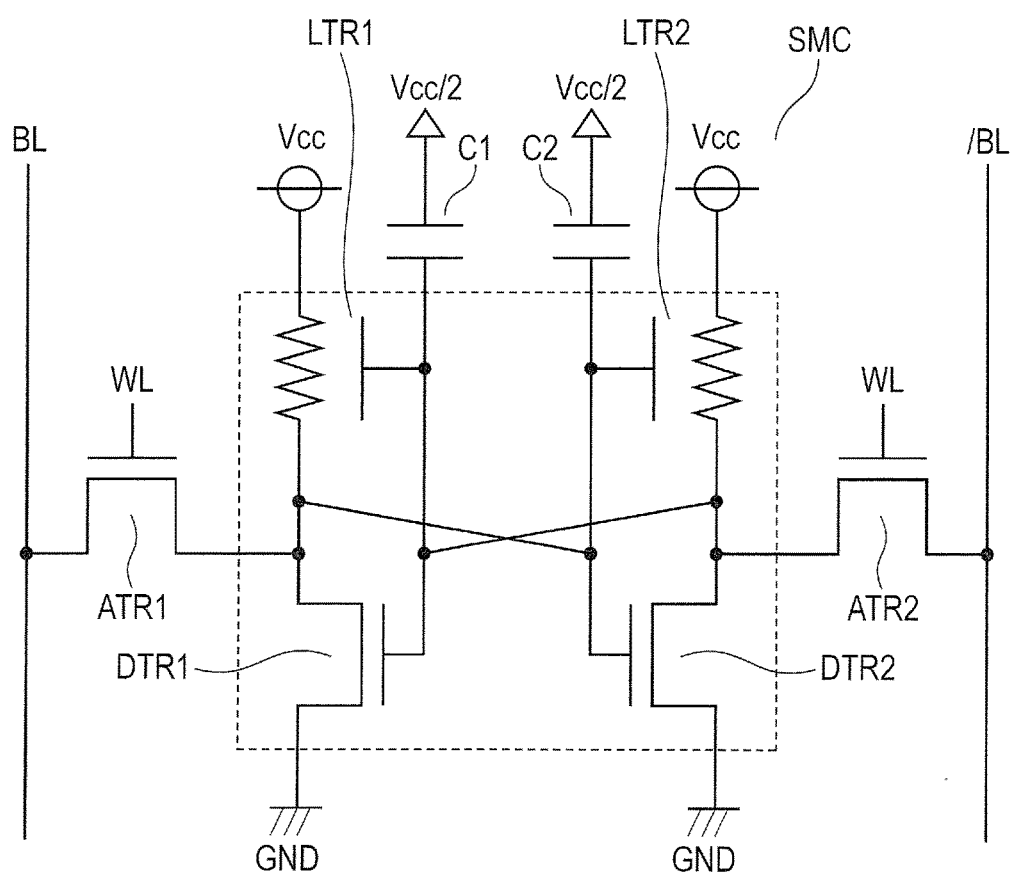
FIG. 1 shows an equivalent circuit of an advanced SRAM memory cell of a semiconductor device of each embodiment.

As shown in FIG. 1, an advanced SRAM memory cell SMC is equipped with bit lines BL and /BL, a word line WL, a pair of access transistors ATR1 and ATR2, a pair of drive transistors DTR1 and DTR2, a pair of load transistors LTR1 and LTR2, and a pair of capacitors C1 and C2. In the advanced SRAM memory cell, a p channel type thin-film transistor (TFT) is used as the load transistors LTR1 and LTR2. As the drive transistors DTR and DTR2 and the access transistors ATR1 and ATR2, an n channel type MOS (metal oxide semiconductor) transistor is used.

The drive transistor DTR1 and the load transistor LTR1 configure one inverter. The drive transistor DTR2 and the load transistor LTR2 configure the other inverter. The one inverter and the other inverter configure a flip flop circuit so that "refresh", that is, processing for restoring a charge as data to its original level at a predetermined cycle becomes unnecessary. In addition, the charge as data is retained by capacitors C1 and C2, by which so-called soft errors can be prevented.

The gate electrode of each of the drive transistor DTR1 and the load transistor LTR1 and one of the electrodes of the capacitor C1 are electrically coupled to the source of the access transistor ATR2. The source of the access transistor ATR2 is electrically coupled to the drain of each of the drive transistor DTR2 and the load transistor LTR2 and a region where they are coupled to each other functions as one memory node.

The gate electrode of each of the drive transistor DTR2 and the load transistor LTR2 and one of the electrodes of the capacitor C2 are electrically coupled to the source of the access transistor ATR1. The source of the access transistor ATR1 is electrically coupled to the drain of each of the drive transistor DTR1 and the load transistor LTR1 and a region where they are coupled to each other functions as the other memory node.

The source of each of the drive transistors DTR1 and DTR2 is electrically coupled to a GND potential. The source of each of the load transistors LTR1 and LTR2 is electrically coupled to a Vcc wiring (power supply wiring) that applies a voltage Vcc. The other electrode of each of the capacitors C1 and C2 is electrically coupled to a Vcc/2 wiring that applies a voltage Vcc/2, that is, a voltage half of the voltage Vcc. The bit line BL of a pair of bit lines BL and /BL is electrically coupled to the drain of the access transistor ATR1, while the bit line /BL is electrically coupled to the drain of the access transistor ATR2.

Figure 2:
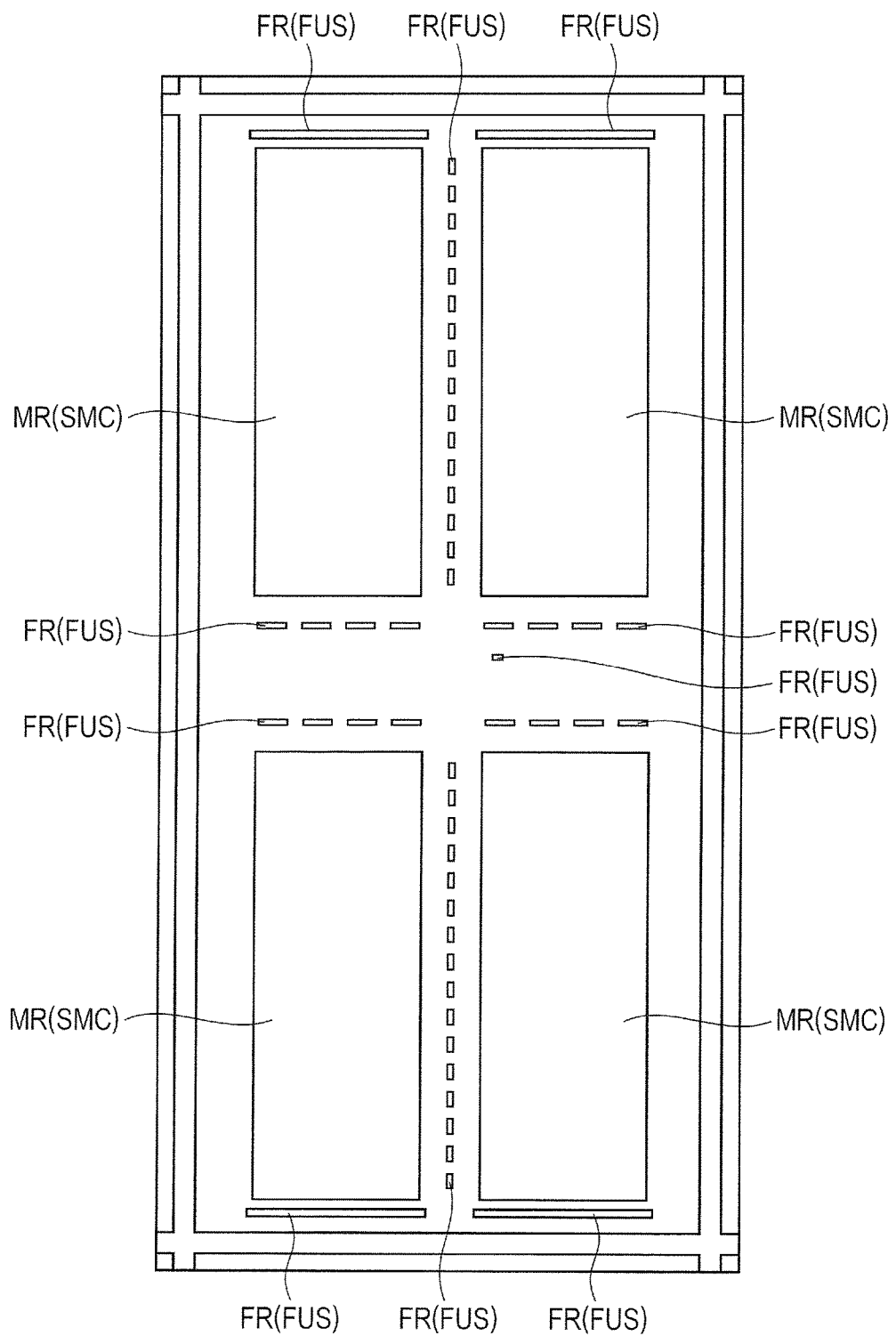
FIG. 2 is a plan view showing one example of an arrangement pattern of a memory cell portion having therein an advanced SRAM memory cell and a fuse portion having therein a fuse in the semiconductor device of each embodiment.

Next, an example of a plane pattern of the semiconductor device equipped with a SRAM memory cell will be described. As shown in FIG. 2, in a single chip of the semiconductor device, four memory cell portions MR having therein SRAM memory cells SMC, respectively, are placed with a distance between any two of them. The memory cell portion MR has, at the periphery thereof, a fuse portion FR. The fuse portion FR has a fuse FUS according to its function such as a fuse (LT fuse) for switching a memory cell determined to be defective to a normal memory cell or a fuse for switching a power source or the like. The term "fuse FUS" as used herein means an LT fuse.

In each embodiment, the structure of the memory cell portion MR and the like, and the fuse portion FR will next be described in detail. With regard to a reference character of the fuse of the fuse portion FR is typified by "BL".

First Embodiment

First Example

Figure 3:
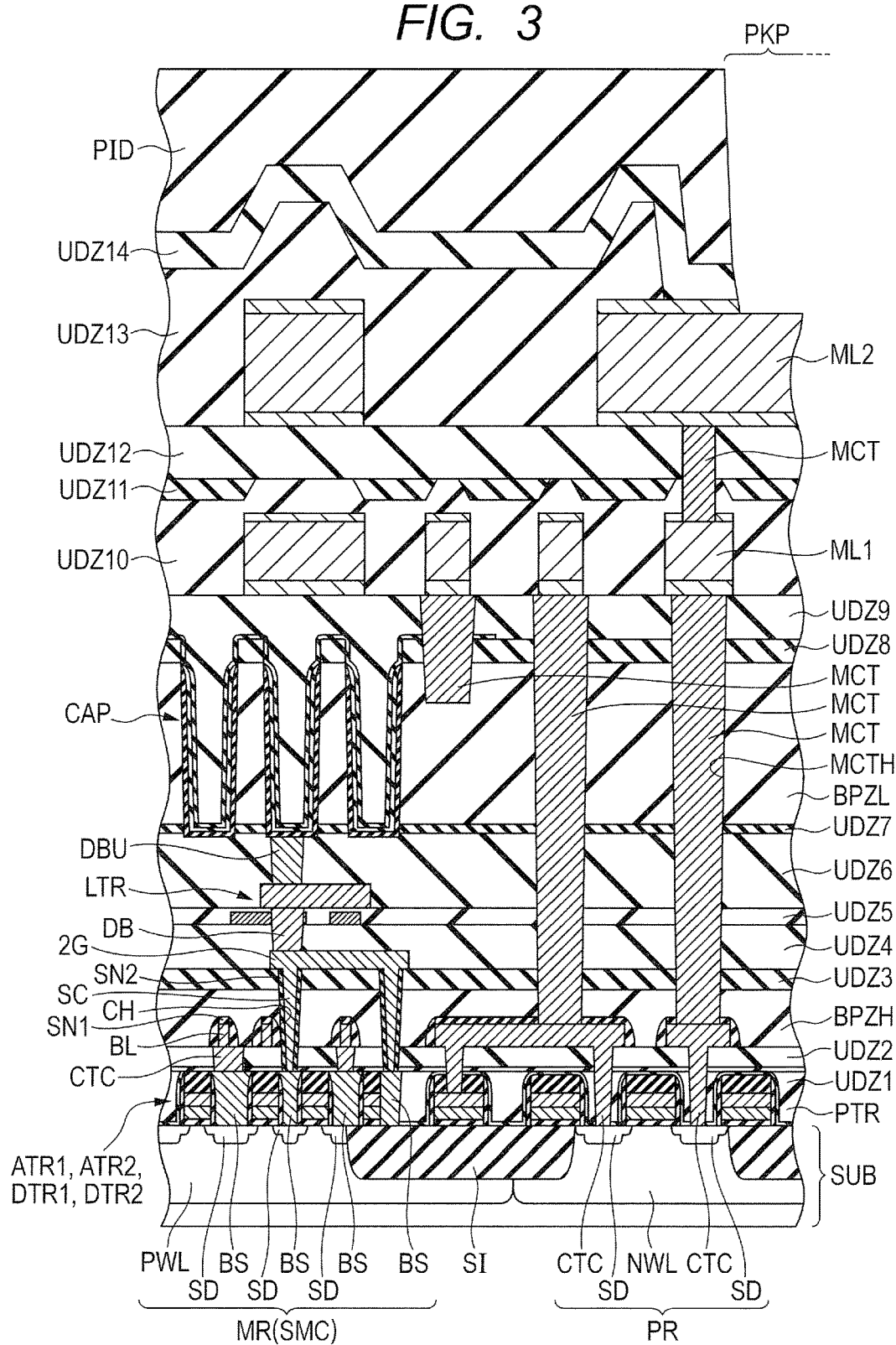
FIG. 3 is a cross-sectional view showing a structure of a memory cell portion and a peripheral circuit portion in a semiconductor device of First Example of First Embodiment.

First, a structure including a memory cell portion MR and a peripheral circuit portion PR is shown in FIG. 3. As shown in FIG. 3, in the main surface of a semiconductor substrate SUB, a memory cell portion MR in which a SRAM memory cell is to be formed and a peripheral circuit portion in which a peripheral circuit is to be formed are defined and electrically isolated from each other by an element isolation insulating film SI. The memory cell portion MR has therein, for example, a p well PWL. The p well PWL has therein drive transistors DTR and DTR2 and access transistors ATR1 and ATR2 of a SRAM memory cell SMC, each including source/drain regions SD. The peripheral circuit portion PR has, on the other hand, for example, an n well NWL. The n well NWL has therein a transistor PTR for peripheral circuit, including source/drain regions SD.

The drive transistor DTR and DTR2 and the access transistors ATR1 and ATR2 of the SRAM memory cell and the transistor PTR for peripheral circuit are covered by an interlayer insulating film UDZ1, an interlayer insulating film UDZ2, and the like. The interlayer insulating films UDZ1, UDZ2, and the like are, for example, an impurity-undoped silicon oxide film. The interlayer insulating film UDZ2 has, on the surface thereof, a bit line BL and the like. The bit line BL and the like are covered with a silicon nitride film SN1. The bit line BL and the like and the access transistor ATR1 or ATR2 are electrically coupled to each other via a polysilicon plug BS and a contact conductive layer CTC.

An interlayer insulating film BPZH and an interlayer insulating film UDZ3 cover the bit line BL and the like. The interlayer insulating film BPZH is a boron-doped BPTEOS film and the interlayer insulating film UDZ3 is an impurity-undoped TEOS film. The interlayer insulating film UDZ3 has, on the surface thereof, a local wiring 2G. The local wiring 2G is electrically coupled to the drive transistors DTR1 and DTR2 and access transistors ATR1 and ATR2 via polysilicon plugs SC and BS. The polysilicon plug SC is in a contact hole CH penetrating through the interlayer insulating film UDZ3, the interlayer insulating film BPZH, and the interlayer insulating film UDZ2, while having a silicon nitride film SN2 therebetween.

An interlayer insulating film UDZ4, an interlayer insulating film UDZ5, and an interlayer insulating film UDZ6 cover the local wiring 2G. The interlayer insulating films UDZ4 to UDZ6 are, for example, impurity-undoped silicon oxide films, respectively. The interlayer insulating films UDZ4 to UDZ6 have therein a thin-film transistor as a load transistor LTR. The load transistor LTR (gate) is electrically coupled to the local wiring 2G via a polysilicon plug DB.

An interlayer insulating film UDZ7, an interlayer insulating film BPZL, an interlayer insulating film UDZ8, and an interlayer insulating film UDZ9 cover the interlayer insulating film UDZ6. The interlayer insulating films UDZ7 to UDZ9 are, for example, impurity-undoped silicon oxide films, respectively. The interlayer insulating film BPZL is, for example, a boron-doped BPTEOS film. The interlayer insulating films UDZ7, BPZL, UDZ8, and UDZ9 have therein, a capacitor CAP. The capacitor CAP is electrically coupled to the load transistor LTR (gate) via the polysilicon plug DBU.

The interlayer insulating film UDZ9 has, on the surface thereof, first wirings ML1, that is, barrier metal-containing aluminum films. Of these first wirings ML1, one of the first wirings ML1 is electrically coupled to the capacitor CAP via one of conductive plugs MCT and another first wiring ML1 is electrically coupled to the transistor PTR of the peripheral circuit portion PR via another conductive plug MCT.

An interlayer insulating film UDZ10, an interlayer insulating film UDZ11, and an interlayer insulating film UDZ12 cover the first wirings ML1. The interlayer insulating film UDZ10 is, for example, an impurity-undoped silicon oxide film formed, for example, by a HDP (high density plasma) process. The interlayer insulating films UDZ11 and UDZ12 are, for example, impurity-undoped silicon oxide films formed, for example, by plasma CVD (chemical vapor deposition), respectively.

The interlayer insulating film UDZ12 has, on the surface thereof, second wirings ML2 each made of a barrier metal-containing aluminum film. Of these second wirings ML2, one of the second wirings ML2 is electrically coupled to a predetermined first wiring ML1 via the conductive plug MCT. An interlayer insulating film UDZ13 and an interlayer insulating film UDZ14 cover the second wiring ML2. The interlayer insulating film UDZ13 is an impurity-undoped silicon oxide film formed, for example, by a HDP process. The interlayer insulating film UDZ14 is, for example, a silicon nitride film formed, for example, by plasma CVD.

A polyimide film PID covers the interlayer insulating film UDZ14. A pad opening portion PKP for exposing therefrom a pad (one of the second wiring ML2) penetrates the polyimide film PID and the interlayer insulating film UDZ14.

Figure 4:
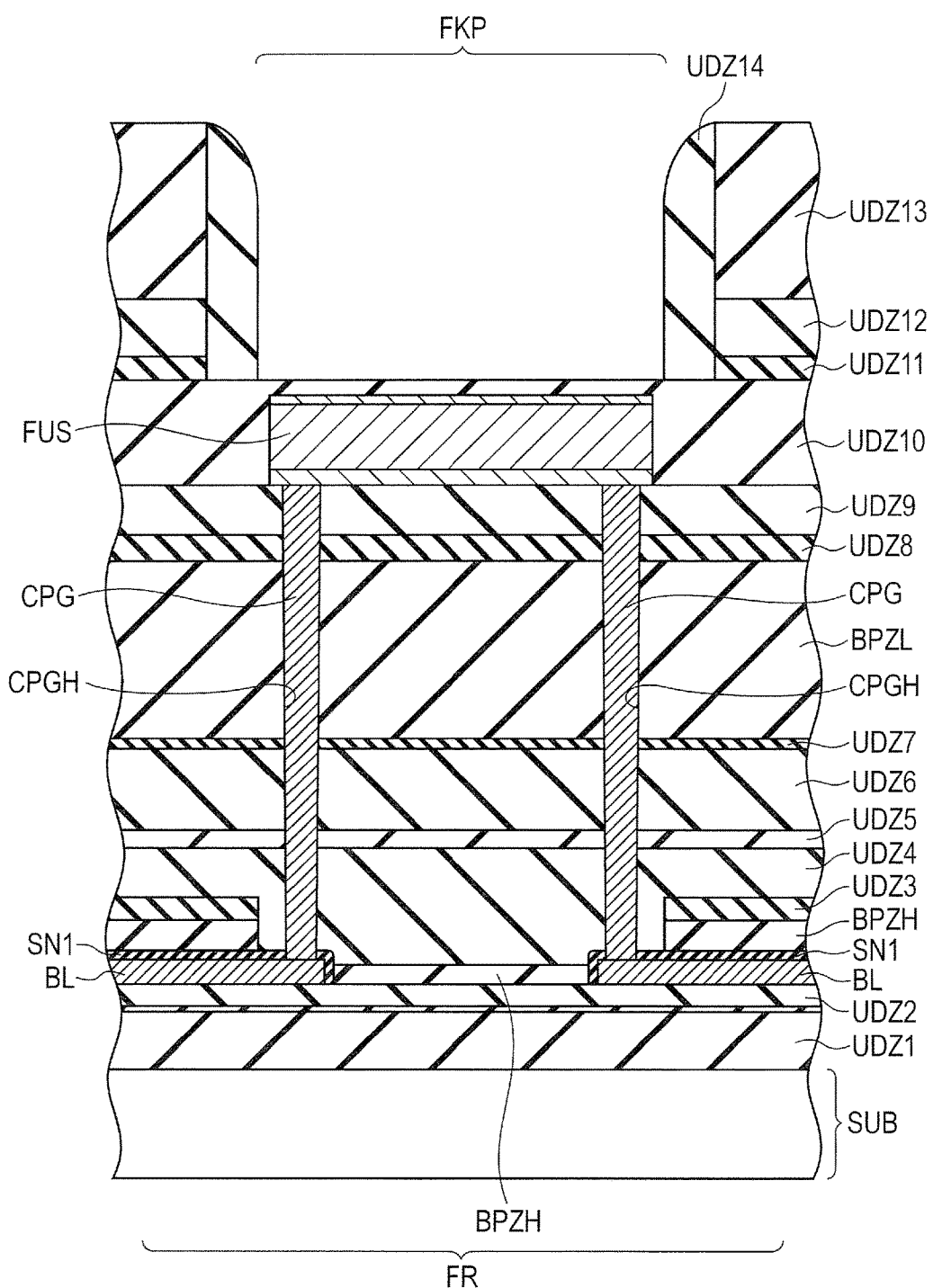
FIG. 4 is a cross-sectional view showing the structure of a fuse portion in the semiconductor device of First Example of First Embodiment.

Next, the structure of the fuse portion FR is shown in FIG. 4. Members similar to those of the memory cell portion MR and the like are denoted by like reference characters and detailed description on them is omitted unless otherwise necessary. As shown in FIG. 4, in the fuse portion FR, the interlayer insulating film UDZ2 has, on the surface thereof, a bit line BL and a bit line BL, each extending in one direction. One of the bit lines BL and the other bit line BL are placed so that an end portion of the one bit line BL and an end portion of the other bit line BL face with each other with a distance therebetween in one direction. In the fuse portion FR, a plurality of such pairs of the bit line BL and the bit line BL each extending in one direction is placed with a distance in a direction substantially perpendicular to the one direction (refer to FIG. 9).

Interlayer insulating films BPZH and UDZ3 cover the bit lines BL. In particular, these interlayer insulating films BPZH and UDZ3 cover the bit lines BL, while being separated from contact plugs CPG which will be described later. A portion of the interlayer insulating film BPZH remains in a region located between the one bit line BL and the other bit line BL. This remaining portion of the interlayer insulating film BPZH is separated from the contact plugs CPG. Interlayer insulating films UDZ4, UDZ5, UDZ6, UDZ7, BPZL, UDZ8, and UDZ9 cover the interlayer insulating films BPZH, UDZ3, and the like.

Two contact plugs CPG penetrate the interlayer insulating films UDZ4, UDZ5, UDZ6, UDZ7, BPZL, UDZ8, and UDZ9 and one is in contact with an end portion of one of the bit lines BL, while the other contact plug CPG is in contact with an end portion of the other bit line BL. The interlayer insulating film UDZ9 has, on the surface thereof, a fuse FUS. The fuse FUS is made of a barrier metal-containing aluminum film as one of the first wirings ML1. The fuse FUS is in contact with, at one end thereof, one of the contact plugs CPG and at the other end, the other contact plug CPG. In such a manner, the fuse FUS is electrically coupled, at one end thereof, to one of the bit lines BL and electrically coupled, at the other end of the fuse FUS, to the other bit line BL.

An interlayer insulating film UDZ10 covers the fuse FUS. Interlayer insulating films UDZ11, UDZ12, and UDZ13 cover the interlayer insulating film UDZ10. A fuse opening portion FKP penetrates the interlayer insulating films UDZ13, UDZ12, and UDZ11 and reaches the interlayer insulating film UDZ10. The fuse opening portion FKP has, on the side wall thereof, an interlayer insulating film UDZ14 as a sidewall insulating film.

Thus, in the fuse portion FR of the semiconductor device of First Example, the boron-doped interlayer insulating film BPZH covers the bit lines BL while being separated from the contact plugs CPG. A portion of the interlayer insulating film BPZH that has been left in a region located between the end portion of one of the bit lines BL and the end portion of the other bit line BL is, on the other hand, separated from each of the contact plugs CPG.

Next, a method of manufacturing the above-described semiconductor device of First Example will be described. In this description, a series of steps for partially removing the interlayer insulating film BPZH located in the fuse portion FR are performed after formation of the local wiring 2G but before formation of the interlayer insulating film UDZ4 that covers the local wiring 2G therewith.

Figure 5:
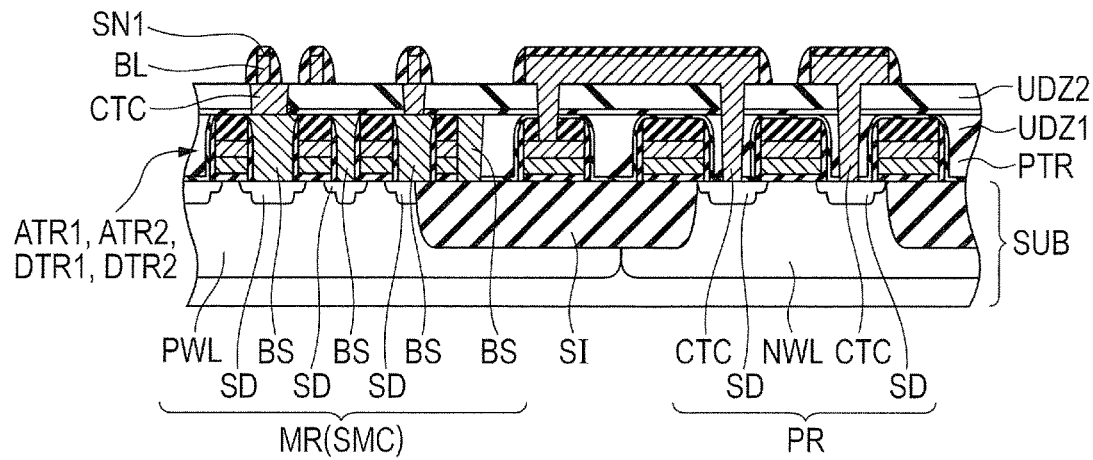
FIG. 5 is a cross-sectional view of the memory cell portion and the peripheral circuit portion showing a step of a method of manufacturing the semiconductor device of First Example of First Embodiment.
Figure 6:
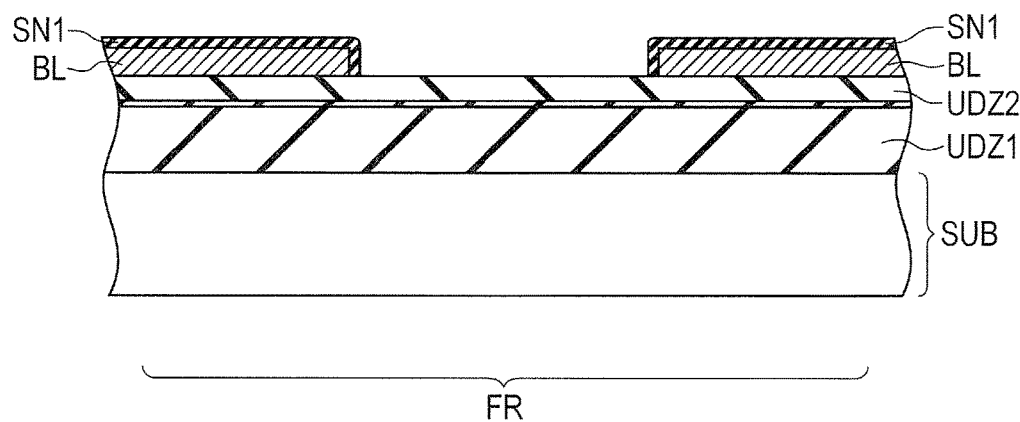
FIG. 6 is a cross-sectional view of the fuse portion in the step shown in FIG. 5 in First Embodiment.

As shown in FIGS. 5 and 6, a memory cell portion MR, a peripheral circuit portion PR, and the like are defined by an element isolation insulating film SI. Next, drive transistors DTR1 and DTR2 and access transistors ATR1 and ATR2, each including source/drain regions SD, are formed in the memory cell portion MR, while a transistor PTR for peripheral circuit is formed in the peripheral circuit portion PR.

Next, an interlayer insulating film UDZ1 is formed so as to cover, in the memory cell portion MR, drive transistors DTR1 and DTR2 and access transistors ATR1 and ATR2; cover, in the peripheral circuit portion PR, the transistor PTR; and cover, in the fuse portion FR, a semiconductor substrate SUB. Next, in the memory cell portion MR, a polysilicon plug BS penetrating through the interlayer insulating film UDZ1 and electrically coupled to the source/drain regions SD is formed.

Next, an interlayer insulating film UDZ2 is formed so as to cover the interlayer insulating film UDZ1 and the like. Next, in the memory cell portion MR, a contact conductive layer CTC penetrating through the interlayer insulating film UDZ2 and electrically coupled to the polysilicon plug BS is formed.

Next, in the memory cell portion MR and the peripheral circuit portion PR, a bit line BL and the like electrically coupled to the access transistors ATR1 and ATR2 are formed on the surface of the interlayer insulating film UDZ2. In the fuse portion FR, two bit lines BL, each to be electrically coupled to the memory cell and the like and extending in one direction, are formed on the surface of the interlayer insulating film UDZ2. One of the bit lines BL and the other bit line BL are formed so that an end portion of one of the bit lines BL and an end portion of the other bit line BL face to each other with a distance therebetween in one direction.

Figure 7:
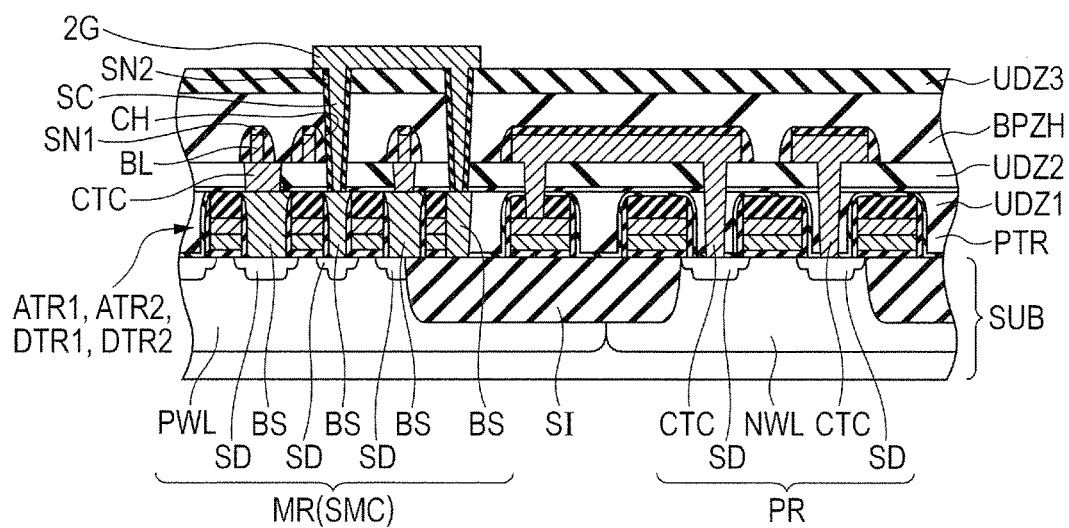
FIG. 7 is a cross-sectional view of the memory cell portion and the peripheral circuit portion showing a step performed after the step shown in FIGS. 5 and 6 in First Embodiment.
Figure 8:
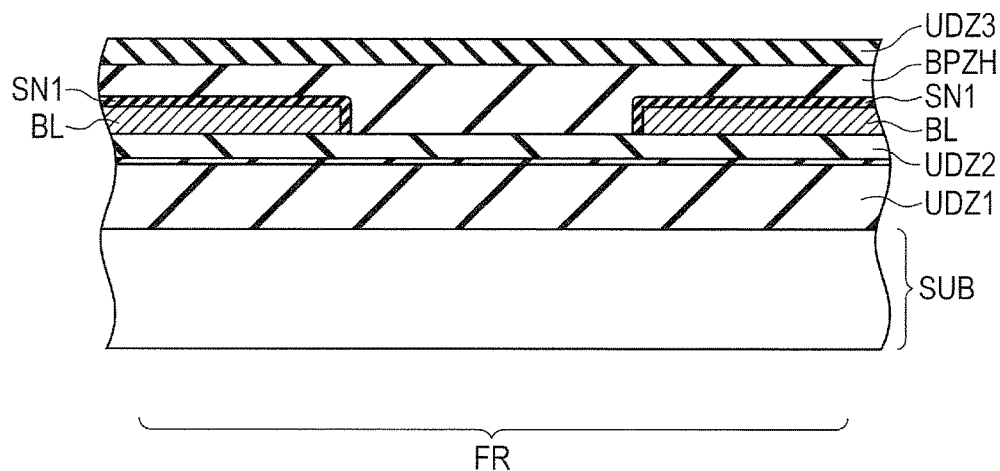
FIG. 8 is a cross-sectional view of the fuse portion in the step shown in FIG. 7 in First Embodiment.

Next, as shown in FIGS. 7 and 8, in the memory cell portion MR, the peripheral circuit portion PR, and the fuse portion FR, an interlayer insulating film BPZH and an interlayer insulating film UDZ3 are formed successively so as to cover the bit line BL and the like therewith. As the interlayer insulating film BPZH, a boron-doped BPTEOS film is formed. A boron concentration (about 3.2 wt %) of the interlayer insulating film BPZH is set higher than a boron concentration (about 2.3 wt %) of an interlayer insulating film BPZL which will be described later. As the interlayer insulating film UDZ3, an impurity-undoped TEOS film is formed.

Next, in the memory cell portion MR, a contact hole CH penetrating through the interlayer insulating films UDZ3, BPZH, and UDZ2, and the like and exposing the polysilicon plug BS is formed. Next, after formation of a silicon nitride film SN2 on the side wall of the contact hole CH, a polysilicon film (not shown) is formed so as to fill the contact hole CH therewith. Next, by predetermined photolithography and etching of the polysilicon film, a polysilicon plug SC and a local wiring 2G are formed.

Figure 9:
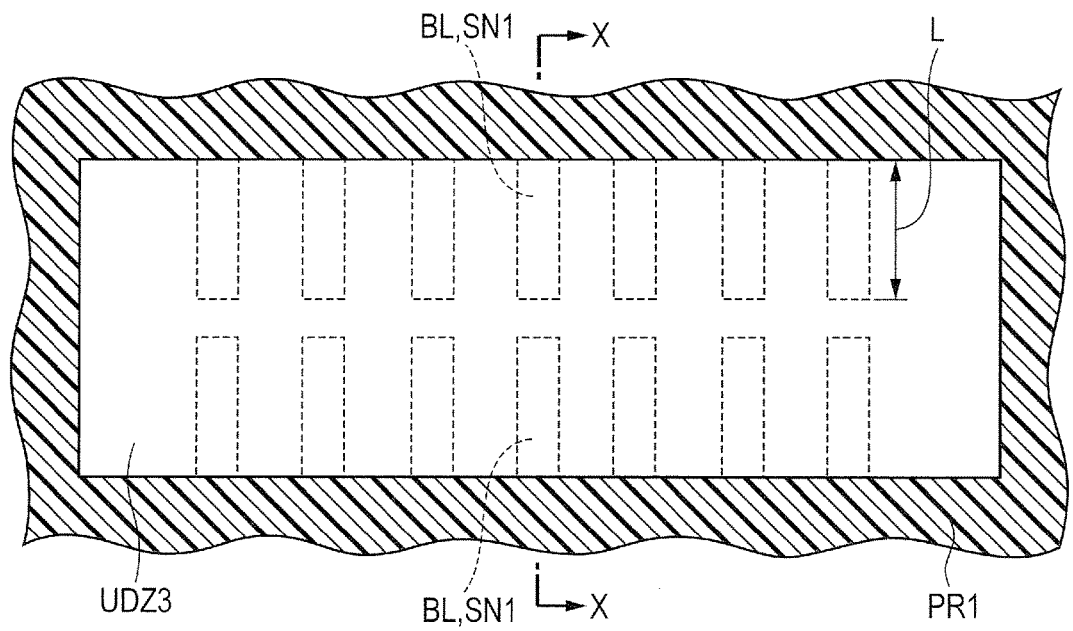
FIG. 9 is a plan view of the fuse portion showing a step performed after the step shown in FIGS. 7 and 8 in First Embodiment.
Figure 10:
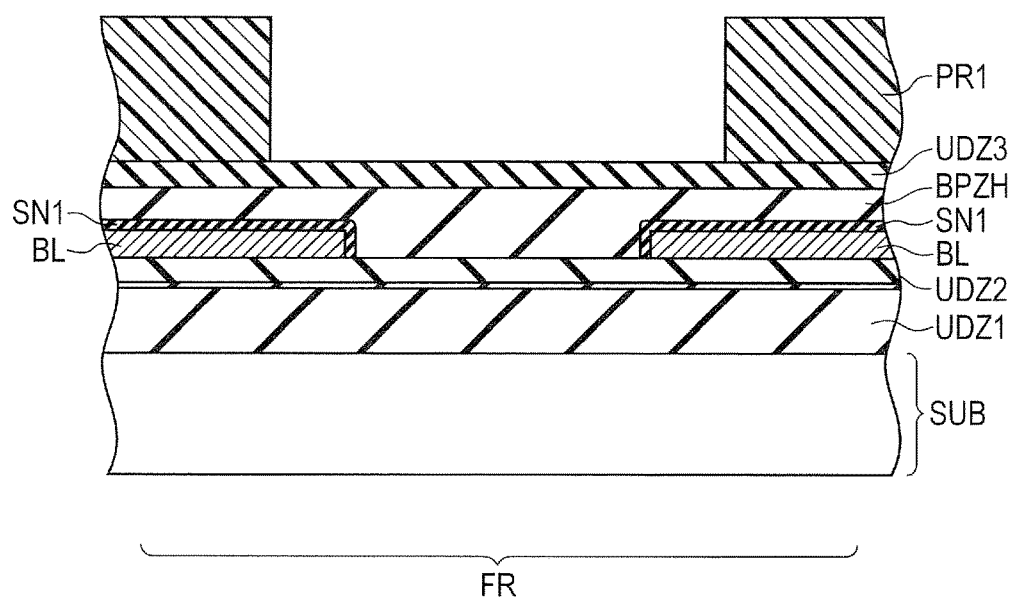
FIG. 10 is a cross-sectional view of the fuse portion taken along a cross-sectional line X-X in FIG. 9 in First Embodiment.

Next, as shown in FIGS. 9 and 10, by predetermined photolithography, a photoresist pattern PR1 that exposes a portion of the interlayer insulating film UDZ3 located in the fuse portion FR and covers the memory cell portion and the like (not shown) is formed. In particular, the photoresist pattern PR1 is formed so as not to cover a region including a place where the contact plug CPG (refer to FIG. 18) is in contact with the bit line BL. More specifically, the photoresist pattern PR1 is formed so as not to cover a portion of the bit line BL located within a predetermined distance L (extending direction) from the end portion of the bit line BL.

Figure 11:
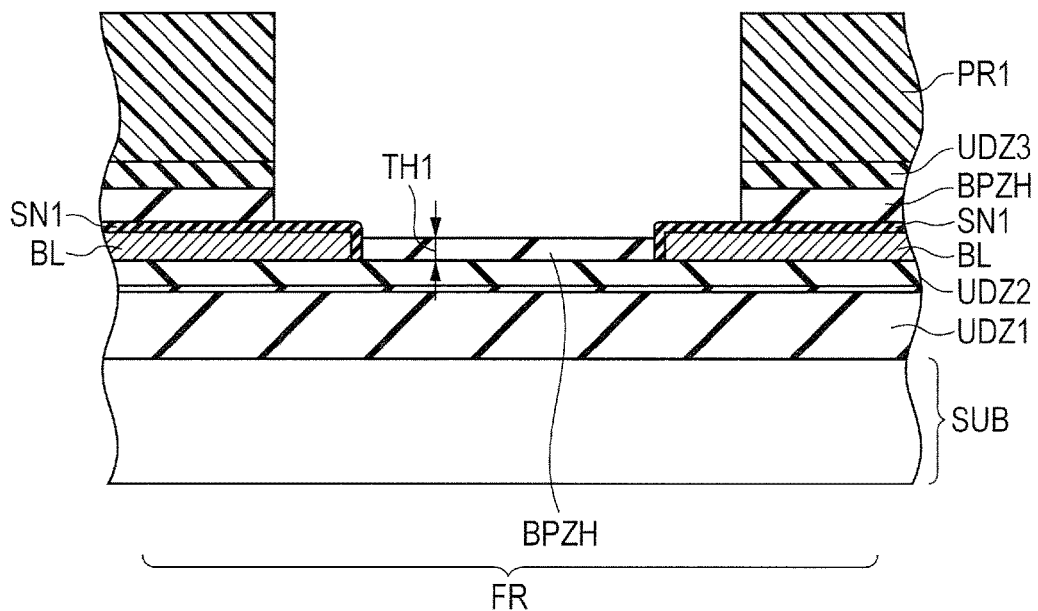
FIG. 11 is a cross-sectional view of the fuse portion showing a step performed after the step shown in FIGS. 9 and 10 in First Embodiment.

Next, as shown in FIG. 11, with the photoresist pattern PR1 as an etching mask, etching is performed to remove a portion of the interlayer insulating film UDZ3 and a portion of the interlayer insulating film BPZH while leaving a portion of the interlayer insulating film BPZH having a thickness of TH1 between an end portion of one of the bit lines BL and an end portion of the other bit line BL.

Figure 12:
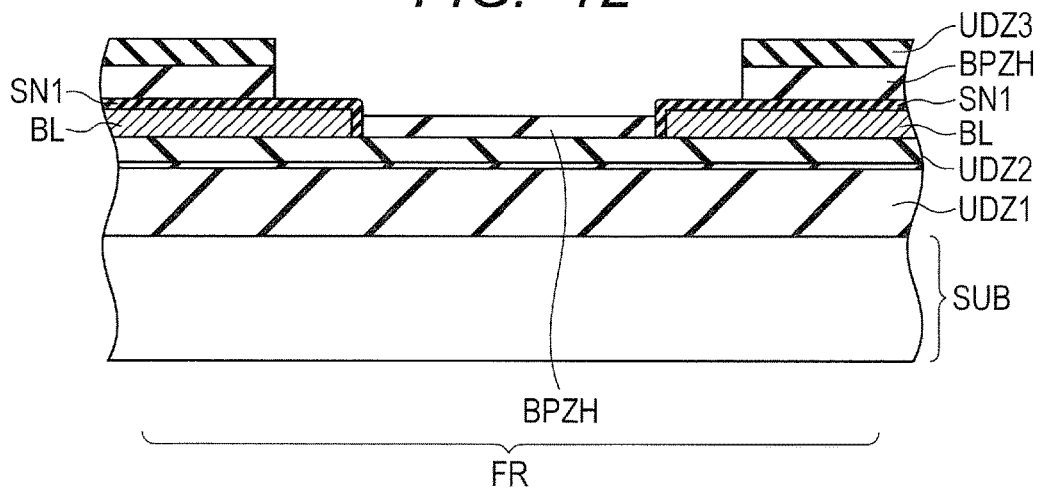
FIG. 12 is a cross-sectional view of the fuse portion showing a step performed after the step shown in FIG. 11 in First Embodiment.

This etching exposes the silicon nitride film SN1 that covers a portion of the bit lines BL not covered with the photoresist pattern PR1. The portion of the interlayer insulating film BPZH that covers the bit lines BL is then separated from the contact plugs CPG (refer to FIG. 18). The upper surface level of the interlayer insulating film BPZH that has been left becomes lower than that of the silicon nitride film SN1 (or the bit line BL) and a portion of the interlayer insulating film BPZH that has been left between the bit lines BL is separated from the contact plugs CPG (refer to FIG. 18). As shown in FIG. 12, the photoresist pattern PR1 is thereafter removed.

Figure 13:
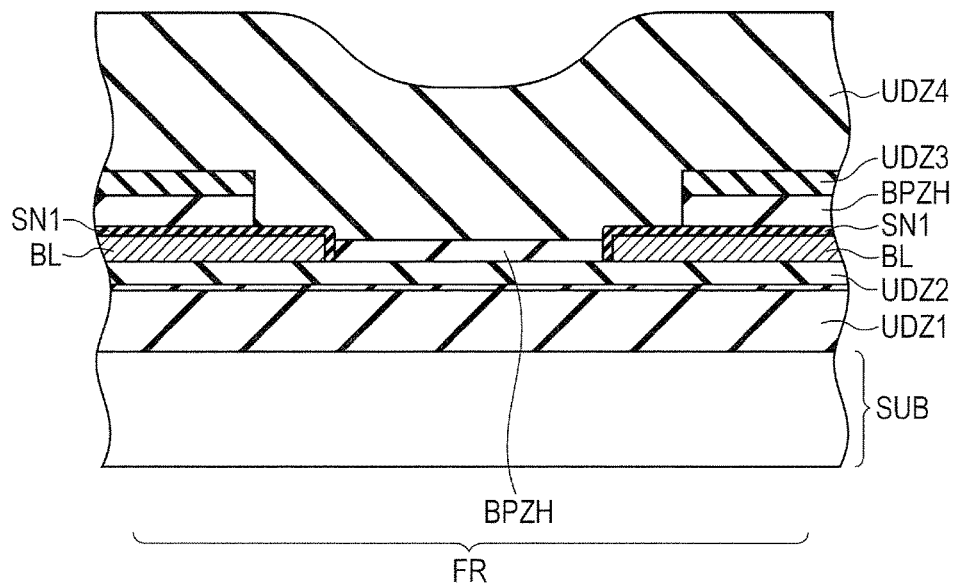
FIG. 13 is a cross-sectional view of the fuse portion showing a step performed after the step shown in FIG. 12 in First Embodiment.
Figure 14:
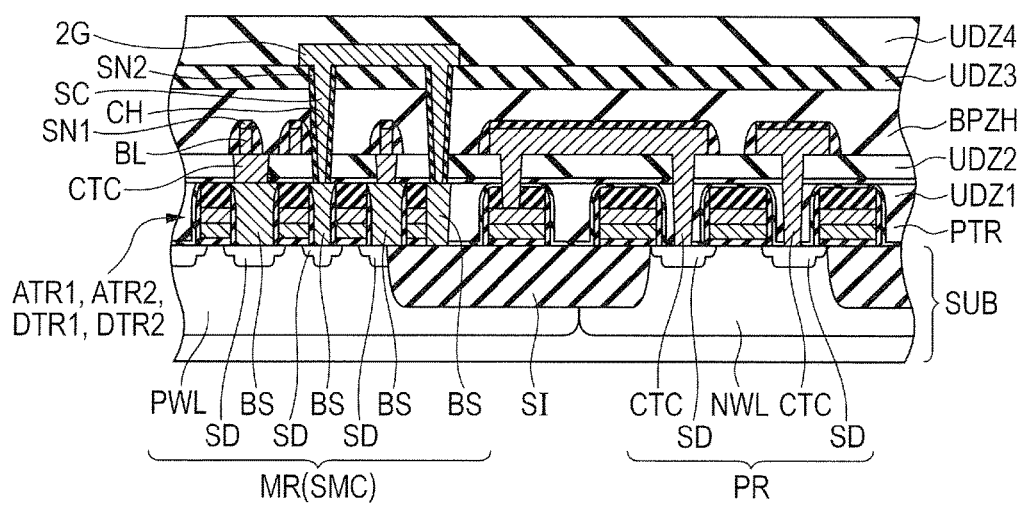
FIG. 14 is a cross-sectional view of the memory cell portion and the peripheral circuit portion showing a step performed after the step shown in FIG. 13 in First Embodiment.
Figure 15:
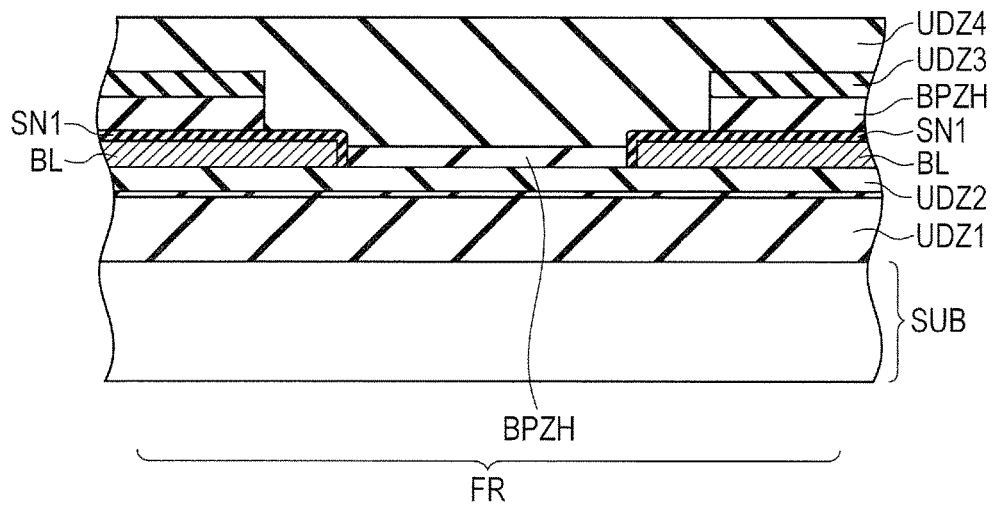
FIG. 15 is a cross-sectional view of the fuse portion in the step shown in FIG. 14 in First Embodiment.

Next, as shown in FIG. 13, an interlayer insulating film UDZ4 is formed so as to cover not only the fuse portion FR but also the memory cell portion and the like (not shown). The interlayer insulating film UDZ4 is then subjected to chemical mechanical polishing to planarize the interlayer insulating film UDZ4 as shown in FIGS. 14 and 15.

Next, an interlayer insulating film UDZ5 and an interlayer insulating film UDZ6 are formed successively so as to cover the interlayer insulating film UDZ4. During this time, in the memory cell portion MR, a thin-film transistor is formed as a load transistor LTR (refer to FIG. 16). Next, an interlayer insulating film UDZ7, an interlayer insulating film BPZL, an interlayer insulating film UDZ8, and an interlayer insulating film UDZ9 are formed successively so as to cover the interlayer insulating film UDZ6 therewith. In particular, as the interlayer insulating film BPZL, a boron-doped BPTEOS film is formed. A boron concentration (about 2.3 wt %) of the interlayer insulating film BPZL is set lower than a boron concentration (about 3.2 wt %) of the interlayer insulating film BPZH. During formation of the interlayer insulating films UDZ7, BPZL, UDZ8, and UDZ9, a capacitor CA is formed in the memory cell portion MR (refer to FIG. 16).

Next, the interlayer insulating films UDZ9, UDZ8, BPZL, UDZ7, UDZ6, UDZ5, and UDZ4 are subjected to predetermined etching. In the memory cell portion MR, a contact hole MCTH exposing therefrom a wiring formed on the surface of the interlayer insulating film UDZ2 is formed (refer to FIG. 16). In the fuse portion FR, a contact hole CPGH exposing therefrom the bit line BL is formed (refer to FIG. 18).

Figure 16:
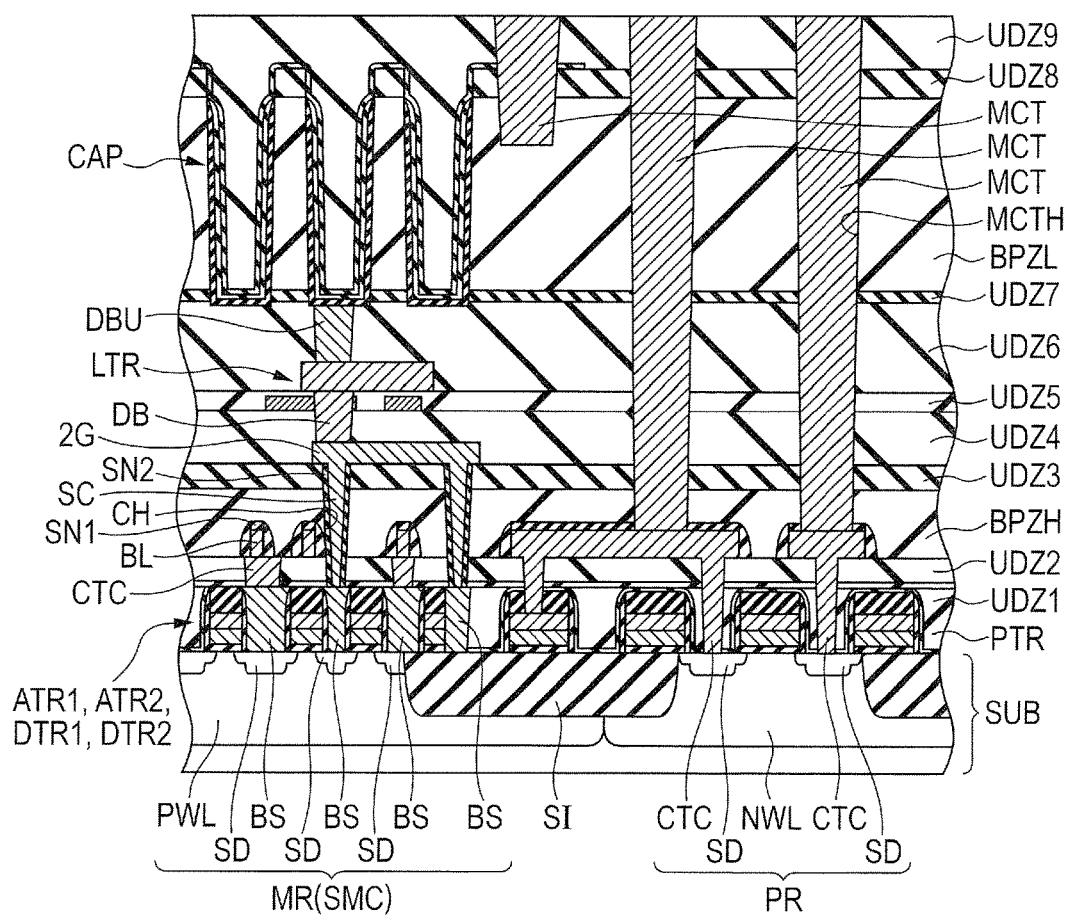
FIG. 16 is a cross-sectional view of the memory cell portion and the peripheral circuit portion showing a step performed after the step shown in FIGS. 14 and 15 in First Embodiment.
Figure 17:
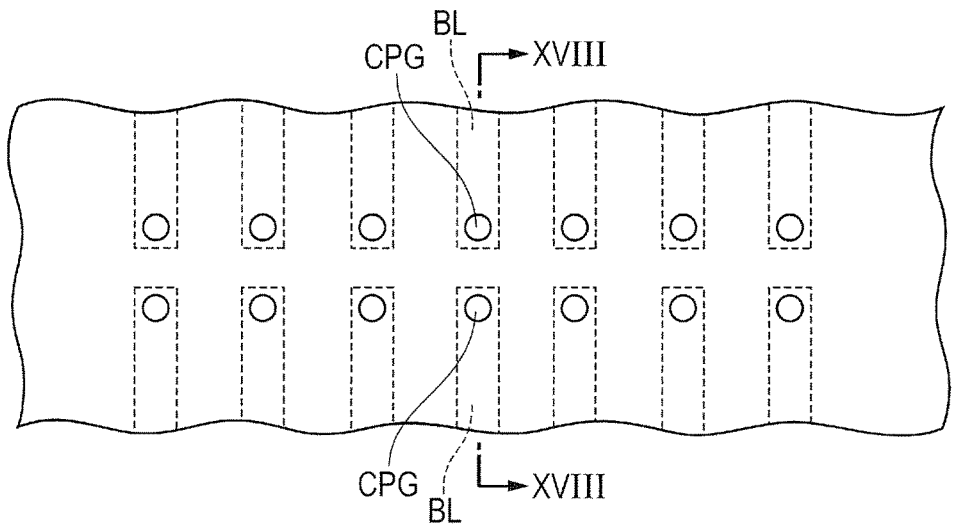
FIG. 17 is a plan view of the fuse portion in the step shown in FIG. 16 in First Embodiment.
Figure 18:
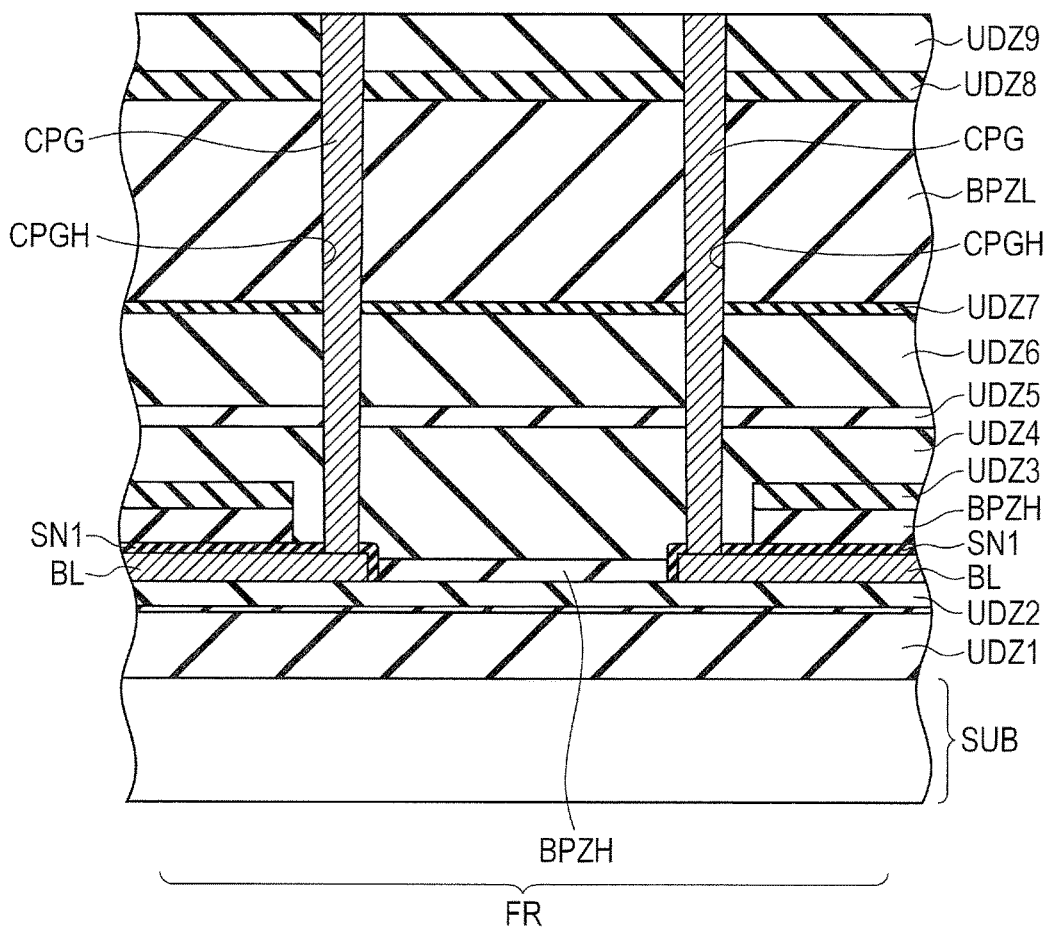
FIG. 18 is a cross-sectional view of the fuse portion taken along the cross-sectional line XVIII-XVIII shown in FIG. 17 in First Embodiment.

Next, as shown in FIGS. 16, 17, and 18, in the memory cell portion MR, a conductive plug MCT is formed in the contact hole MCTH and in the fuse portion FR, a contact plug CPG in contact with the bit line BL is formed. At this time, the interlayer insulating film BPZH is formed so as not to cover a region including the portion where the contact plug CPG is in contact with the bit line BL so that the contact plug CPG and the interlayer insulating film BPZH are separated from each other. The interlayer insulating film UDZ4 not doped with an impurity such as boron is therefore positioned between the boron-doped interlayer insulating film BPZH and the contact plug CPG.

Figure 19:
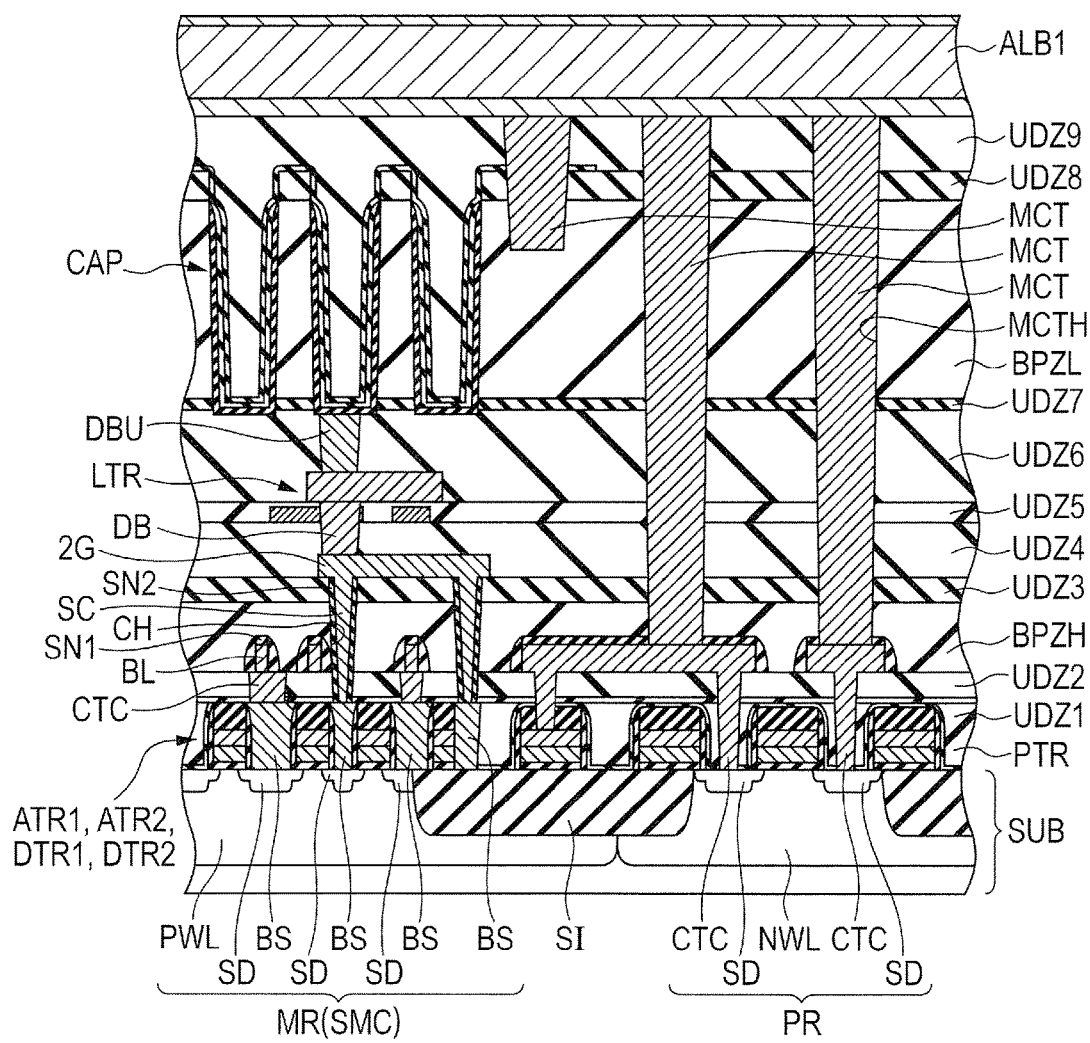
FIG. 19 is a cross-sectional view of the memory cell portion and the peripheral circuit portion showing a step performed after the step shown in FIGS. 16 to 18 in First Embodiment.
Figure 20:
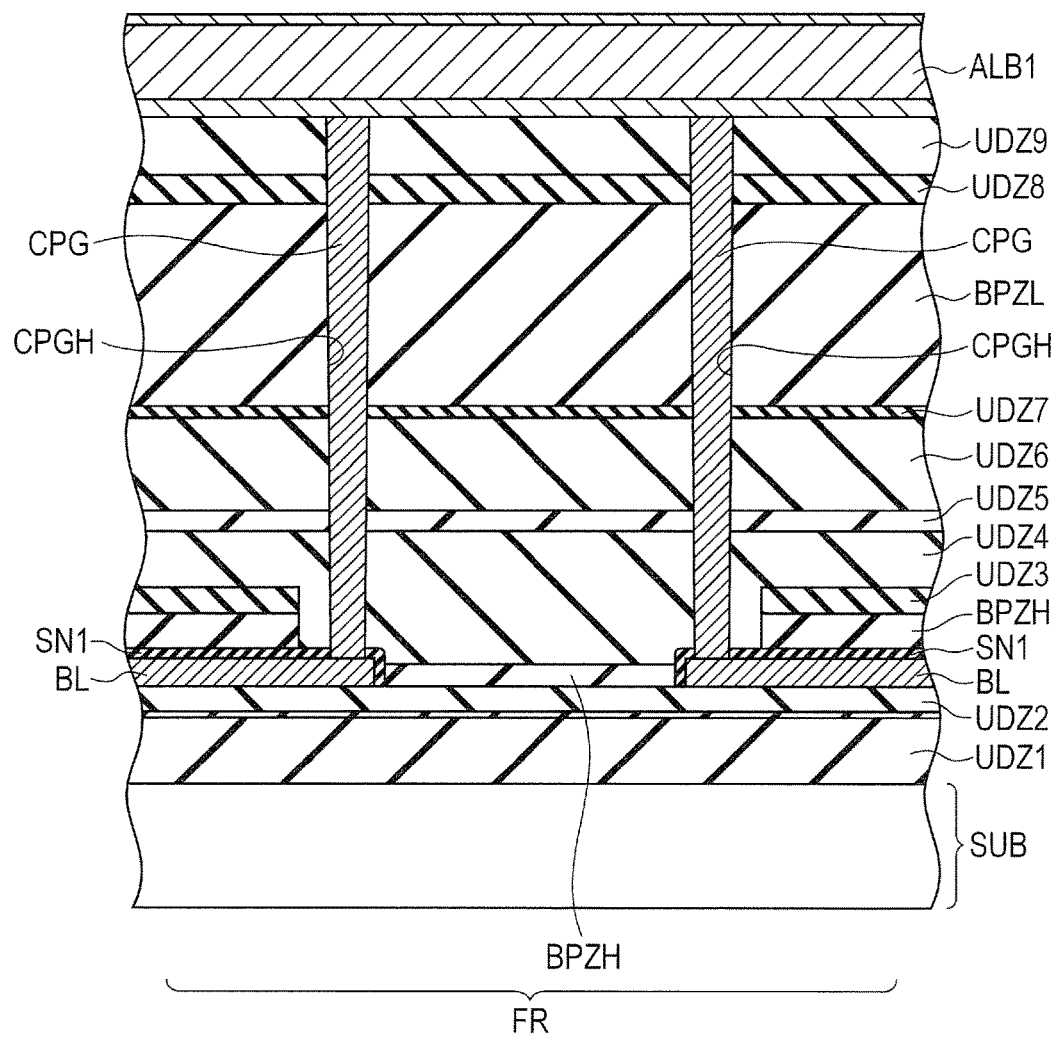
FIG. 20 is a cross-sectional view of the fuse portion in the step shown in FIG. 19 in First Embodiment.
Figure 21:
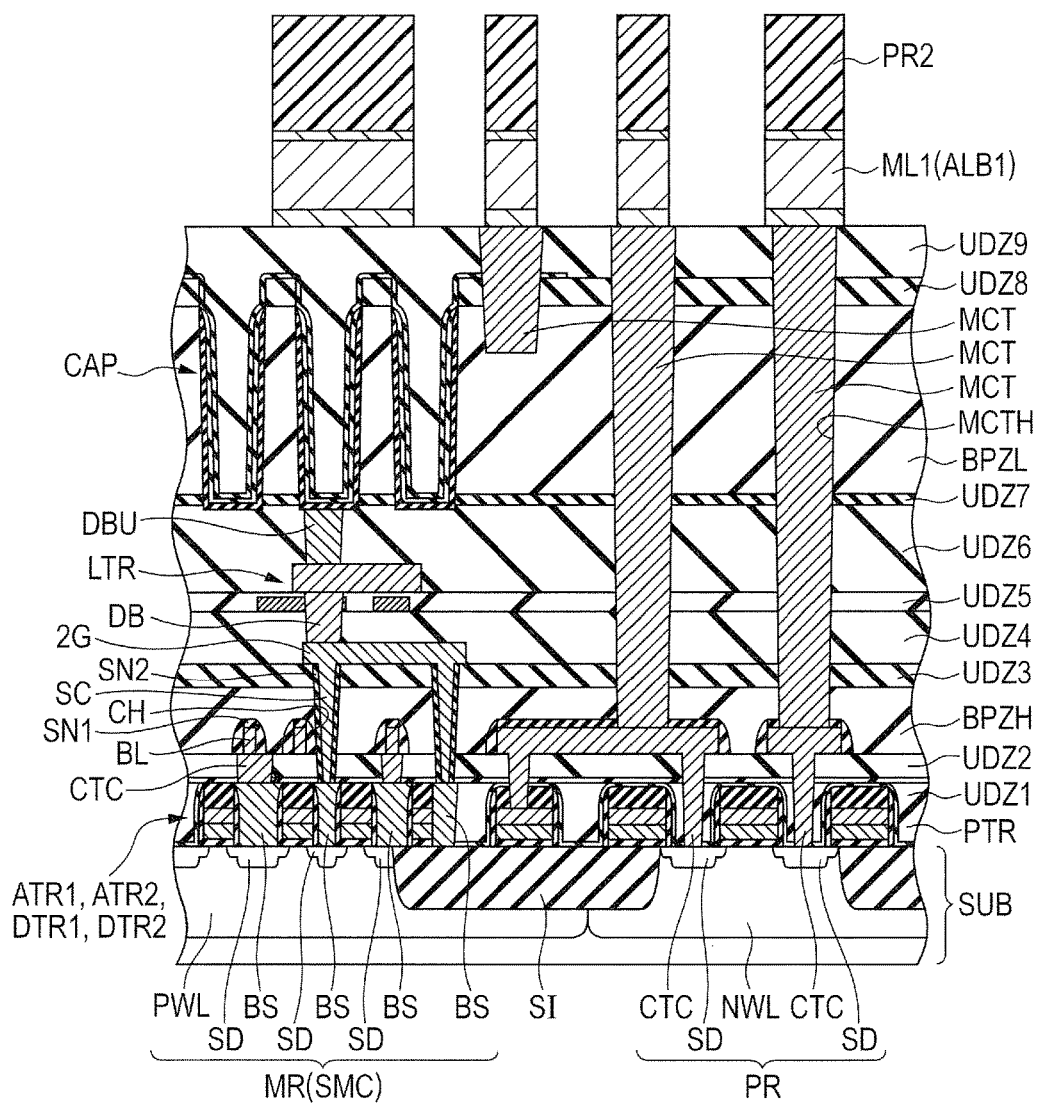
FIG. 21 is a cross-sectional view of the memory cell portion and the peripheral circuit portion showing a step performed after the step shown in FIGS. 19 and 20 in First Embodiment.
Figure 22:
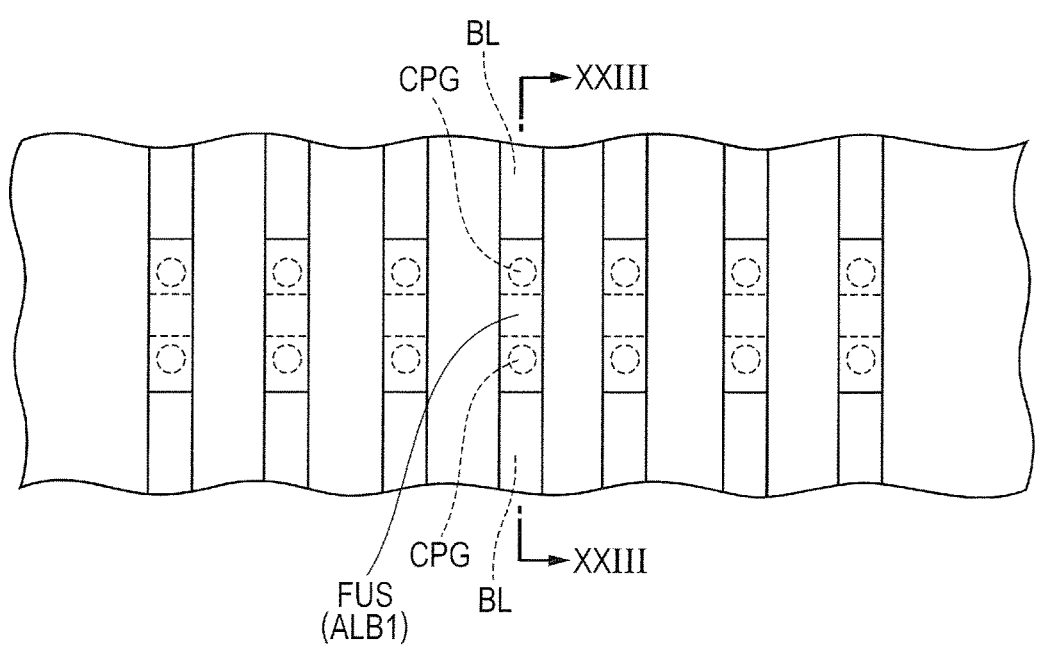
FIG. 22 is a plan view of the fuse portion in the step shown in FIG. 21 in First Embodiment.
Figure 23:
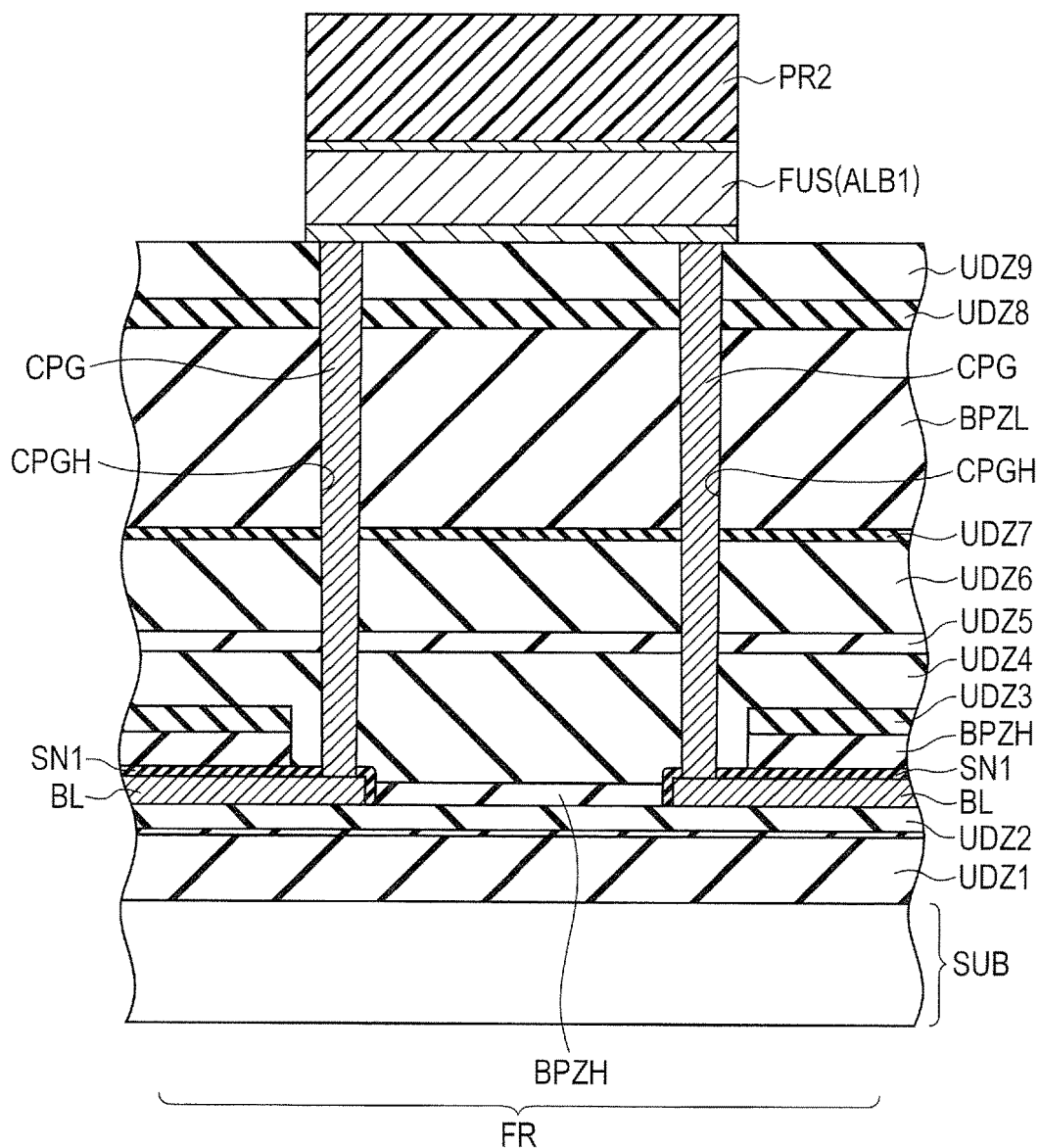
FIG. 23 is a cross-sectional view of the fuse portion taken along the cross-sectional line XIII-XIII shown in FIG. 22 in First Embodiment.

Next, as shown in FIGS. 19 and 20, a barrier metal-containing aluminum film ALB1 is formed, for example, by sputtering so as to cover the interlayer insulating film UDZ9. Next, as shown in FIGS. 21, 22, and 23, predetermined photolithography is performed to form a photoresist pattern PR2. With the photoresist pattern PR2 as an etching mask, the aluminum film ALB1 is etched to form first wirings ML1 in the memory cell portion and the peripheral circuit portion PR. In the fuse portion FR, a fuse FUS is formed. The fuse FUS is, on one end side thereof, in contact with one of the contact plugs CGP and, on the other side of the fuse FUS, in contact with the other contact plug CPG. The photoresist pattern PR2 is then removed.

Figure 24:
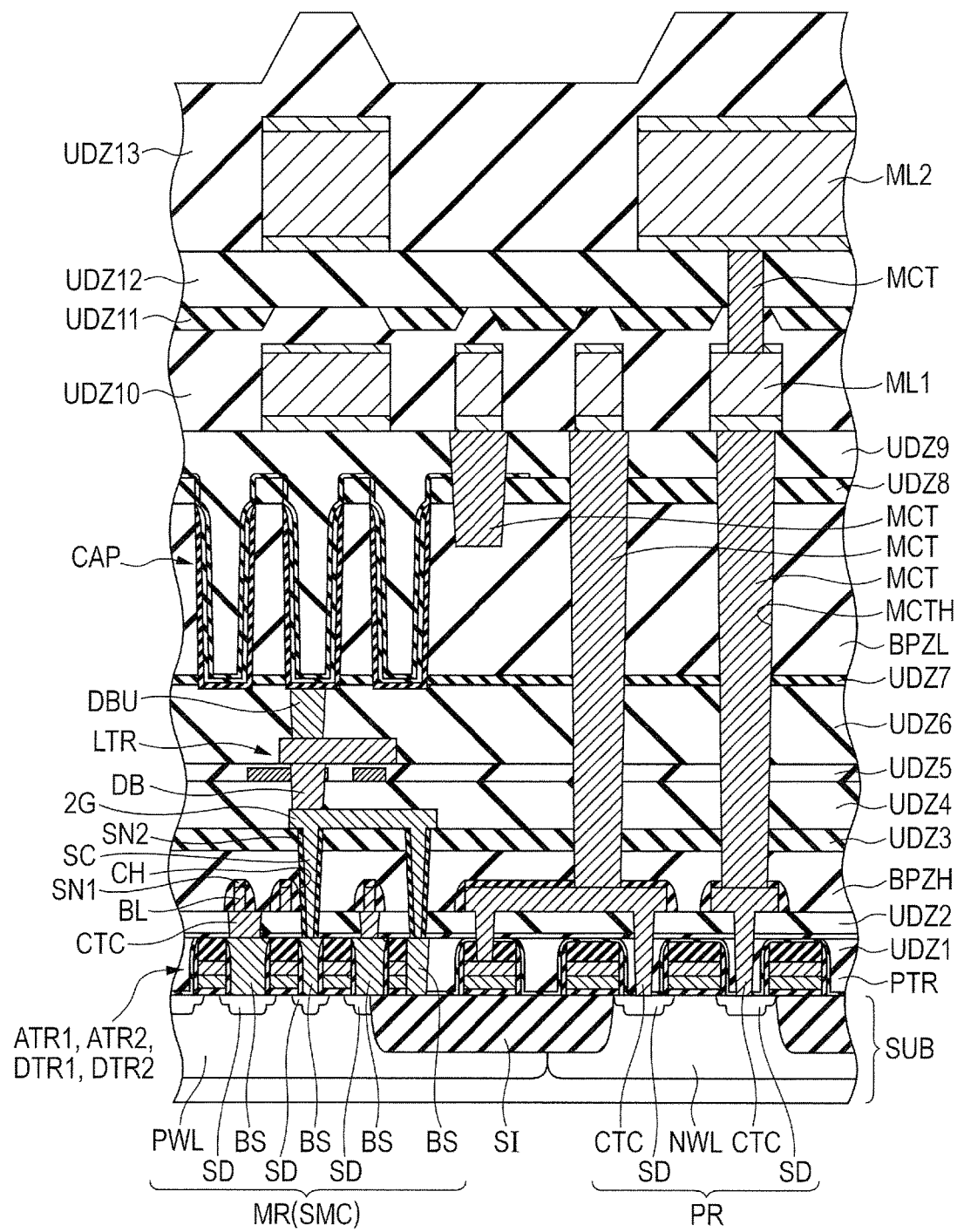
FIG. 24 is a cross-sectional view of the memory cell portion and the peripheral circuit portion showing a step performed after the step shown in FIGS. 21 to 23 in First Embodiment.
Figure 25:
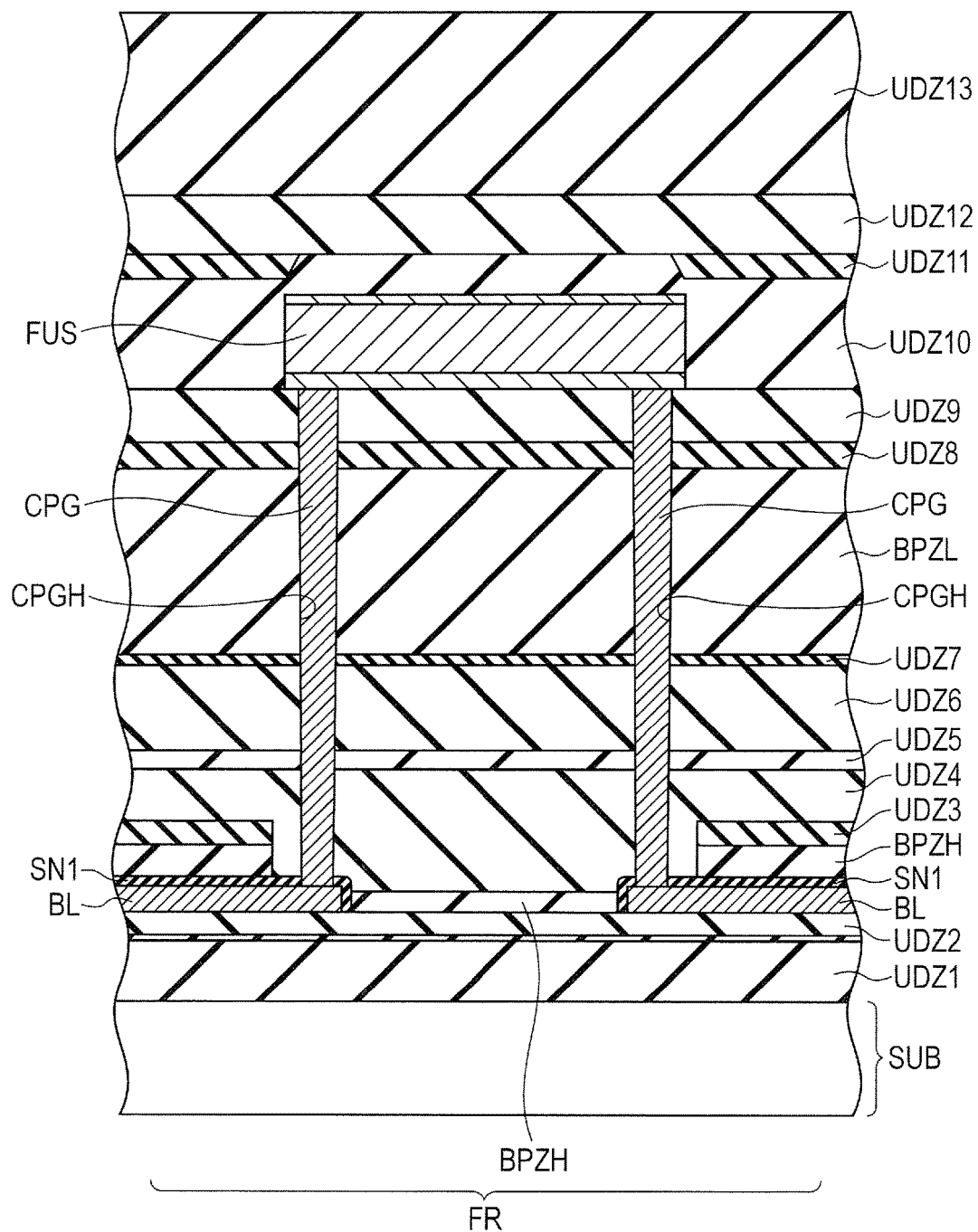
FIG. 25 is a cross-sectional view of the fuse portion in the step shown in FIG. 24 in First Embodiment.

Next, as shown in FIGS. 24 and 25, an interlayer insulating film UD10 is formed by the HDP process so as to cover the first wirings ML1 and the fuse FUS. Next, an interlayer insulating film UDZ11 is formed by plasma CVD so as to cover the interlayer insulating film UDZ10. Next, the interlayer insulating film UDZ11 is planarized by chemical mechanical polishing of the interlayer insulating film UDZ11. Next, an interlayer insulating film UDZ12 is formed by plasma CVD so as to cover the interlayer insulating film UDZ11 and the like.

Next, a barrier metal-containing aluminum film (not shown) is formed by sputtering. Second wirings ML are formed in the memory cell portion MR and the peripheral circuit portion PR by subjecting the resulting aluminum film to predetermined photolithography and etching. The second wirings ML include a pad (electrode). An interlayer insulating film UDZ13 is then formed by the HDP process so as to cover the second wirings ML and the like.

Figure 26:
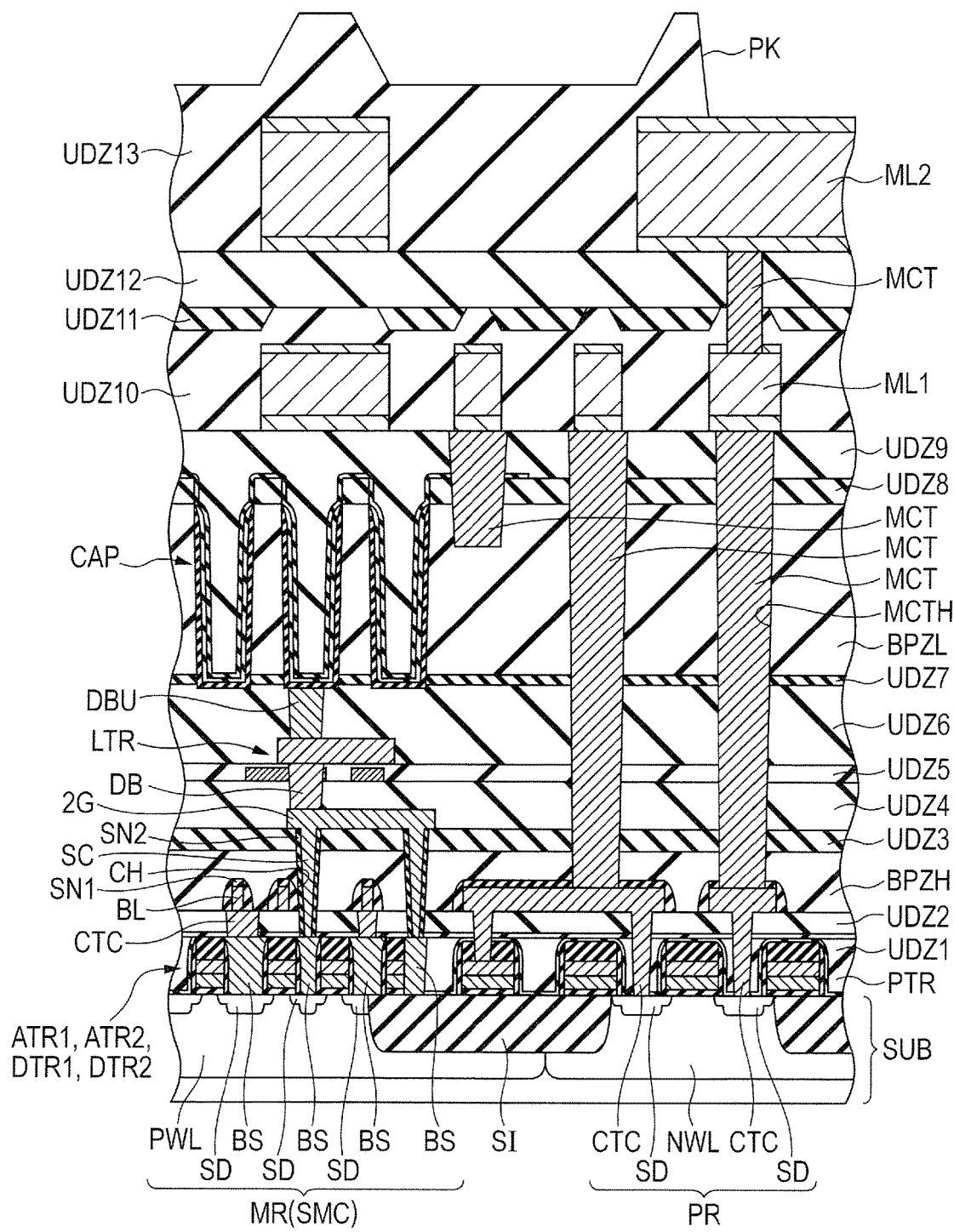
FIG. 26 is a cross-sectional view of the memory cell portion and the peripheral circuit portion showing a step performed after the step shown in FIGS. 24 and 25 in First Embodiment.
Figure 27:
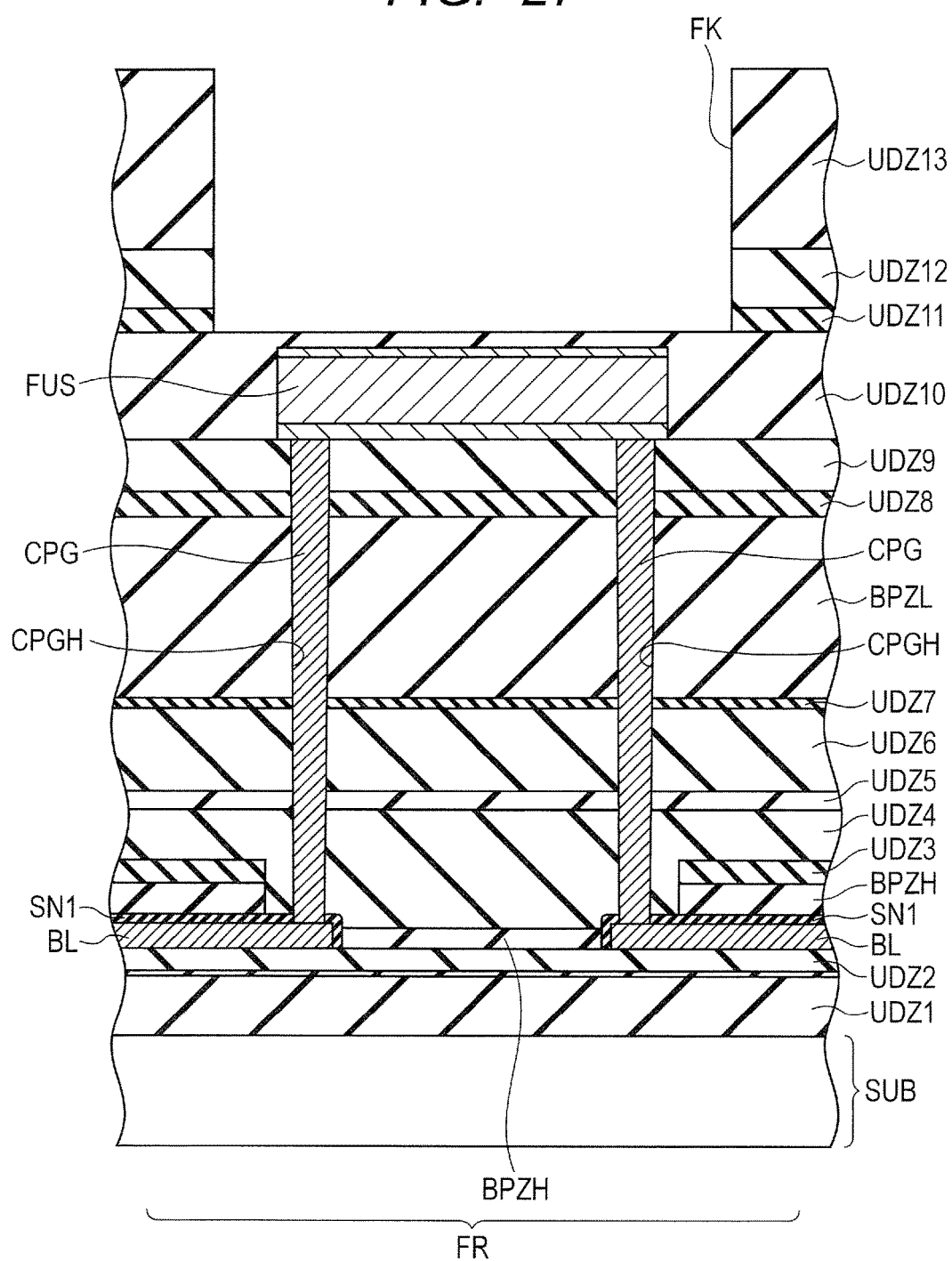
FIG. 27 is a cross-sectional view of the fuse portion in the step shown in FIG. 26 in First Embodiment.

Next, as shown in FIGS. 26 and 27, an opening portion PK for exposing the pad formed as one of the second wirings ML2 is formed in the peripheral circuit portion PR by subjecting the interlayer insulating film UDZ13 to predetermined photolithography and etching. In the fuse portion FR, an opening portion FK is formed while leaving the interlayer insulating film UDZ10 and the like having a predetermined thickness right above the fuse FUS.

Figure 28:
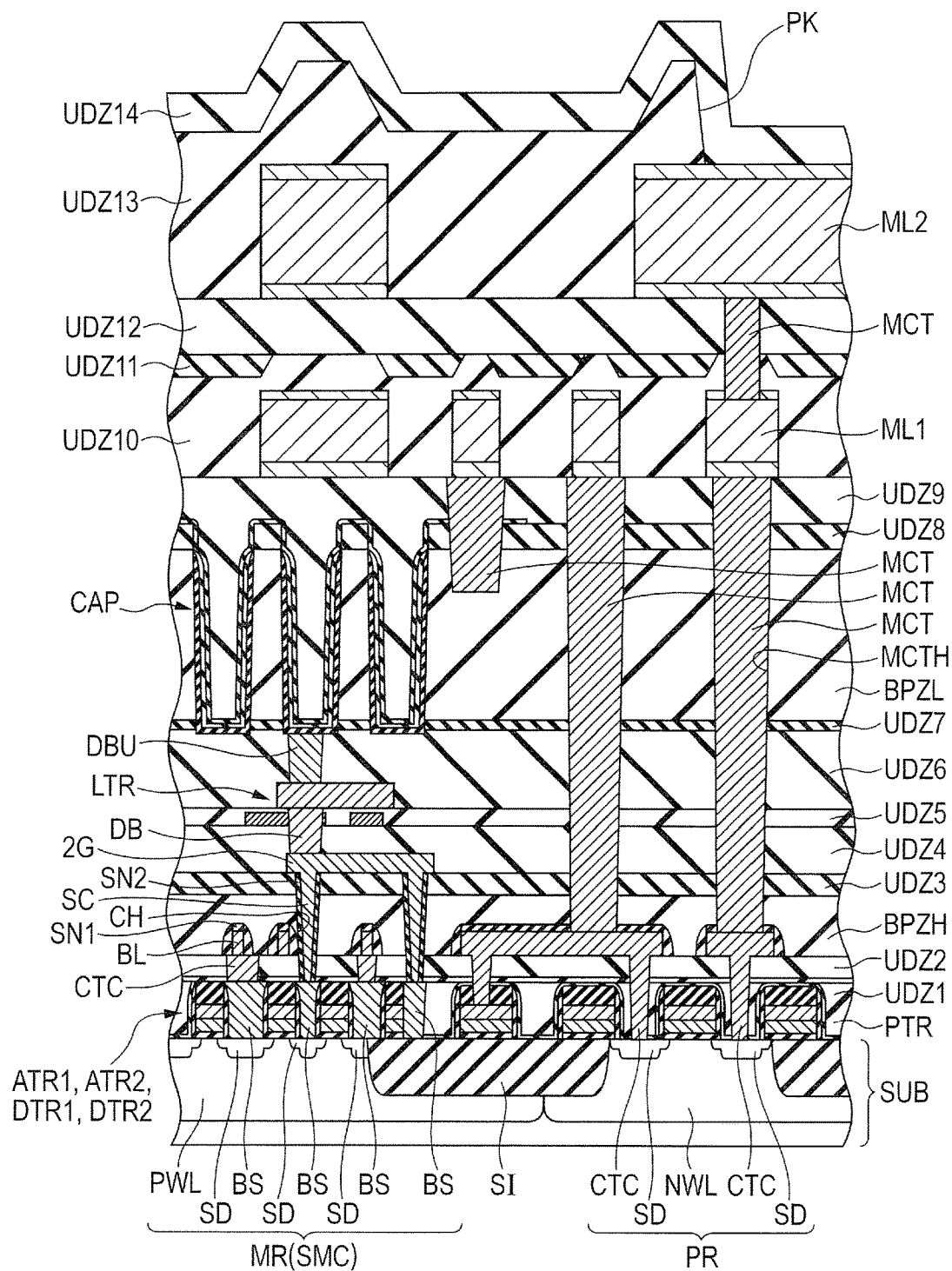
FIG. 28 is a cross-sectional view of the memory cell portion and the peripheral circuit portion showing a step performed after the step shown in FIGS. 26 and 27 in First Embodiment.
Figure 29:
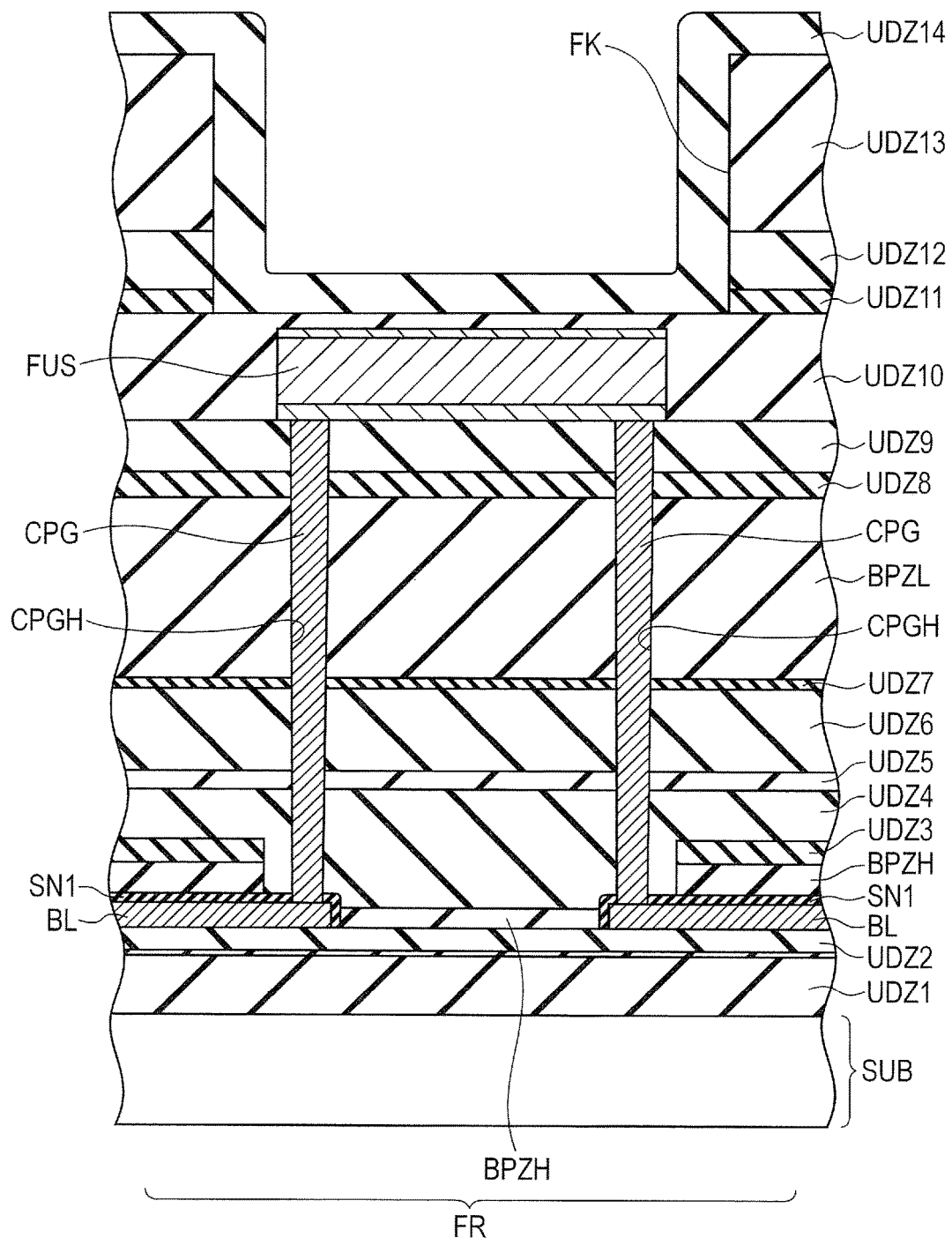
FIG. 29 is a cross-sectional view of the fuse portion in the step shown in FIG. 28 in First Embodiment.
Figure 30:
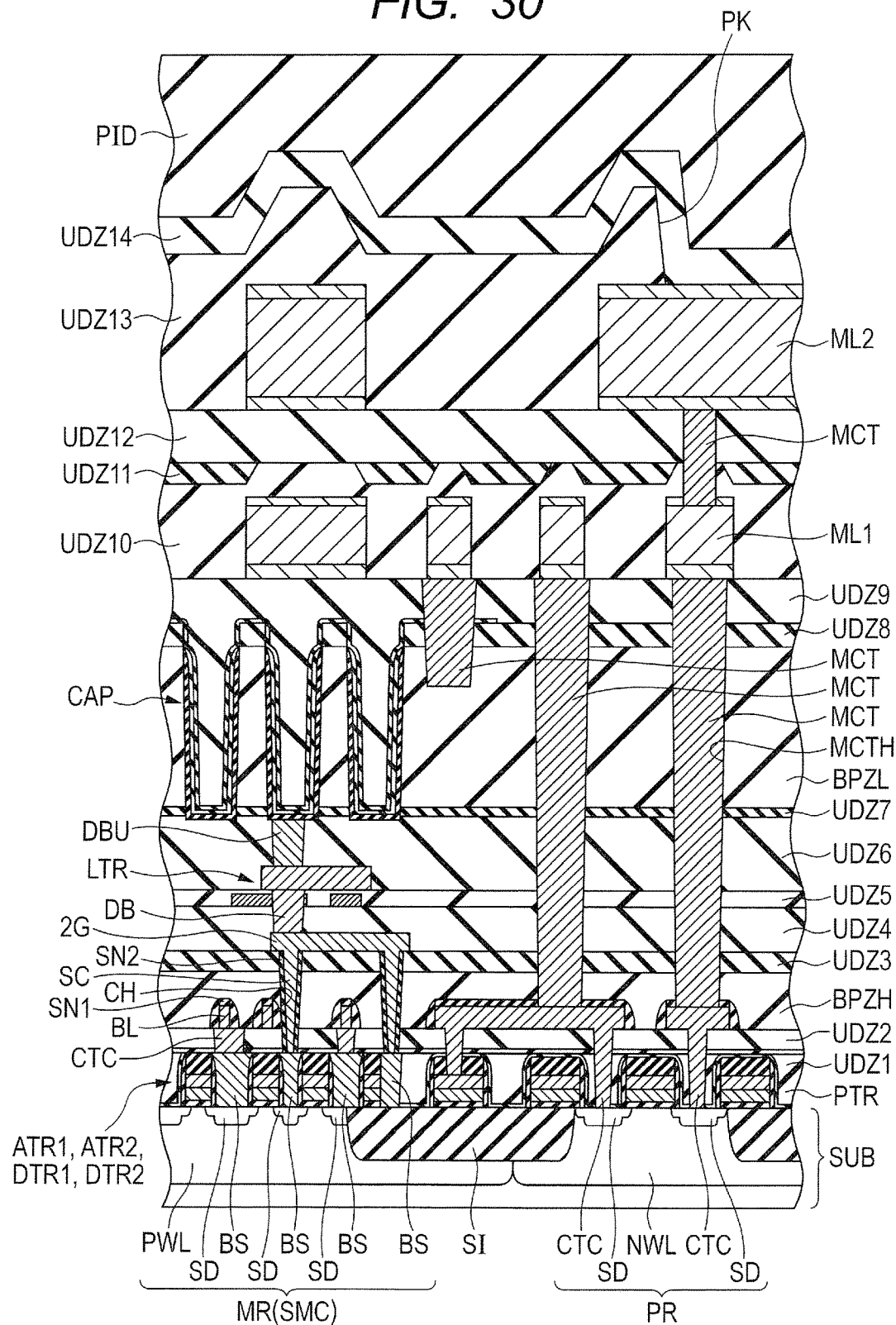
FIG. 30 is a cross-sectional view of the memory cell portion and the peripheral circuit portion showing a step performed after the step shown in FIGS. 28 and 29 in First Embodiment.
Figure 31:
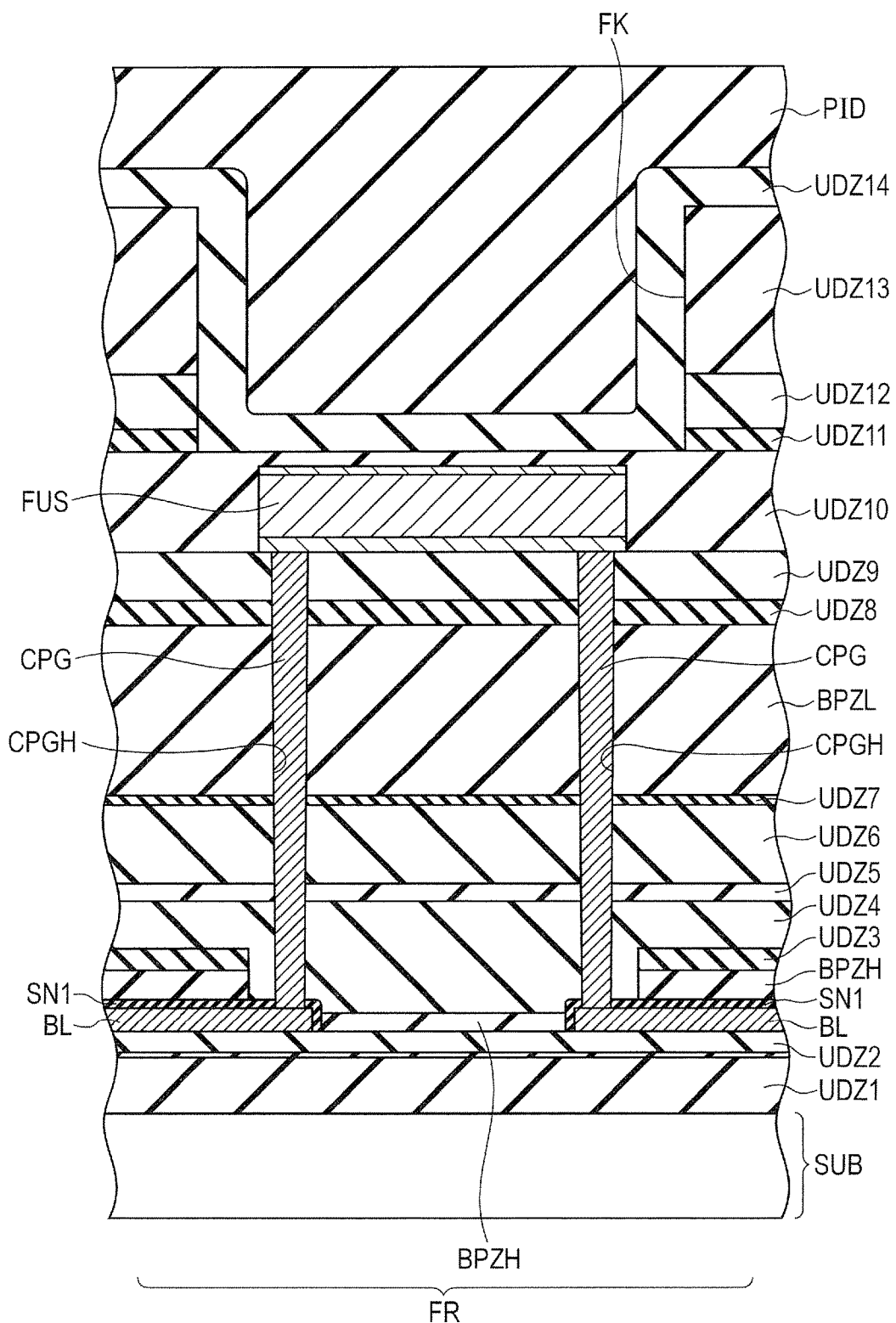
FIG. 31 is a cross-sectional view of the fuse portion in the step shown in FIG. 30 in First Embodiment.

Next, as shown in FIGS. 28 and 29, an interlayer insulating film UZD14 made of a silicon nitride film is formed by plasma CVD so as to cover the surface of the opening portion PK and the opening portion FK. Next, as shown in FIGS. 30 and 31, a polyimide film PID is formed so as to cover the interlayer insulating film UDZ14.

Next, predetermined photolithography and etching of the polyimide film PID are carried out to form a pad opening portion PKP for exposing the pad portion in the peripheral circuit portion PR (refer to FIG. 3). In the fuse portion FR, a fuse opening portion FK is formed right above the fuse FUS while leaving the interlayer insulating film UDZ10 of about 250 nm and the like (refer to FIG. 4). In such a manner, a main portion of the semiconductor device equipped with the SRAM memory cell is completed.

In the fuse portion FR of the semiconductor device of First Example, the boron-doped interlayer insulating film BPZH is formed while being separated from the contact plug CPG or it is left partially. The interlayer insulating film BPZH is therefore not exposed from the side wall of the contact hole CPGH so that a problem due to reaction between boron and water can be avoided. This advantage will next be described by comparing the semiconductor device of First Example with a semiconductor device of Comparative Example.

In the semiconductor device of Comparative Example, in order to simplify the description, members similar to those of the semiconductor device of First Example are denoted by like reference characters and an overlapping description is omitted unless otherwise necessary.

Figure 32:
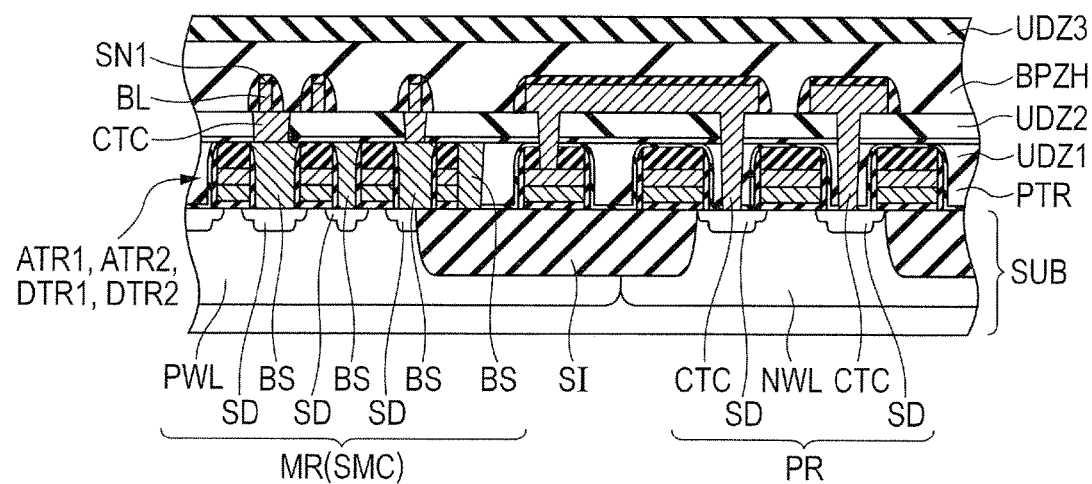
FIG. 32 is a cross-sectional view of a memory cell portion and a peripheral circuit portion showing a step of a method of manufacturing a semiconductor device of Comparative Example.
Figure 33:
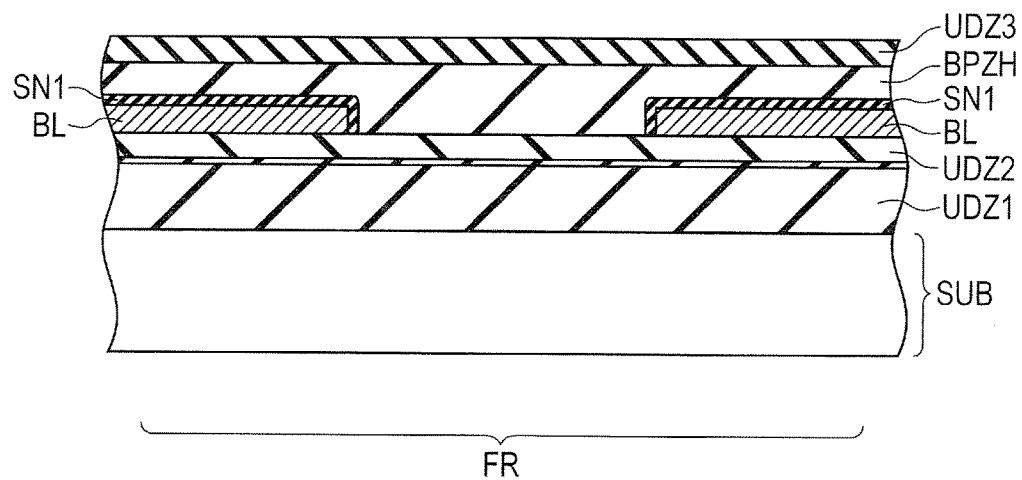
FIG. 33 is a cross-sectional view of a fuse portion in the step shown in FIG. 32.

After steps similar to those shown in FIGS. 5 and 6, a boron-doped interlayer insulating film BPZH is formed so as to cover the bit lines BL and the like and then, an interlayer insulating film UDZ3 not doped with an impurity such as boron is formed so as to cover the interlayer insulating film BPZH, as shown in FIGS. 32 and 33.

Figure 34:
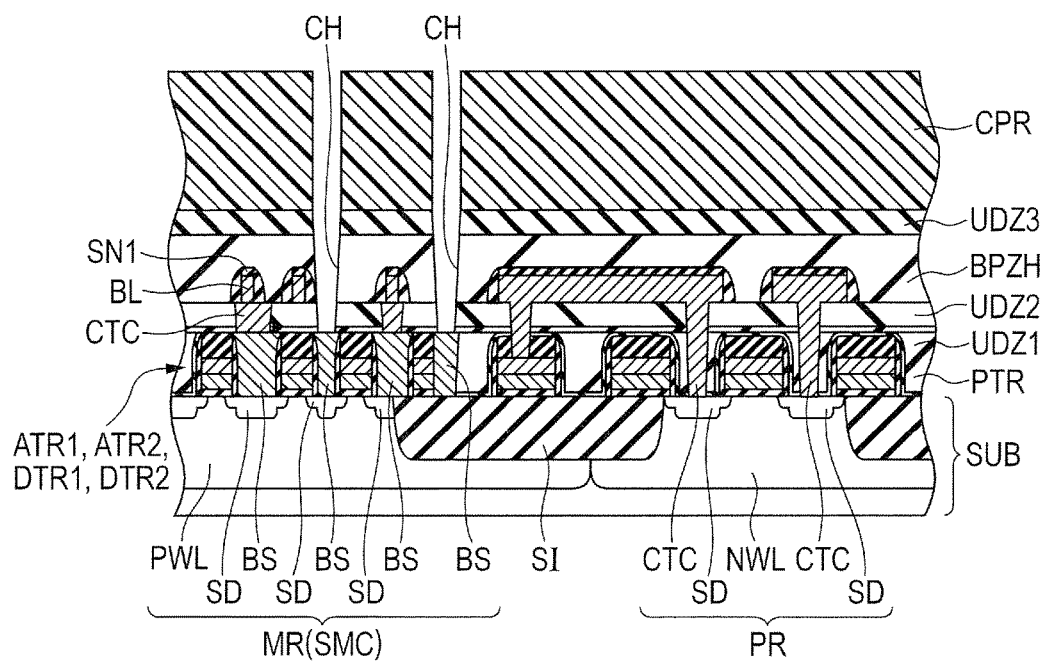
FIG. 34 is a cross-sectional view of the memory cell portion and the peripheral circuit portion showing a step performed after the step shown in FIGS. 32 and 33.
Figure 35:
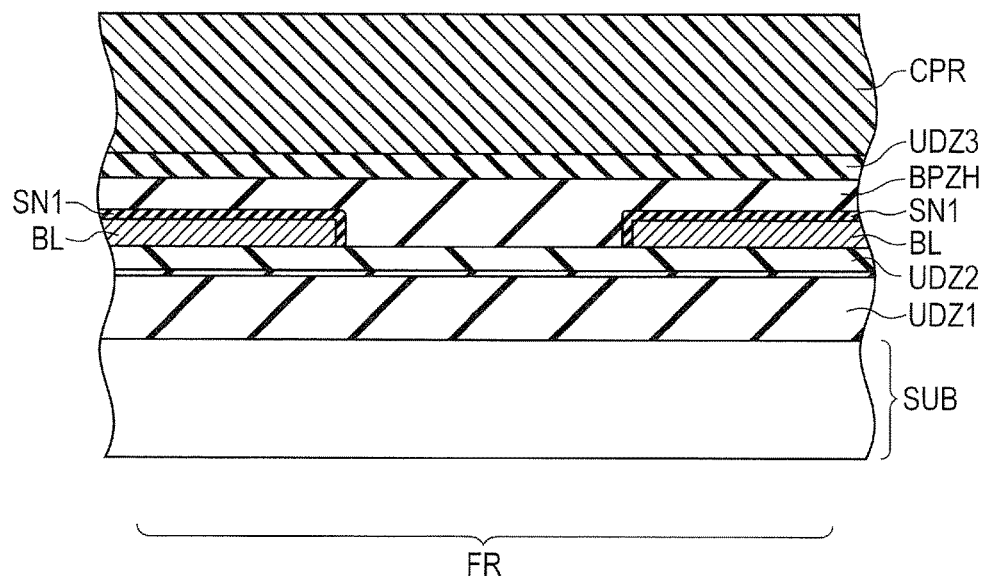
FIG. 35 is a cross-sectional view of the fuse portion in the step shown in FIG. 34.

Next, as shown in FIGS. 34 and 35, predetermined photolithography is performed to form a photoresist pattern CRP. With the photoresist pattern CRP thus obtained as an etching mask, the interlayer insulating films UDZ3 and BPZH, and the like are etched to form a contact hole CH in the memory cell portion MR. After formation of the contact hole CH, the photoresist pattern CPR is removed.

Figure 36:
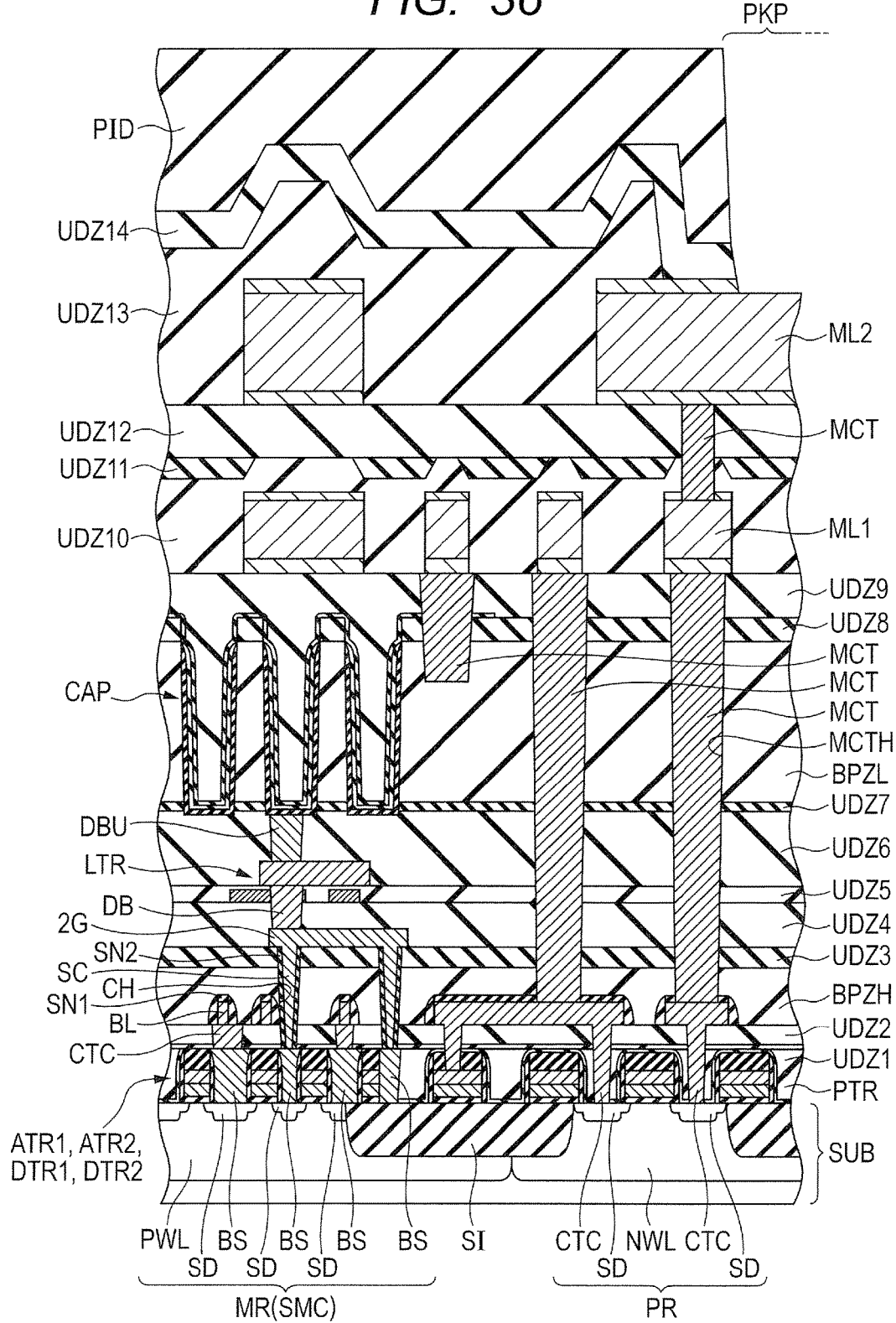
FIG. 36 is a cross-sectional view of the memory cell portion and the peripheral circuit portion showing a step performed after the step shown in FIGS. 34 and 35.
Figure 37:
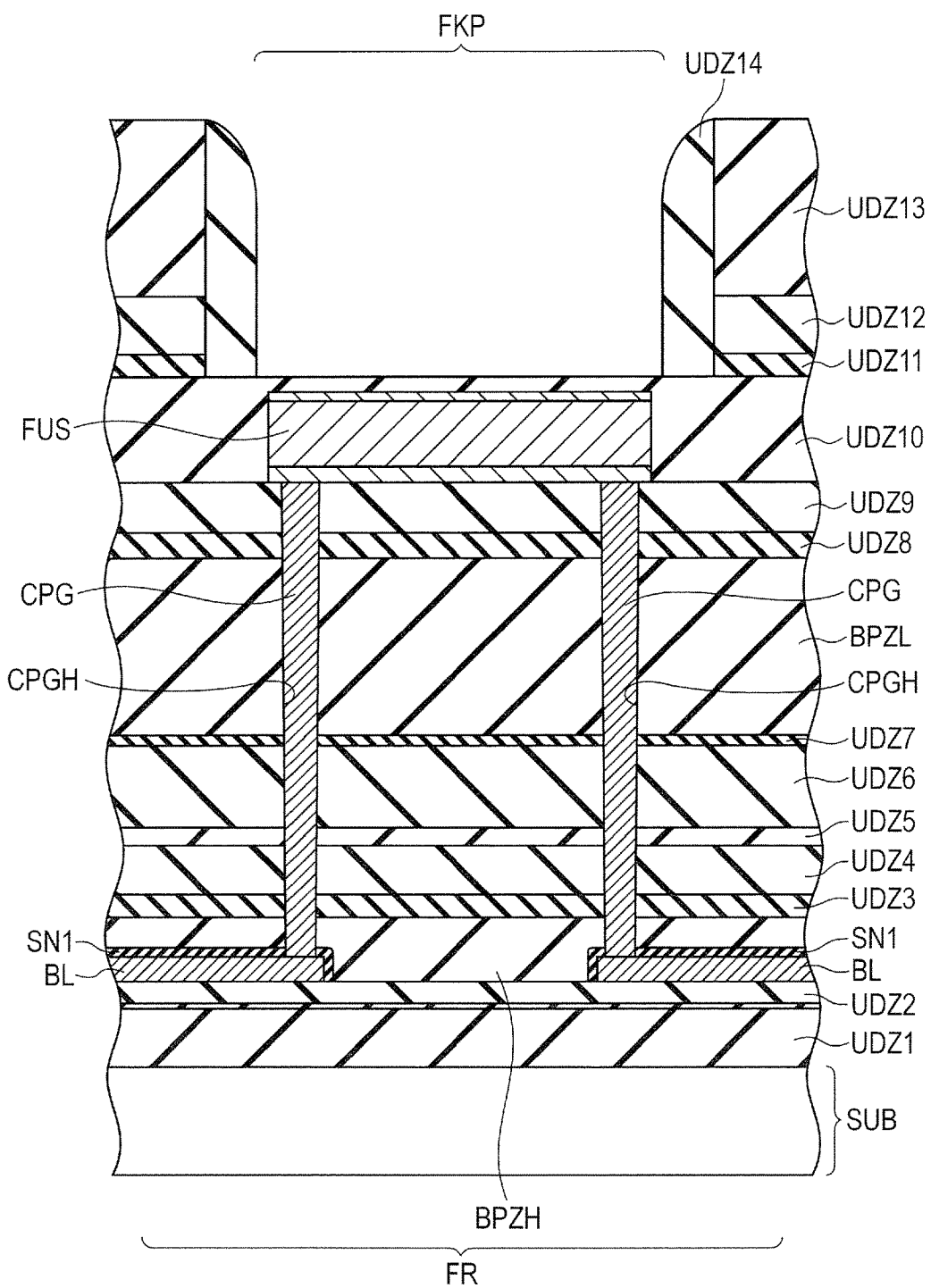
FIG. 37 is a cross-sectional view of the fuse portion in the step shown in FIG. 36.

Next, a local wiring 2G is formed in the memory cell portion MR after steps similar to those shown in FIGS. 7 and 8 (refer to FIG. 36). Next, as shown in FIGS. 36 and 37, an interlayer insulating film UDZ4 is formed so as to cover the local wiring 2G and the like and then interlayer insulating films UDZ5 to UDZ9 are stacked one after another. During this time, in the memory cell portion MR, a load transistor LTR and a capacitor CAP are formed. During these steps, a portion of the interlayer insulating film BPZH located in the fuse portion FR is not subjected to processing such as etching.

Next, predetermined photolithography and etching are performed to form a contact hole MCTH in the peripheral circuit portion PR. In the fuse portion FR, a contact hole CPGH that exposes therefrom the bit line BL is formed. This contact hole CPGH penetrates the boron-doped interlayer insulating film BPZH. Next, a conductive plug MCT is formed in the contact hole MCTH and a contact plug CPG is formed in the contact hole CPGH.

After steps similar to those from the step shown in FIGS. 19 and 20 to the step shown in FIGS. 30 and 31, a pad opening portion PKP and a fuse opening portion FKP are then formed and a main portion of the semiconductor device of Comparative Example is completed.

When in the semiconductor device of Comparative Example, a specific fuse FUS is completely fusion-cut by a laser light in order to switch a memory cell determined to be defective to a normal memory cell, the fuse FUS evaporates and disappears. During fusion-cutting, a contact plug CPG in contact with a fuse FUS having a relatively short length (from about 4 to 5 μm) sometimes evaporates simultaneously.

In the semiconductor device of Comparative Example, the contact hole CPGH penetrating through the boron-doped interlayer insulating film BPZH has therein the contact plug CPG. With evaporation of the contact plug CPG, therefore, the interlayer insulating film BPZH (BPTEOS film) is inevitably exposed from the side wall of the contact hole CPGH.

Figure 38:
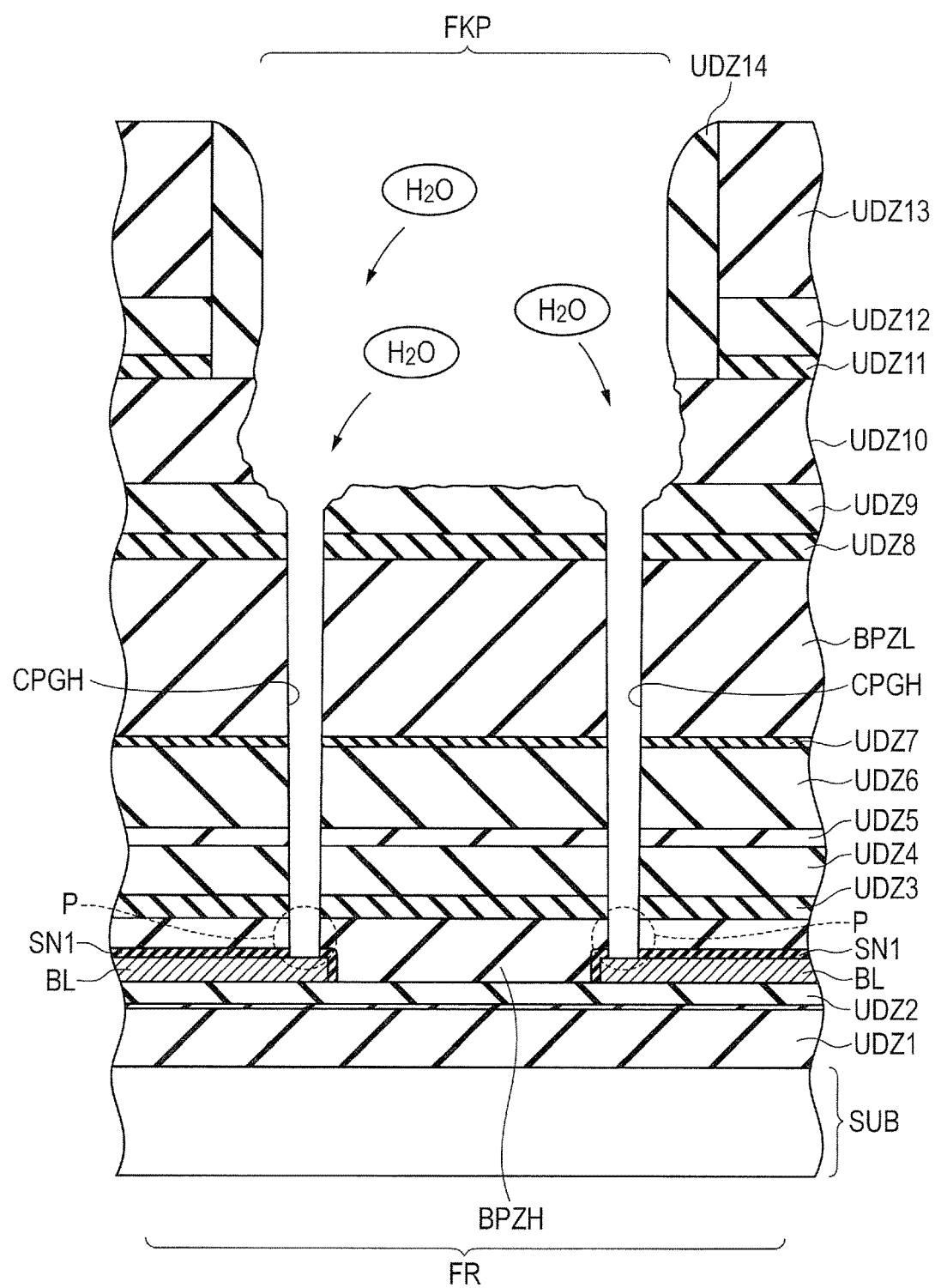
FIG. 38 is a cross-sectional view of the fuse portion for describing the problem of the semiconductor device of Comparative Example.

When an environmental test (HAST) of such a semiconductor device is performed, the semiconductor device is exposed to a high-temperature high-humidity environment. It has been confirmed by the present inventors that as shown in FIG. 38 (within a dotted line frame P), a reaction occurs between water ($H_2O$) and boron contained in the interlayer insulating film BPZH exposed from the side wall of the contact hole CPGH, which may lead to expansion, and thereby cracking or peeling of the interlayer insulating film BPZH (HAST failures).

In the fuse portion FR of the semiconductor device of First Example of First Embodiment, different from that of Comparative Example, the boron-doped interlayer insulating film BPZH covers the bit lines BL while being separated from the contact plugs CPG. In addition, a portion of the interlayer insulating film BPZH that has been left in a region located between an end portion of one of the bit lines BL and an end portion of the other bit line BL is separated from one of the contact plugs CPG and the other contact plug CPG.

Figure 39:
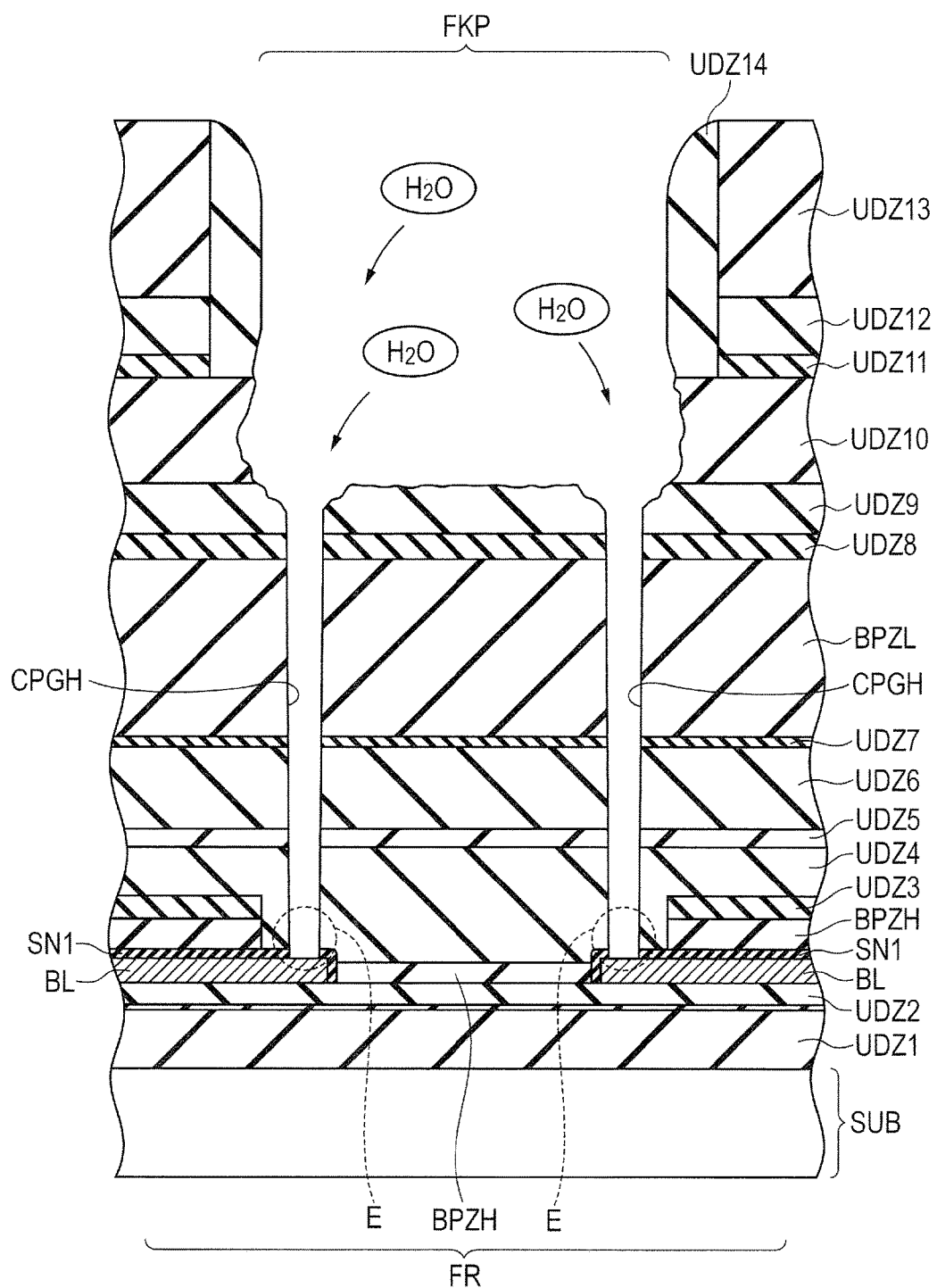
FIG. 39 is a cross-sectional view of the fuse portion for describing the advantage of First Embodiment.

Even when the fuse FUS and the contact plug CPG inevitably evaporate simultaneously by fusion-cutting of the fuse FUS having a length of from about 4 to 5 μm a shown in FIG. 39, the interlayer insulating film UDZ4 not doped with an impurity such as boron is exposed from the side wall of the contact hole CPGH and the boron-doped interlayer insulating film BPZH is not exposed (within a dotted line frame E).

It has been confirmed newly by the present inventors that this makes it possible to prevent water ($H_2O$) and boron from reacting with each other in an environmental test and to completely prevent cracking, peeling, or the like (HAST failures) due to expansion of the interlayer insulating film BPZH caused by the reaction between water and boron.

Further, the present inventors made various evaluations on the boron-doped interlayer insulating film and obtained respective findings on the relation between boron concentration and HAST failures and the relation between thickness of the interlayer insulating film and HAST failures.

First, the relation between boron concentration and HAST failures will be described. In the semiconductor device of Comparative Example, the contact hole CPGH penetrates the interlayer insulating film BPZH and also the interlayer insulating film BPZL as the boron-doped interlayer insulating film. It has however been confirmed by the present inventors that in the environmental test, HAST failures occurred in an exposed portion of the interlayer insulating film BPZH, but no HAST failure occurred in an exposed portion of the interlayer insulating film BPZL. The boron concentration of the interlayer insulating film BPZH is about 3.2 wt %, while that of the interlayer insulating film BPZL is about 2.3 wt %.

Figure 40:
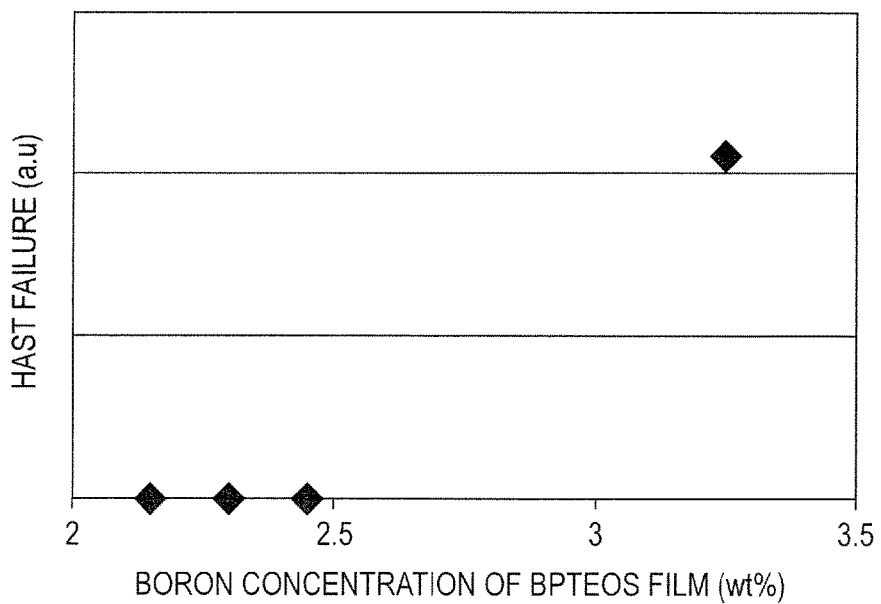
FIG. 40 shows the relation between HAST failure and boron concentration of the BPTEOS film in First Embodiment.

The present inventors therefore evaluated the dependency of HAST failures of an interlayer insulating film on boron concentration. The results are shown in FIG. 40. As shown in FIG. 40, it has been found that no HAST failure occurs when the boron concentration of the interlayer insulating film is about 2.5 wt. % or less.

Next, the relation between thickness of an interlayer insulating film and HAST failures will be described. The thickness of the interlayer insulating film BPZH exposed from the side wall of the contact hole CPGH is set thinner than the thickness of the interlayer insulating film BPZL.

Figure 41:
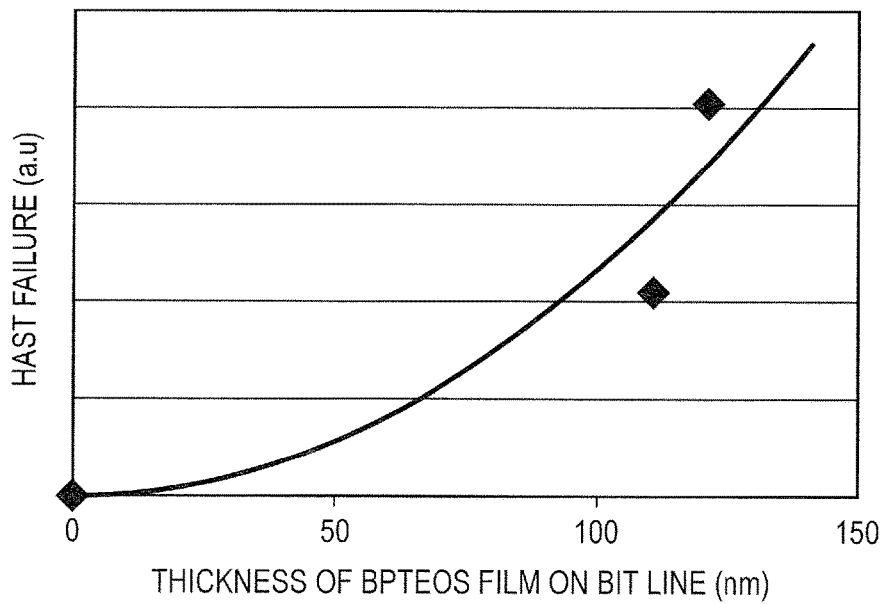
FIG. 41 shows the relation between HAST failure and thickness of the BPTEOS film in First Embodiment.

The present inventors evaluated dependency of HAST failures on the thickness of an interlayer insulating film (on a bit line). The boron concentration was set at about 3.2 wt %. The results are shown in FIG. 41. It has been found that as shown in FIG. 41, when the interlayer insulating film has a thickness of 0, that is, the interlayer insulating film BPZH is not exposed from the side wall of the contact hole CPGH, no HAST failure occurs and with an increase in the thickness of the interlayer insulating film, HAST failures increase.

The evaluation results suggest that even when a boron-doped interlayer insulating film is exposed from the side wall of a contact hole, occurrence of HAST failures can be suppressed with a decrease in the thickness of the interlayer insulating film. A semiconductor device based on this finding will be described in Third Embodiment.

Figure 42:
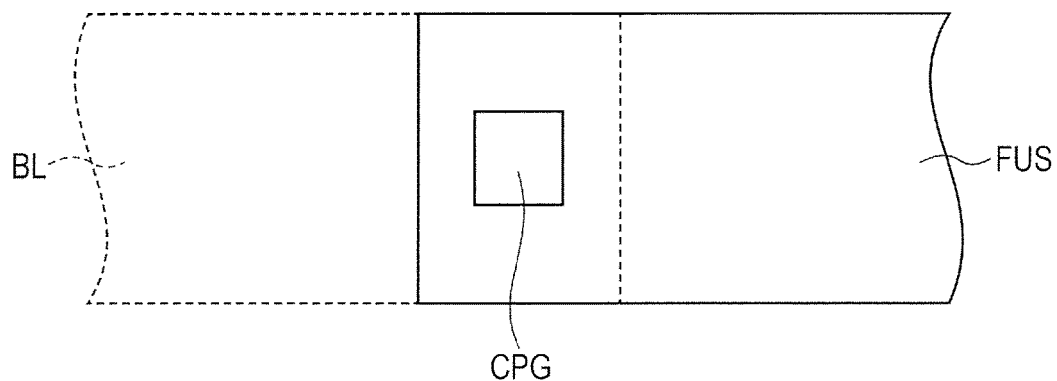
FIG. 42 is a partial plan view showing one mode of a contact plug that electrically couples a bit line to a fuse in First Embodiment.
Figure 43:
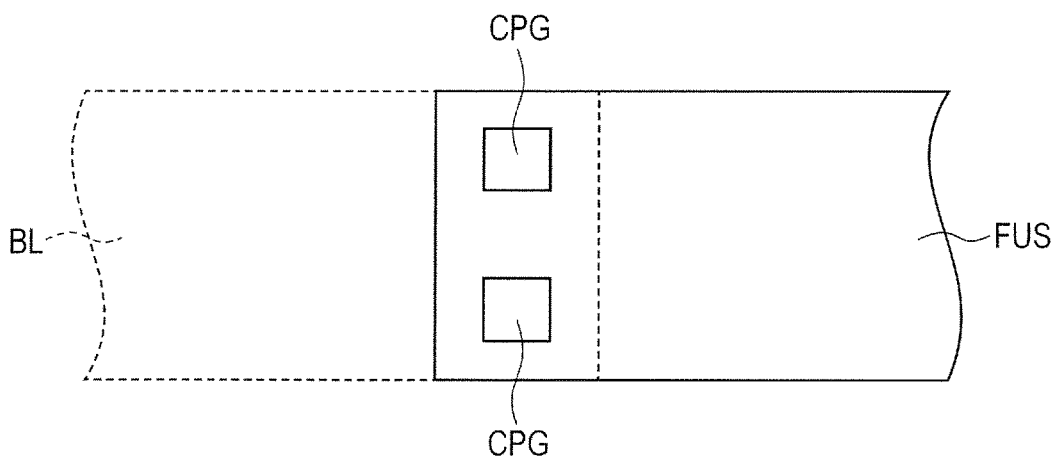
FIG. 43 is a partial plan view showing another mode of the contact plug that electrically couples a bit line to a fuse in First Embodiment.

In the above description on the semiconductor device of First Example, the number of contact plugs formed as an example of the contact plug CPT that electrically couples the fuse FUS to the bit line BL is one as shown in FIG. 42. The number of the contact plugs CPG is not limited to one, but for example, two contact plugs may be formed as shown in FIG. 43.

Second Example

In the description of First Example, the series of steps for partially removing the interlayer insulating film BPZH located in the fuse portion FR are performed after formation of the local wiring 2G but before formation of the interlayer insulating film UDZ4 that covers the local wiring 2G. Here, as a variation of the manufacturing method, the series of steps performed before formation of the local wiring 2G will be described.

Figure 44:
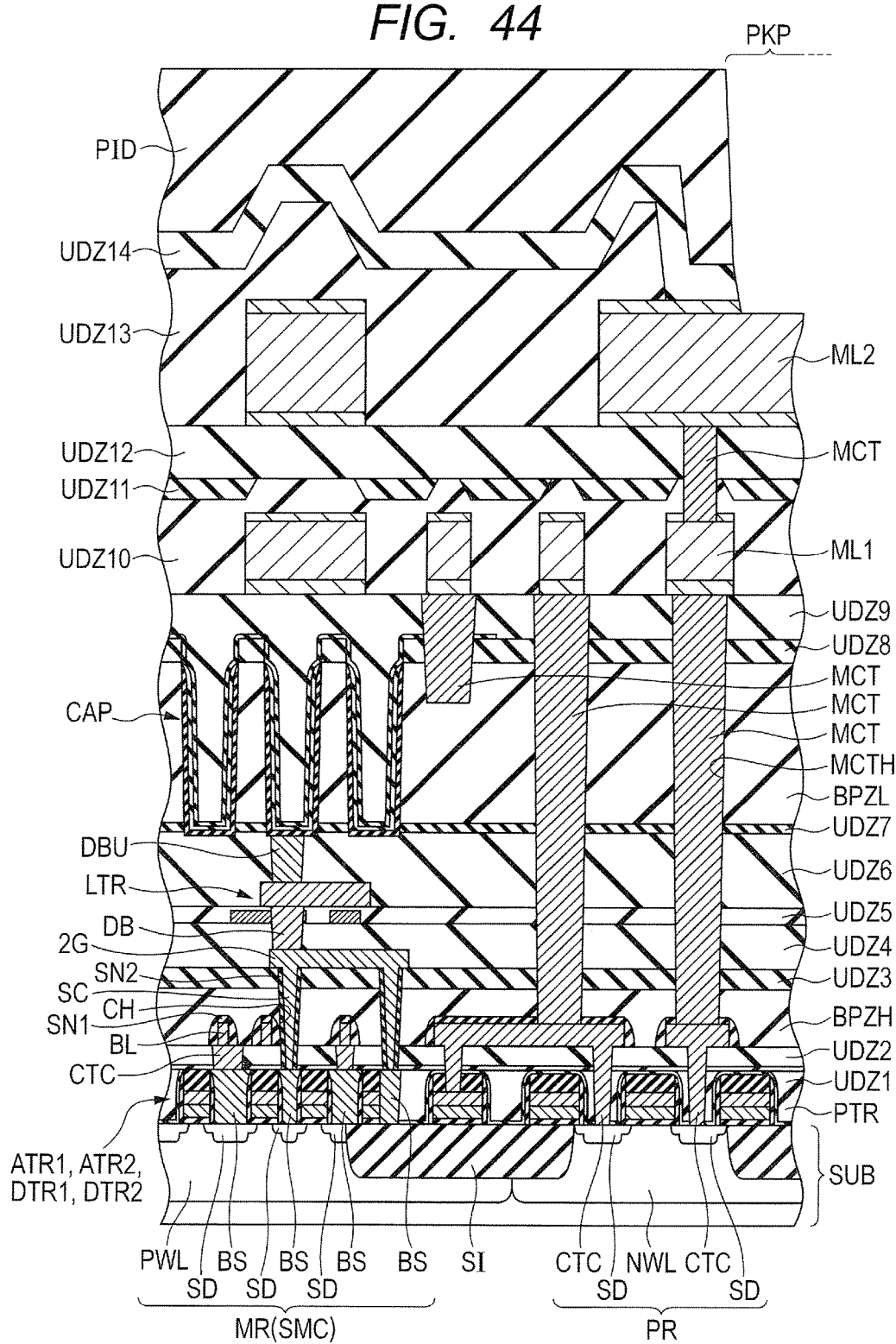
FIG. 44 is a cross-sectional view showing the structure of a memory cell portion and a peripheral circuit portion in a semiconductor device of Second Example of First Embodiment.
Figure 45:
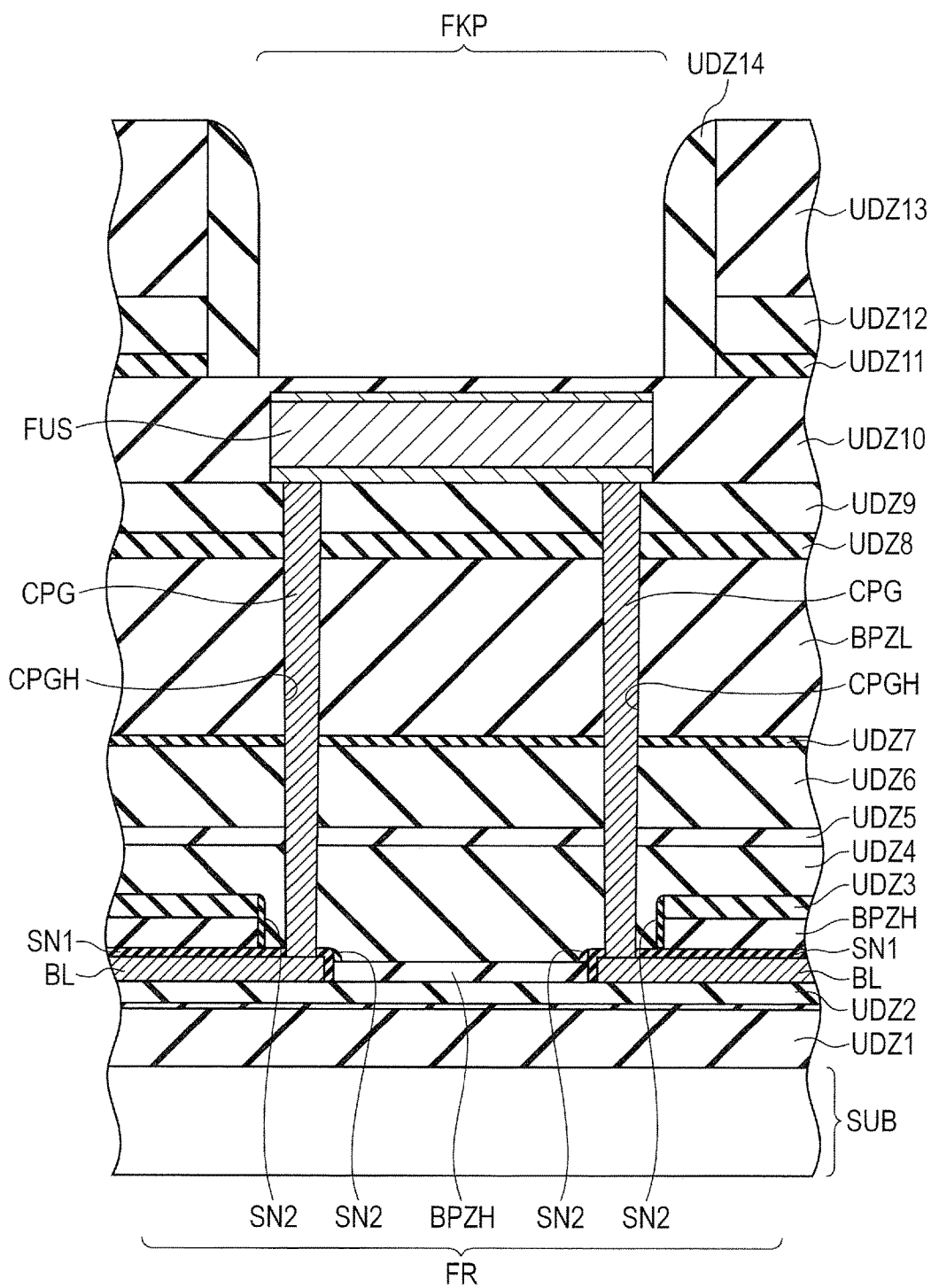
FIG. 45 is a cross-sectional view showing the structure of a fuse portion in the semiconductor device of Second Example of First Embodiment.

In Second Example, the series of steps for partially removing the interlayer insulating film BPZH located in the fuse portion FR are performed before formation of the local wiring 2G to additionally form a sidewall insulating film in the fuse portion FR. As shown in FIGS. 44 and 45, in the fuse portion FR of the semiconductor device, a silicon nitride film SN2 covers, as a sidewall insulating film, the end surface of the remaining interlayer insulating film BPZH and interlayer insulating film UDZ3. The silicon nitride film SN2 also lies on an upper end portion of the silicon nitride film SN1 that covers the bit line BL.

As will be described later, this silicon nitride film SN2 is made of a film similar to the silicon nitride film SN2 that covers the side wall of the contact hole CH located in the memory cell portion MR. The other configuration is similar to the configuration of the semiconductor device (First Example of First Embodiment) shown in FIGS. 3 and 4 so that like members are denoted by like reference characters and an overlapping description is omitted unless otherwise necessary.

Figure 46:
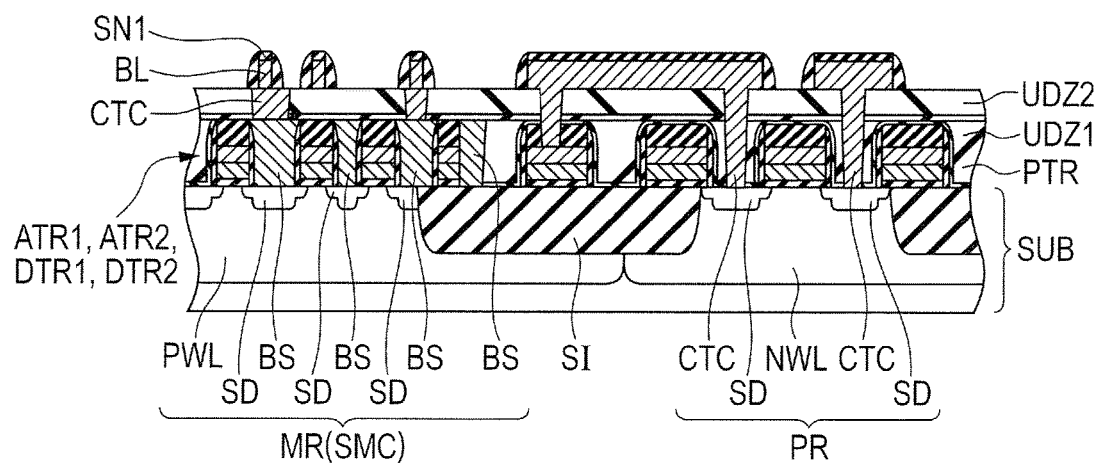
FIG. 46 is a cross-sectional view of the memory cell portion and the peripheral circuit portion showing a step of a method of manufacturing a semiconductor device of Second Example of First Embodiment.
Figure 47:
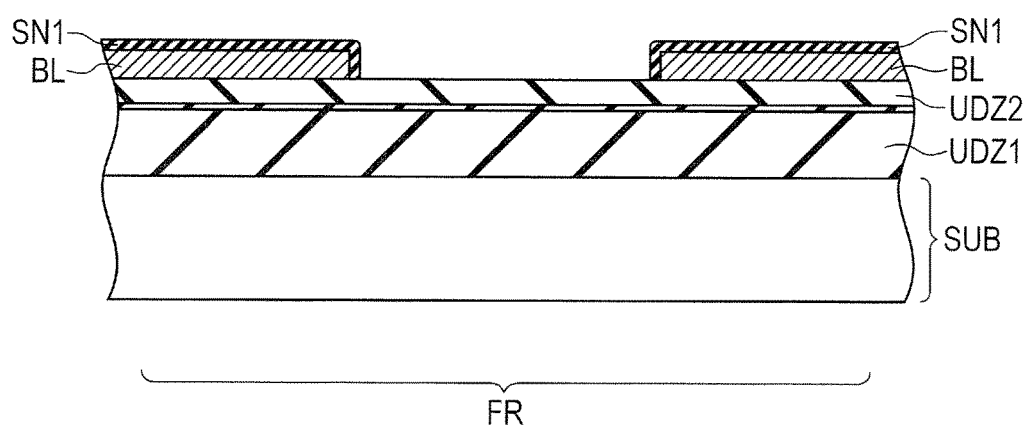
FIG. 47 is a cross-sectional view of the fuse portion in the step shown in FIG. 46 in First Embodiment.

Next, a method of manufacturing a semiconductor device of Second Example will be described. First, after a step similar to that shown in FIGS. 5 and 6, a bit line BL and the like to be electrically coupled to access transistors ATR1 and ATR2 are formed in the memory cell portion MR and the peripheral circuit portion PR as shown in FIGS. 46 and 47. In the fuse portion FR, a bit line BL and a bit line BL which are each to be electrically coupled to the memory cell and the like and extend in one direction are formed.

Figure 48:
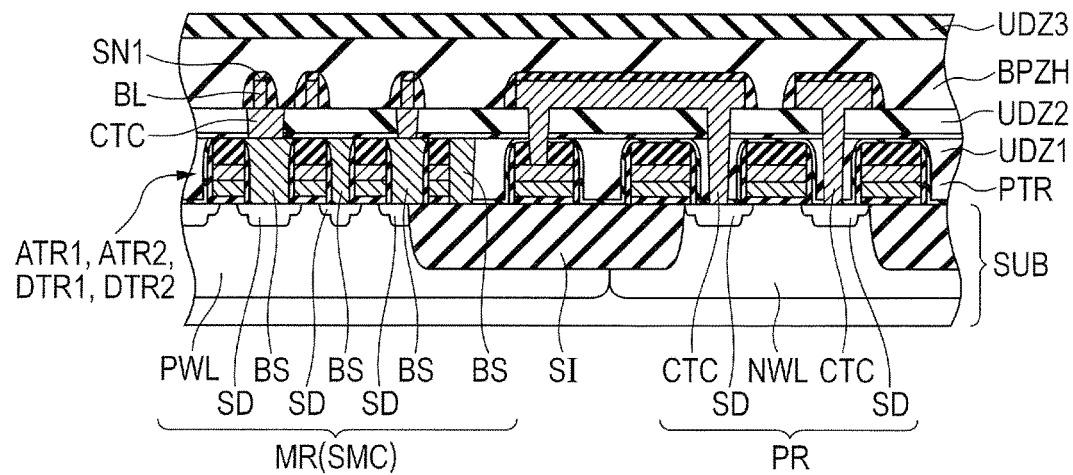
FIG. 48 is a cross-sectional view of the memory cell portion and the peripheral circuit portion showing a step performed after the step shown in FIGS. 46 and 47 in First Embodiment.
Figure 49:
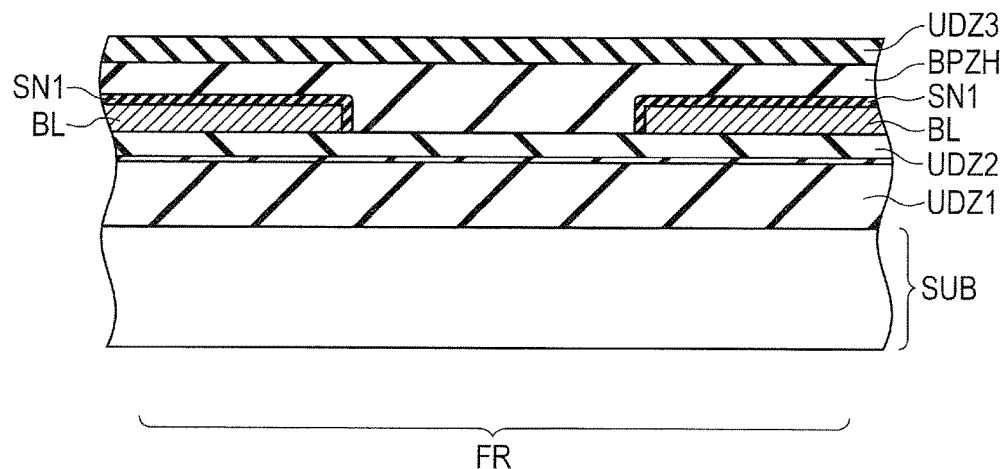
FIG. 49 is a cross-sectional view of the fuse portion in the step shown in FIG. 48 in First Embodiment.

Next, as shown in FIGS. 48 and 49, a boron-doped interlayer insulating film BPZH is formed so as to cover the bit line BL and the like. Next, an interlayer insulating film UDZ3 not doped with an impurity such as boron is formed.

Next, by predetermined photolithography, a photoresist pattern (not shown) that exposes therefrom a portion of the interlayer insulating film UDZ3 located in the fuse portion FR and covers the memory cell portion and the like is formed. This photoresist pattern is, similar to the photoresist pattern PR1 shown in FIG. 10, formed so as not to cover a region including a place where the contact plug CPG (refer to FIG. 45) is in contact with the bit line BL.

Figure 50:
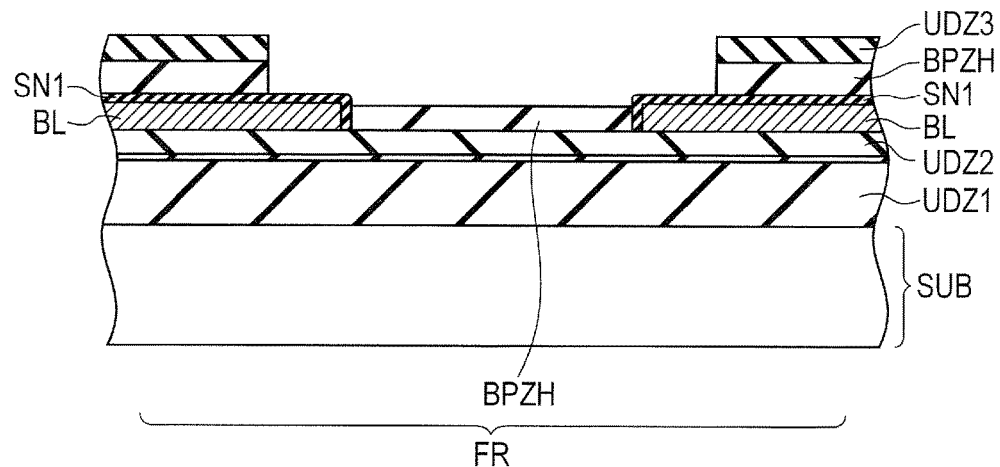
FIG. 50 is a cross-sectional view of the fuse portion showing a step performed after the step shown in FIGS. 48 and 49 in First Embodiment.

Next, with the photoresist pattern as an etching mask, etching is performed to partially remove the interlayer insulating film UDZ3 and the interlayer insulating film BPZH while leaving a portion of the interlayer insulating film BPZH having a predetermined thickness between an end portion of one of the bit lines BL and an end portion of the other bit line BL, as shown in FIG. 50.

Figure 51:
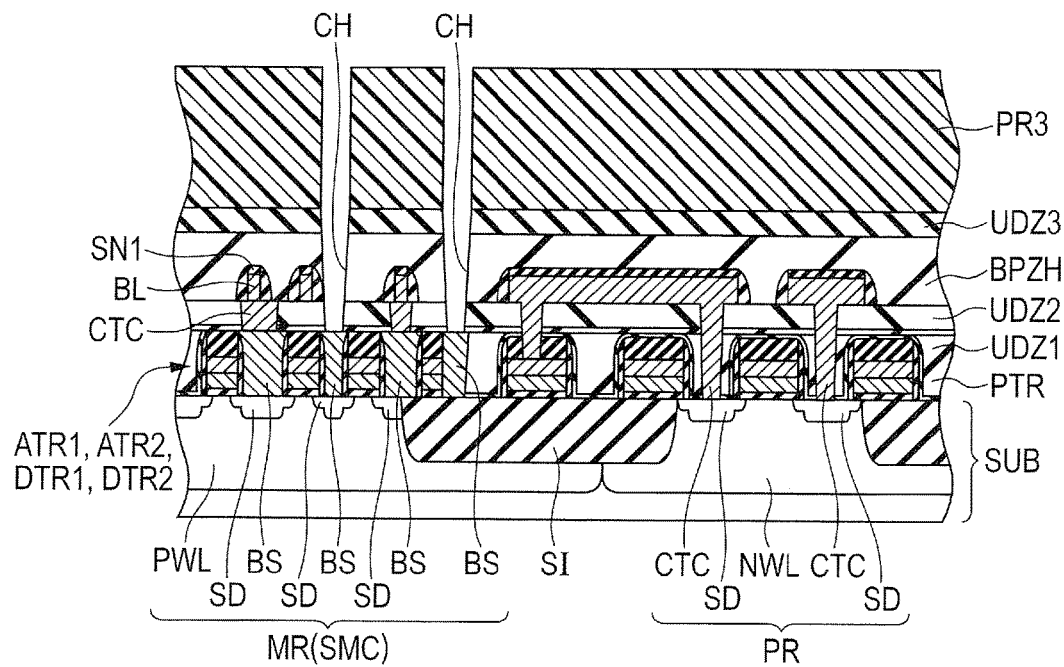
FIG. 51 is a cross-sectional view of the memory cell portion and the peripheral circuit portion showing a step performed after the step shown in FIG. 50 in First Embodiment.
Figure 52:
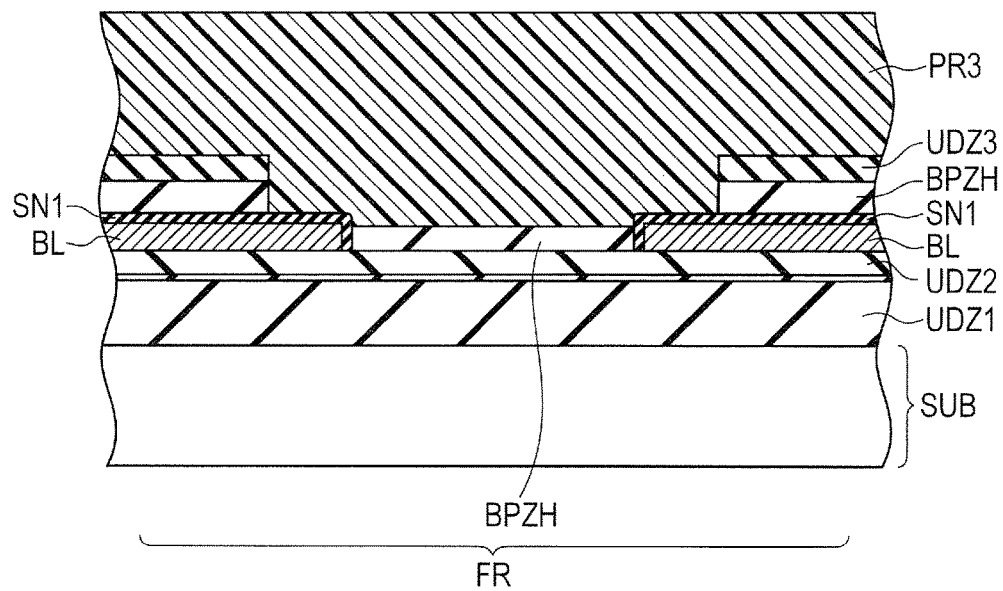
FIG. 52 is a cross-sectional view of the fuse portion in the step shown in FIG. 51 in First Embodiment.

Next, as shown in FIGS. 51 and 52, predetermined photolithography is performed to form a photoresist pattern PR3. With the photoresist pattern PR3 as an etching mask, the interlayer insulating films UDZ5 and UDZ4 and the like are etched to form a contact hole CH in the memory cell portion MR. The photoresist pattern PR3 is then removed.

Figure 53:
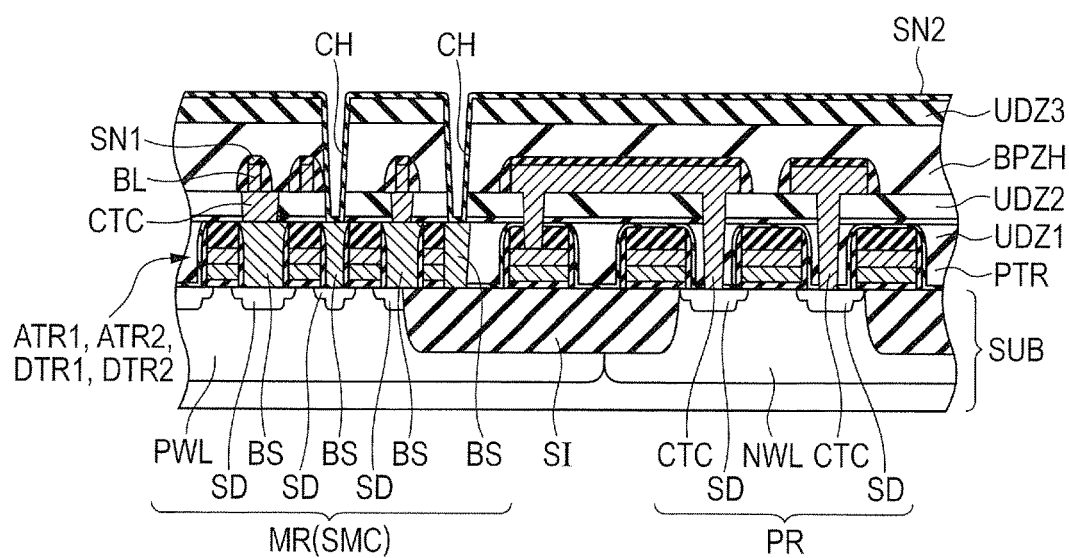
FIG. 53 is a cross-sectional view of the memory cell portion and the peripheral circuit portion showing a step performed after the step shown in FIGS. 51 and 52 in First Embodiment.
Figure 54:
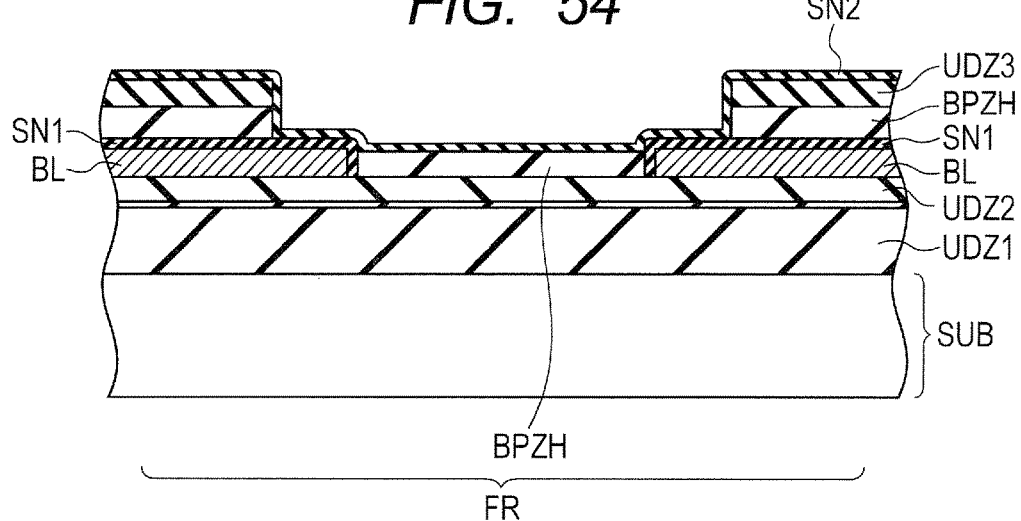
FIG. 54 is a cross-sectional view of the fuse portion in the step shown in FIG. 53 in First Embodiment.
Figure 55:
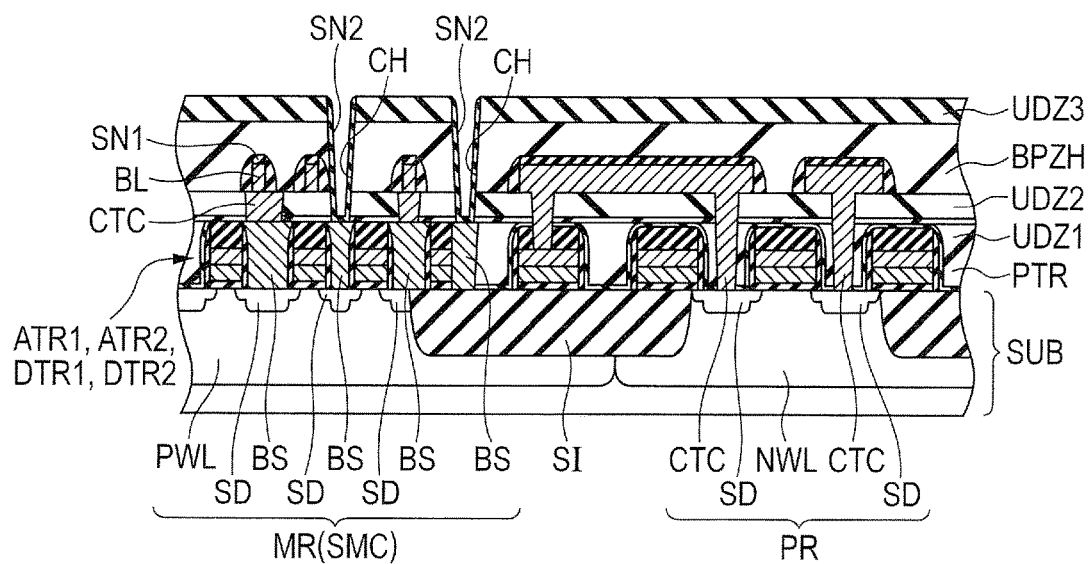
FIG. 55 is a cross-sectional view of the memory cell portion and the peripheral circuit portion showing a step performed after the step shown in FIGS. 53 and 54 in First Embodiment.
Figure 56:
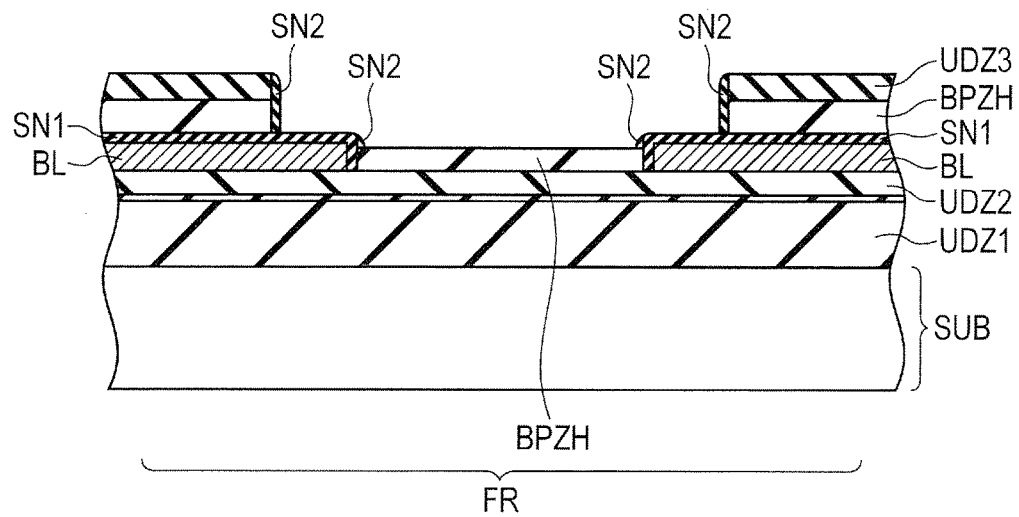
FIG. 56 is a cross-sectional view of the fuse portion in the step shown in FIG. 55 in First Embodiment.

Next, as shown in FIGS. 53 and 54, a silicon nitride film SN2 is formed to cover the side wall of the contact hole CH in the memory cell portion MR and the interlayer insulating film BPZH and the like that have been left in the fuse portion FR. Next, as shown in FIGS. 55 and 56, the entire surface of the silicon nitride film SN2 is anisotropically etched (etched back).

By this etching, the silicon nitride film SN2 is formed as a sidewall insulating film in the contact hole CH in the memory cell portion MR. In the fuse portion FR, the silicon nitride film SN2 is formed as a sidewall insulating film on the end surface of the interlayer insulating films BPZH and UZD3 that cover the bit line BL. Further, the silicon nitride film SN2 is formed as a sidewall insulating film on an upper end portion of the silicon nitride film SN1 that covers the bit line BL therewith.

Figure 57:
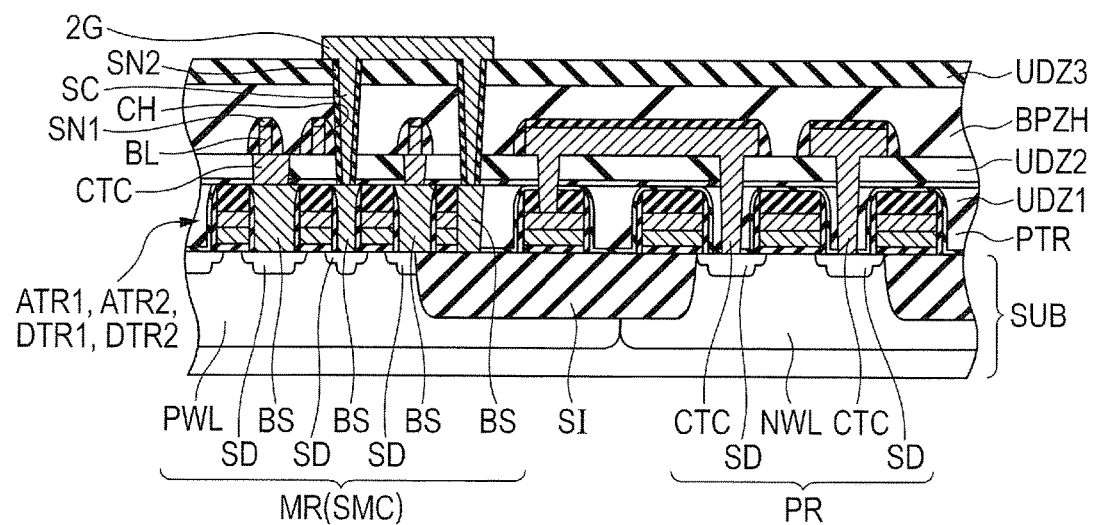
FIG. 57 is a cross-sectional view of the memory cell portion and the peripheral circuit portion showing a step performed after the step shown in FIGS. 55 and 56 in First Embodiment.

Next, by a step similar to that shown in FIG. 7, a polysilicon plug SC and a local wiring 2G are formed in the memory cell portion MR as shown in FIG. 57. After steps similar to the step shown in FIG. 13 and the step shown in FIGS. 30 and 31, a pad opening portion PKP is formed in the peripheral circuit portion PR and a fuse opening portion FKP is formed in the fuse portion FR. As a result, a main portion of the semiconductor device shown in FIGS. 44 and 45 is completed.

In the semiconductor device of Second Example, similar to the semiconductor device of First Example, the boron-doped interlayer insulating film BPZH covers the bit lines BL while being separated from the contact plugs CPG in the fuse portion FR of the semiconductor device. A portion of the interlayer insulating film BPZH that has been left in a region located between an end portion of one of the bit lines BL and an end portion of the other bit line BL is, on the other hand, separated from both of one of the contact plugs CP and the other contact plug CP.

Even when both the fuse FUS and the contact plug CPG inevitably evaporate by fusion-cutting of the fuse FUS, the interlayer insulating film UDZ4 not doped with an impurity such as boron is exposed from the side wall of the contact hole CPGH and the boron-doped interlayer insulating film BPZH is never exposed (refer to FIG. 39).

This makes it possible to prevent water ($H_2O$) and boron from reacting with each other in an environmental test and completely prevent cracking or peeling (HAST failures) of the interlayer insulating film BPZH due to its expansion caused by the reaction between water and boron.

Second Embodiment

In the description of First Embodiment, the interlayer insulating film BPZH is left between an end portion of one of the bit lines BL and an end portion of the other bit line, each located in the fuse portion FR. In the following description, the interlayer insulating film BPZH is not left.

First Example

In the following description of First Example, the series of steps for removing an interlayer insulating film BPZH located in the fuse portion FR are performed after formation of a local wiring 2G but before formation of an interlayer insulating film UDZ4 that covers the local wiring 2G therewith.

Figure 58:
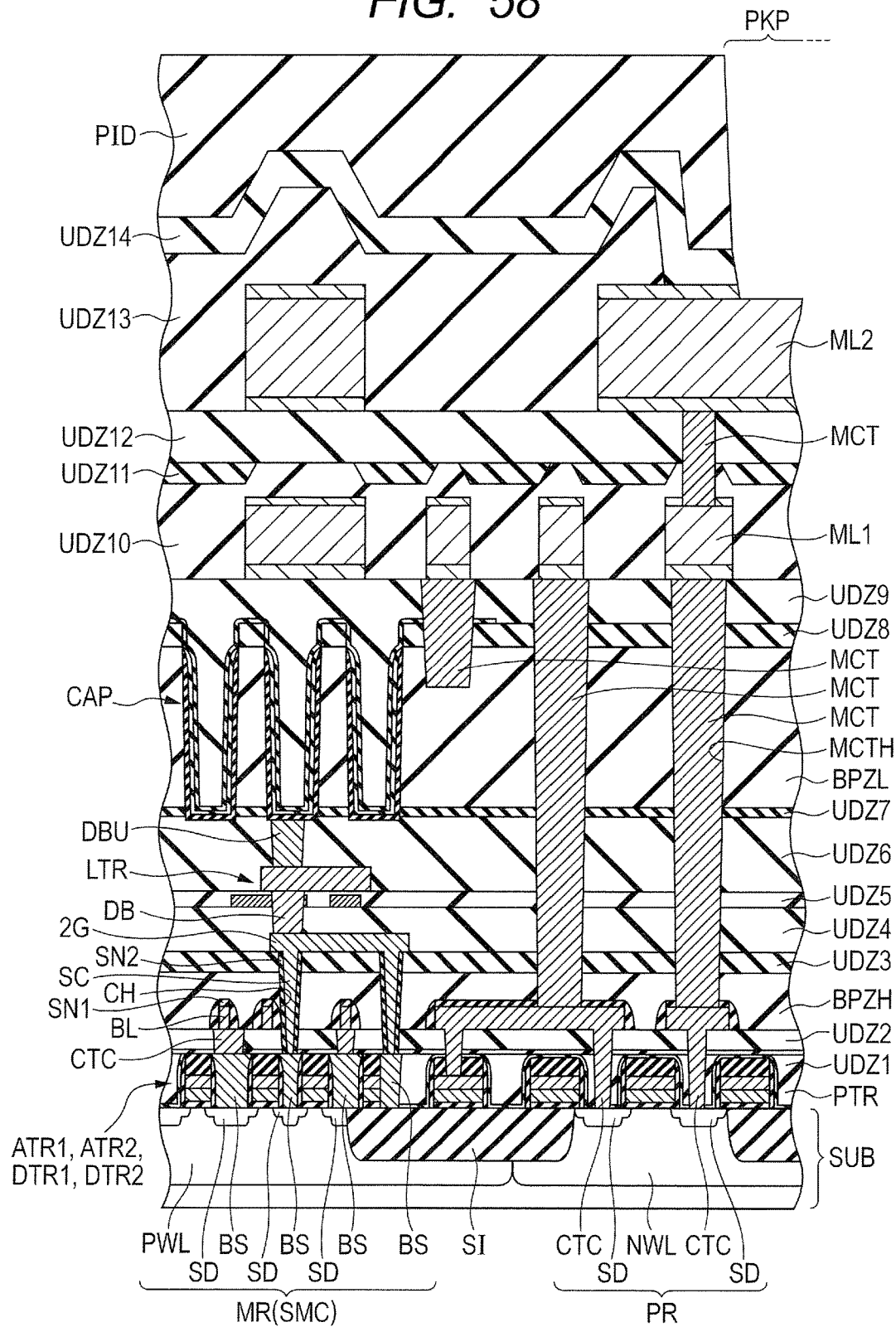
FIG. 58 is a cross-sectional view showing the structure of the memory cell portion and the peripheral circuit portion in a semiconductor device of First Example of Second Embodiment.
Figure 59:
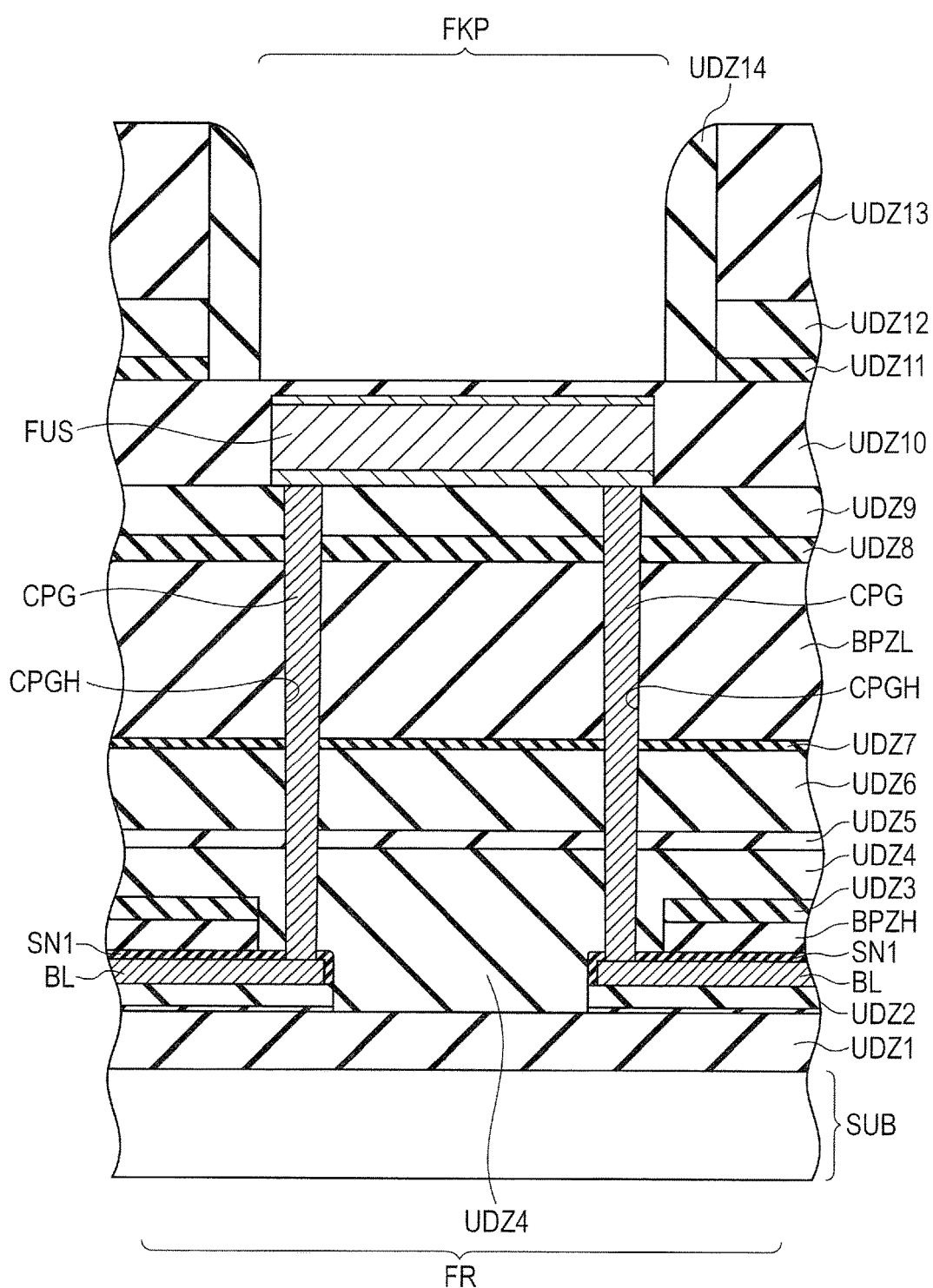
FIG. 59 is a cross-sectional view showing the structure of the fuse portion of the semiconductor device of First Example of Second Embodiment.

As shown in FIGS. 58 and 59, in the fuse portion FR of the semiconductor device, first, a boron-doped interlayer insulating film BPZH is formed so as to cover therewith bit lines BL while being separated from contact plugs CPG. In a region between an end portion of one of the bit lines BL and an end portion of the other bit line BL, the interlayer insulating film BPZH is not left and an interlayer insulating film UDZ4 not doped with an impurity such as boron lies. The configuration of the semiconductor device except for the above-described portions is similar to the semiconductor device (First Example of First Embodiment) shown in FIGS. 3 and 4 so that like members are denoted by like reference characters and an overlapping description is omitted unless otherwise necessary.

Figure 60:
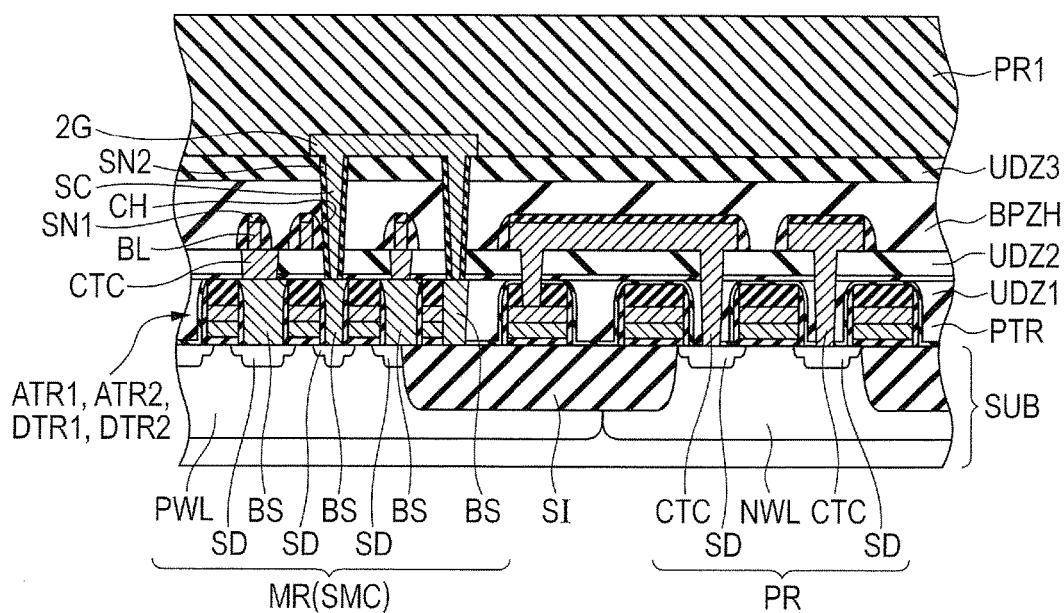
FIG. 60 is a cross-sectional view of the memory cell portion and the peripheral circuit portion showing a step of a method of manufacturing the semiconductor device of First Example of Second Embodiment.
Figure 61:
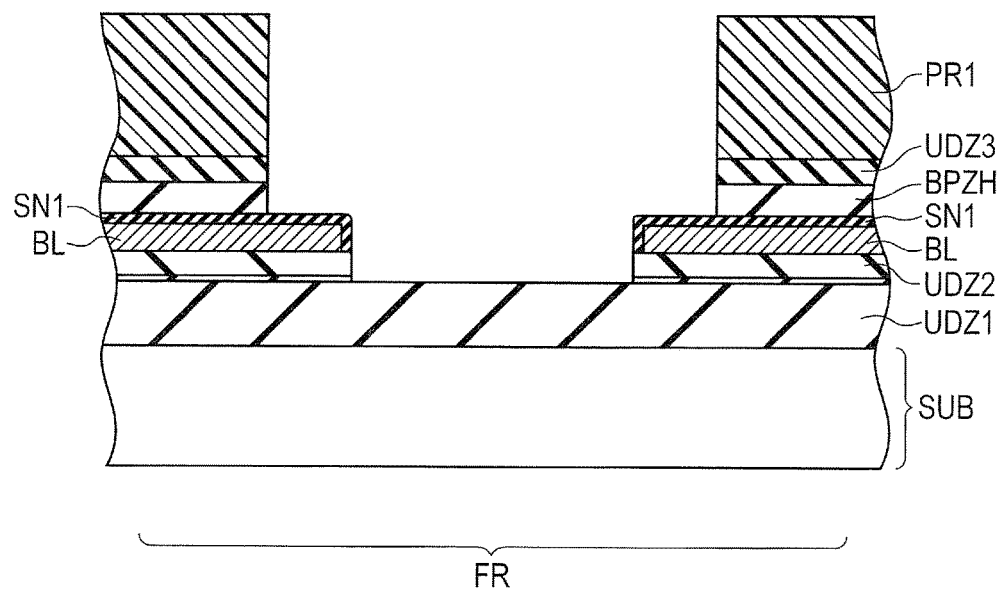
FIG. 61 is a cross-sectional view of the fuse portion in the step shown in FIG. 60 in Second Embodiment.

Next, a method of manufacturing the semiconductor device of First Example will be described. First, after steps similar to the steps from that shown in FIGS. 5 and 6 to the step shown in FIG. 10, a photoresist pattern PR1 is formed as shown in FIGS. 60 and 61. Next, with the photoresist pattern PR1 as an etching mask, etching is performed. During this etching, the interlayer insulating film BPZH located between one of the bit lines BL and the other bit line BL is almost completely removed without being left. The photoresist pattern PR1 is then removed.

Next, after steps similar to those shown in FIGS. 13 and 15, an interlayer insulating film UDZ4 not doped with an impurity such as boron is formed so as to cover a region from which the boron-doped interlayer insulating film BPZH is removed and which is located between one of the bit lines BL and the other bit line BL (refer to FIG. 59). After steps similar to the steps from the step shown in FIGS. 16 and 18 to the step shown in FIGS. 30 and 31, the semiconductor device shown in FIGS. 58 and 59 is then manufactured.

In the fuse portion FR of the semiconductor device of First Example, the boron-doped interlayer insulating film BPZH covers the bit lines BL while being separated from the contact plugs CPG. In addition, in a region located between an end portion of one of the bit lines BL and an end portion of the other bit line BL, the boron-doped interlayer insulating film BPZH is not left and the interlayer insulating film UDZ4 not doped with an impurity such as boron lies.

Even when both the fuse FUS and the contact plug CPG inevitably evaporate simultaneously by fusion-cutting of the fuse FUS, the interlayer insulating film UDZ4 not doped with an impurity such as boron is exposed from the side wall of the contact hole CPGH and exposure of the boron-doped interlayer insulating film BPZH can be prevented completely (refer to FIG. 39). In the environmental test, therefore, the reaction between ($H_2O$) and boron can be prevented further and as a result, cracking, peeing, or the like (HAST failures) of the film can be more completely prevented.

Second Example

In Second Example, one of the variations of the manufacturing method will be described, in which the series of steps for removing the interlayer insulating film BPZH located in the fuse portion FR are performed before formation of the local wiring 2G.

Figure 62:
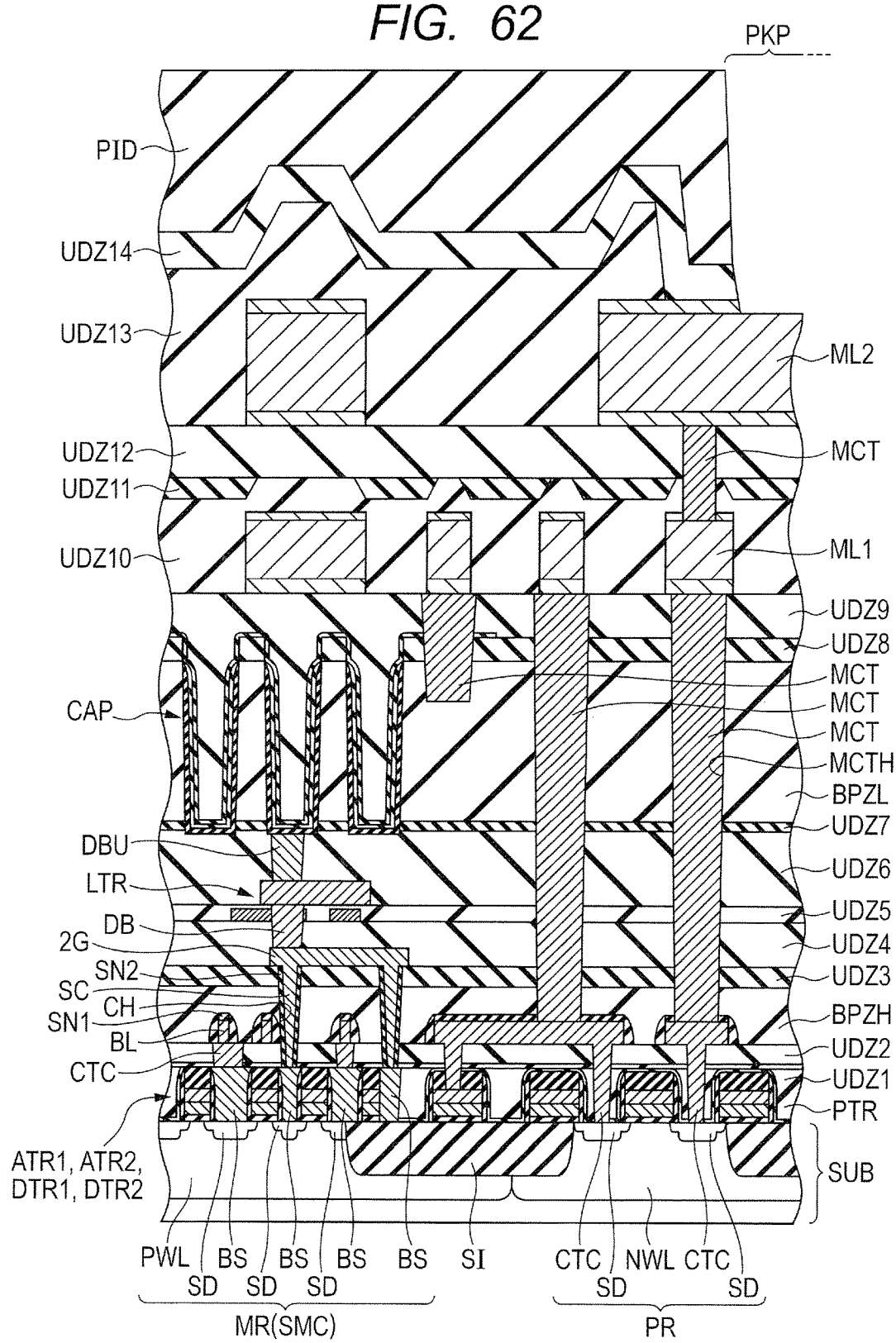
FIG. 62 is a cross-sectional view showing the structure of the memory cell portion and the peripheral circuit portion of the semiconductor device of Second Example of Second Embodiment.
Figure 63:
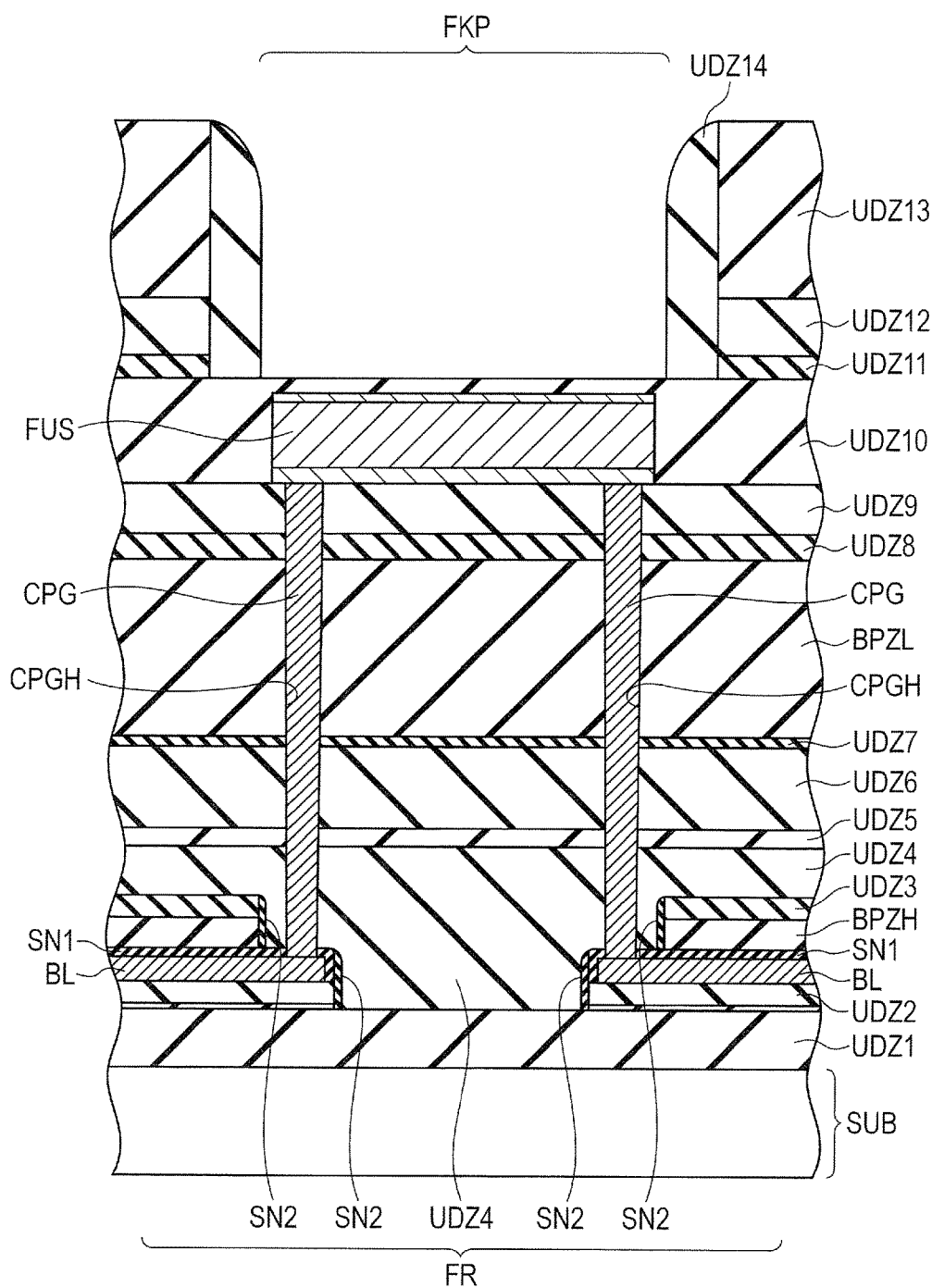
FIG. 63 is a cross-sectional view showing the structure of the fuse portion of the semiconductor device of Second Example of Second Embodiment.

In Second Example, the series of steps for removing the interlayer insulating film BPZH located in the fuse portion FR are performed before formation of the local wiring 2G to additionally form a sidewall insulating film in the fuse portion FR. As shown in FIGS. 62 and 63, a silicon nitride film SN2 covers, as a sidewall insulating film, the end surface of each of the residual interlayer insulating film BPZH and interlayer insulating film UDZ3 in the fuse portion FR of the semiconductor device. The silicon nitride film SN2 is also formed on the end surface of the silicon nitride film SN1 that covers therewith the bit line BL, and covers the end surface.

This silicon nitride film SN2 is made of a silicon nitride film same as the silicon nitride film SN2 that cover the side wall of the contact hole CH located in the memory cell portion MR. The other configuration is similar to the configuration of the semiconductor device (First Example of Second Embodiment) shown in FIGS. 58 and 59 so that like members are denoted by like reference characters and an overlapping description is omitted unless otherwise necessary.

Figure 64:
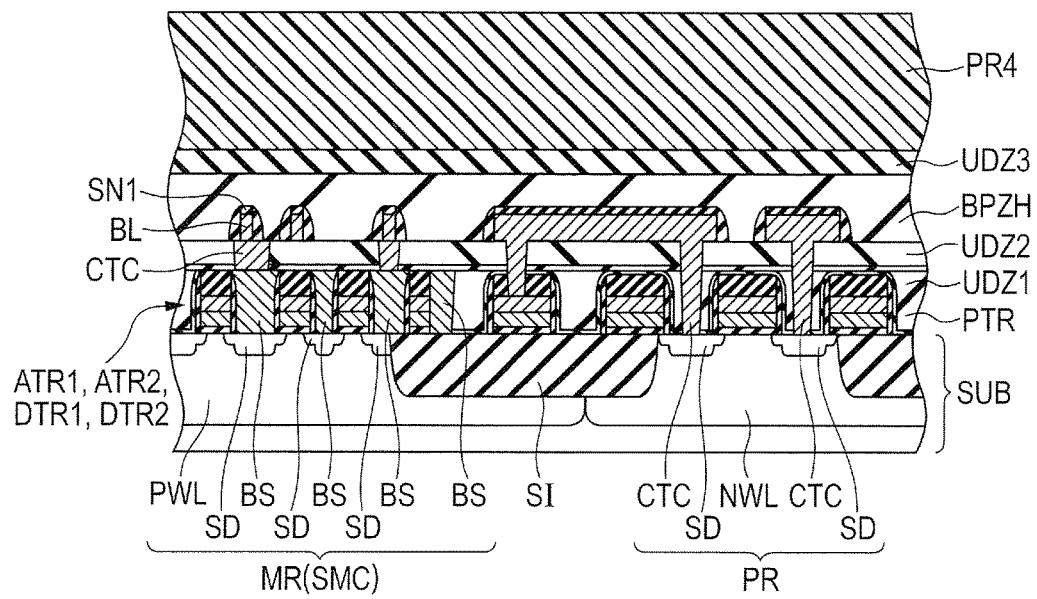
FIG. 64 is a cross-sectional view of the memory cell portion and the peripheral circuit portion showing a step of the method of manufacturing the semiconductor device of Second Example of Second Embodiment.
Figure 65:
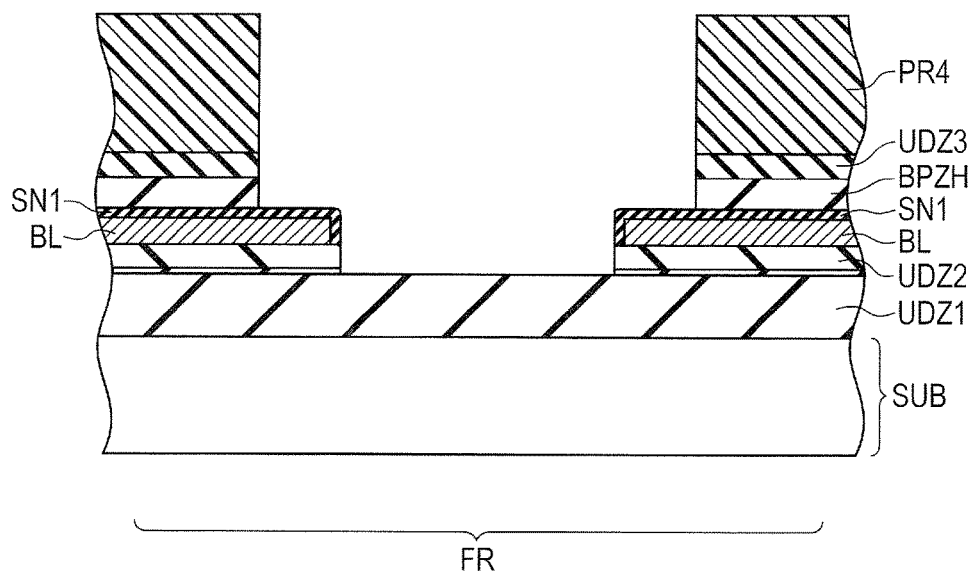
FIG. 65 is a cross-sectional view of the fuse portion in the step shown in FIG. 64 in Second Embodiment.

Next, a method of manufacturing the semiconductor device of Second Example will be described. After steps similar to those from the step shown in FIGS. 46 and 47 to the step shown in FIGS. 48 and 49, predetermined photolithography is performed as shown in FIGS. 64 and 65 to form a photoresist pattern that exposes a portion of the interlayer insulating film UDZ3 located in the fuse portion FR and covers the memory cell portion MR and the like. This photoresist pattern PR4 is, similar to the photoresist pattern PR1 shown in FIG. 10, formed so as not to cover a region including a place where the contact plug CPG (refer to FIG. 63) is in contact with the bit line BL.

Next, with the photoresist pattern PR4 as an etching mask, etching is performed. By this etching, the interlayer insulating film BPZH located between one of the bit lines BL and the other bit line BL is removed almost completely without being left. The photoresist pattern PR4 is then removed. Next, after steps similar to those from the step shown in FIGS. 51 and 52 to the step shown in FIG. 57, steps similar to those from the step shown in FIGS. 14 and 15 to the step shown in FIGS. 30 and 31 are performed to manufacture the semiconductor device shown in FIGS. 62 and 63.

In the semiconductor device of Second Example, similar to the semiconductor device of First Example, the boron-doped interlayer insulating film BPZH is formed in the fuse portion FR of the semiconductor device so as to cover therewith the bit lines BL while being separated from the contact plugs CPG. In addition, in a region located between an end portion of one of the bit lines BL and an end portion of the other bit line BL, the boron-doped interlayer insulating film BPZH is not left and an interlayer insulating film UDZ4 not doped with an impurity such as boron is formed.

Even when fusion-cutting of the fuse FUS causes simultaneous evaporation of both the fuse FUS and the contact plug CPG, the interlayer insulating film UDZ4 not doped with an impurity such as boron is exposed from the side wall of the contact hole CPGH and exposure of the boron-doped interlayer insulating film BPZH can be prevented completely (refer to FIG. 39). In the environmental test, reaction between water ($H_2O$) and boron can be suppressed further and cracking, peeling, or the like (HAST failures) can be prevented more completely.

Third Embodiment

In the description of First Embodiment and Second Embodiment, the interlayer insulating film BPZH that covers the bit lines BL therewith is separated from contact plugs. In the following description of this embodiment, on the other hand, the interlayer insulating film BPZH that covers the bit lines BL therewith has a portion with a relatively thin film thickness and contact plugs are caused to penetrate this thin film portion.

First Example

In the following description of First Example, the series of steps for partially removing the interlayer insulating film BPZH located in the fuse portion FR are performed after formation of the local wiring 2G but before formation of the interlayer insulating film UDZ4 that covers the local wiring 2G.

Figure 66:
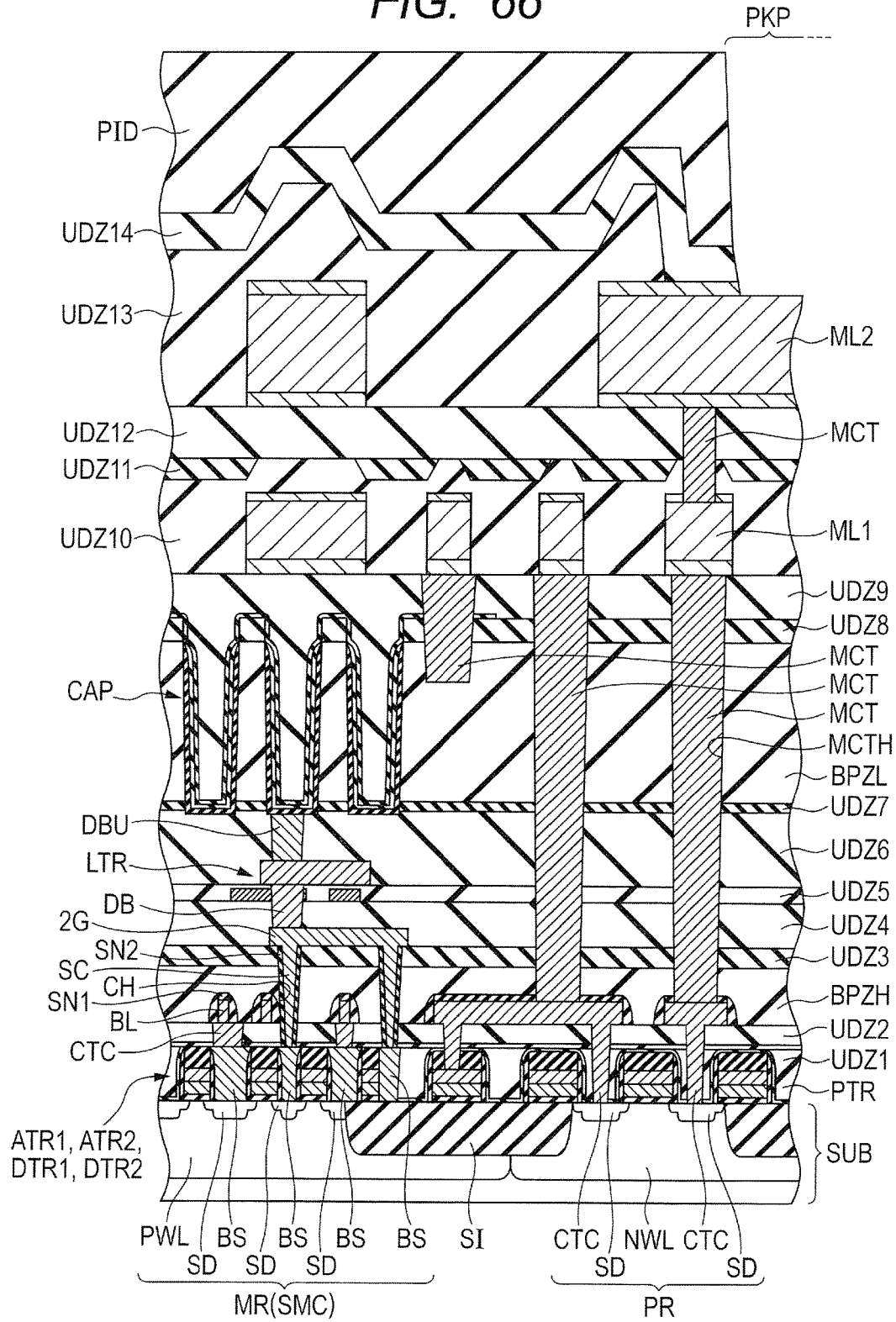
FIG. 66 is a cross-sectional view showing the structure of the memory cell portion and the peripheral circuit portion of a semiconductor device of First Example of Third Embodiment.
Figure 67:
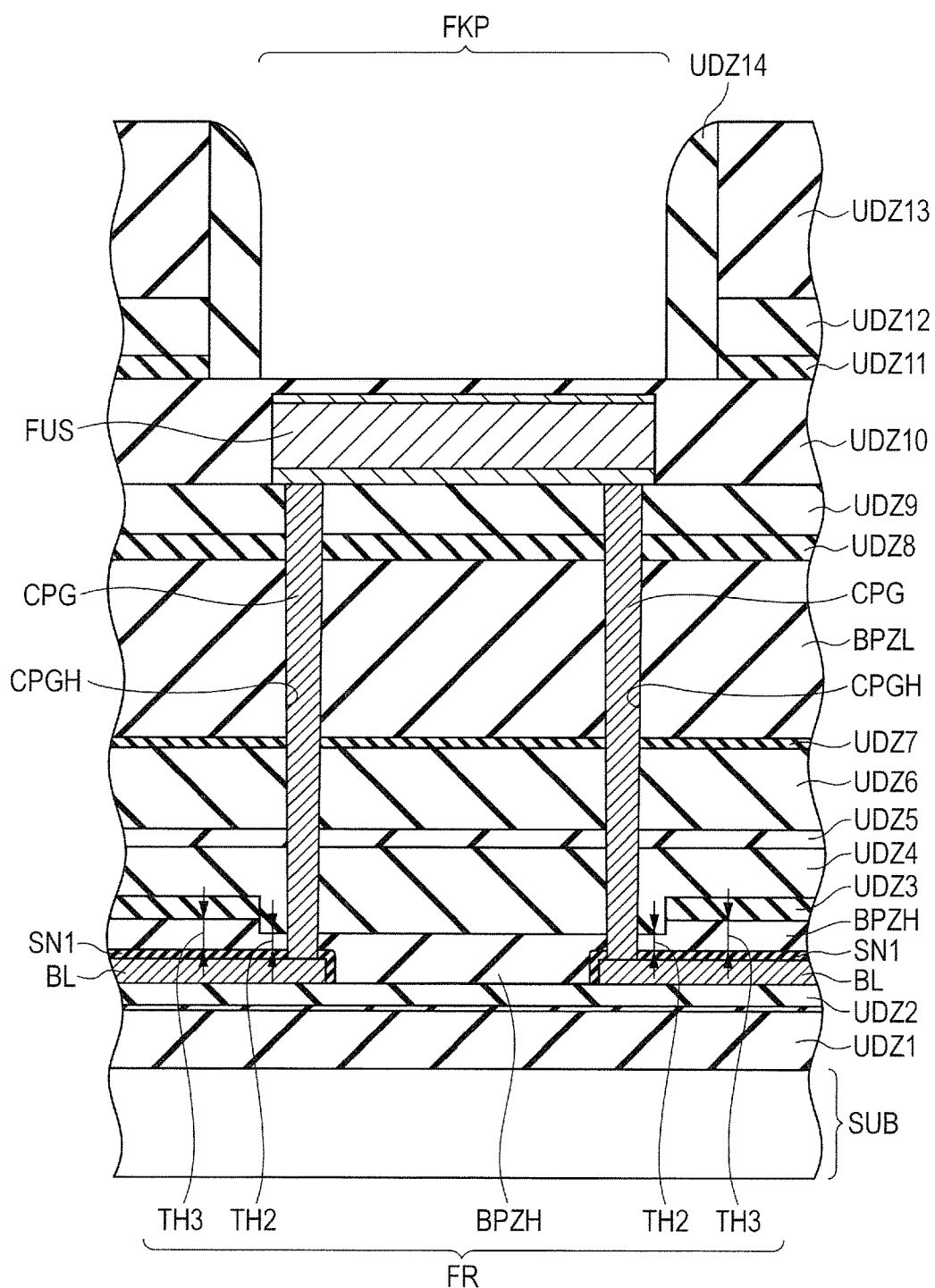
FIG. 67 is a cross-sectional view of the fuse portion of the semiconductor device of First Example of Third Embodiment.

As shown in FIGS. 66 and 67, in the fuse portion FR of the semiconductor device, the boron-doped interlayer insulating film BPZH that covers the bit lines BL has a portion with a relatively thin film thickness (film thickness TH2) and a relatively thick film thickness (film thickness TH3). The contact plugs CPG penetrate the thin film portion and are coupled to the bit lines BL.

The other configuration is similar to that of the semiconductor device (First Example of First Embodiment) shown in FIGS. 3 and 4 so that like members are denoted by like reference characters and an overlapping description is omitted unless otherwise necessary.

Figure 68:
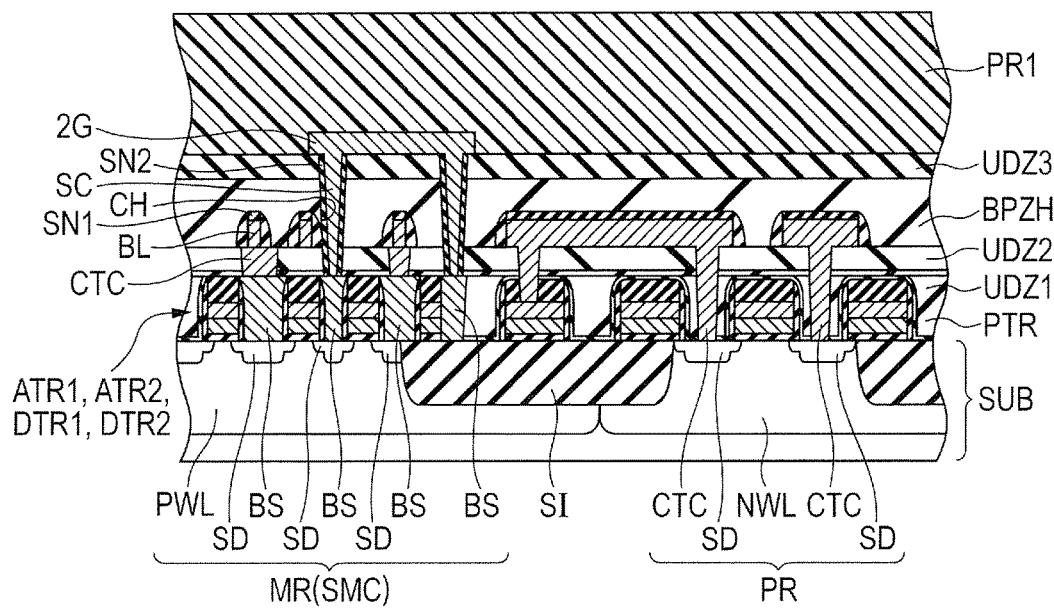
FIG. 68 is a cross-sectional view of the memory cell portion and the peripheral circuit portion showing a step of a method of manufacturing the semiconductor device of First Example of Third Embodiment.
Figure 69:
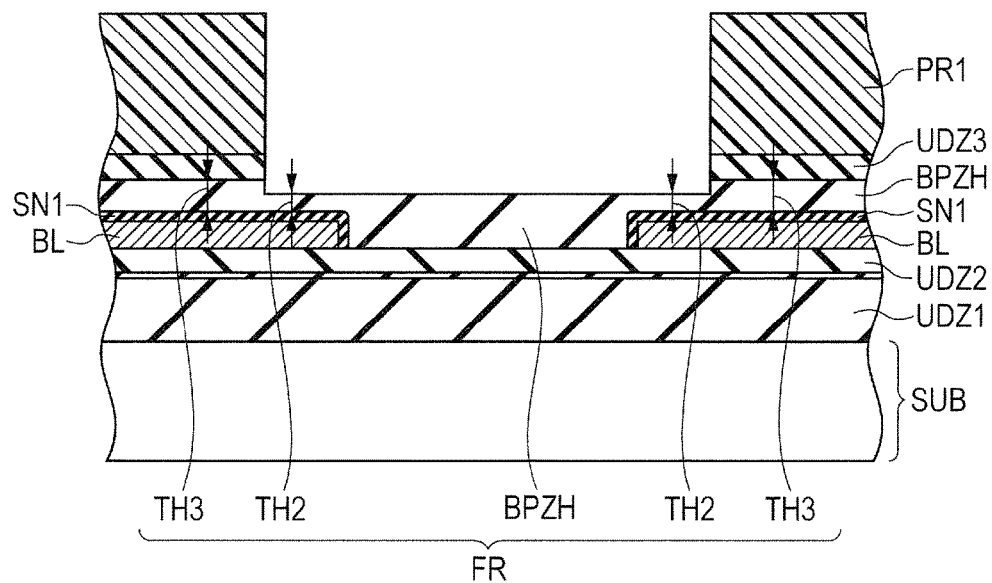
FIG. 69 is a cross-sectional view of the fuse portion in the step shown in FIG. 68 in Third Embodiment.

Next, a method of manufacturing a semiconductor device of First Example will be described. After steps similar to those from the step shown in FIGS. 5 and 6 to the step shown in FIG. 10, a photoresist pattern PR1 is formed as shown in FIGS. 68 and 69. Next, with the photoresist pattern PR1 as an etching mask, etching is performed. During etching, an exposed portion of the interlayer insulating film BPZH is removed to make the film thickness TH2 of the exposed portion of the interlayer insulating film BPZH thinner than the film thickness TH3 of a portion of the interlayer insulating film BPZH covered with the photoresist pattern PR1. The photoresist pattern PR1 is then removed.

Next, after steps similar to those shown in FIGS. 13 and 15, an interlayer insulating film UDZ4 not doped with an impurity such as boron is formed (refer to FIGS. 66 and 67). Steps similar to those from the step shown in FIGS. 16 and 18 to the step shown in FIGS. 30 and 31 are then performed to manufacture the semiconductor device as shown in FIGS. 66 and 67.

In the fuse portion of the semiconductor device of First Example, the interlayer insulating film BPZH formed by partial etching has a portion that covers the bit lines BL with the film thickness TH2 thinner than the original film thickness TH3. The contact plugs CPG penetrate this thin portion and are coupled to the bit lines BL.

As described above in First Embodiment, the present inventors evaluated the dependency of HAST failures on the thickness (on the bit line) of the interlayer insulating film and found that HAST failures decrease with a decrease in the thickness of the boron-doped interlayer insulating film as shown in FIG. 41.

Here, a comparison is made between the semiconductor device of First Example and the semiconductor device of Comparative Example (refer to FIGS. 36 and 37) in the thickness of the interlayer insulating film BPZH through which the contact plugs CPG penetrate. In the semiconductor device of Comparative Example, the interlayer insulating film BPZH has a film thickness of TH3, while the film thickness TH2 of the semiconductor device of First Example becomes thinner than the film thickness TH3 as a result of etching. It is therefore presumed that HAST failures can be suppressed in the semiconductor device of First Example compared with the semiconductor device of Comparative Example.

In addition, remaining of the interlayer insulating film BPZH is allowed in a region including a place where the contact plug CP is in contact with the bit line insofar as HAST failures can be suppressed, which facilitates process control upon etching of the interlayer insulating film BPZH.

Second Example

In Second Example, the series of steps for partially removing the interlayer insulating film BPZH located in the fuse portion FR before formation of the local wiring 2G will be described as a variation of the manufacturing method.

Figure 70:
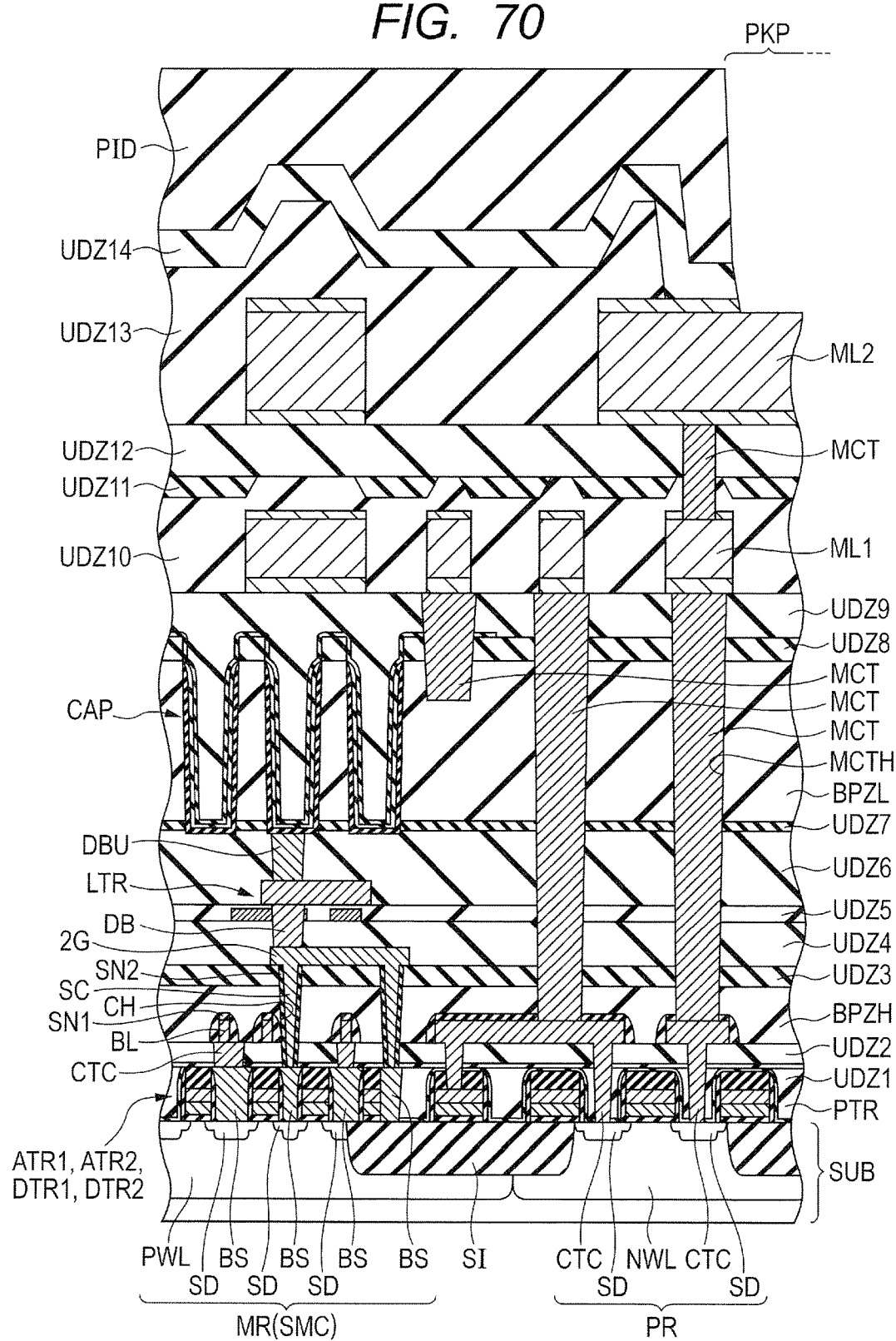
FIG. 70 is a cross-sectional view showing the structure of the memory cell portion and the peripheral circuit portion of a semiconductor device of Second Example of Third Embodiment.
Figure 71:
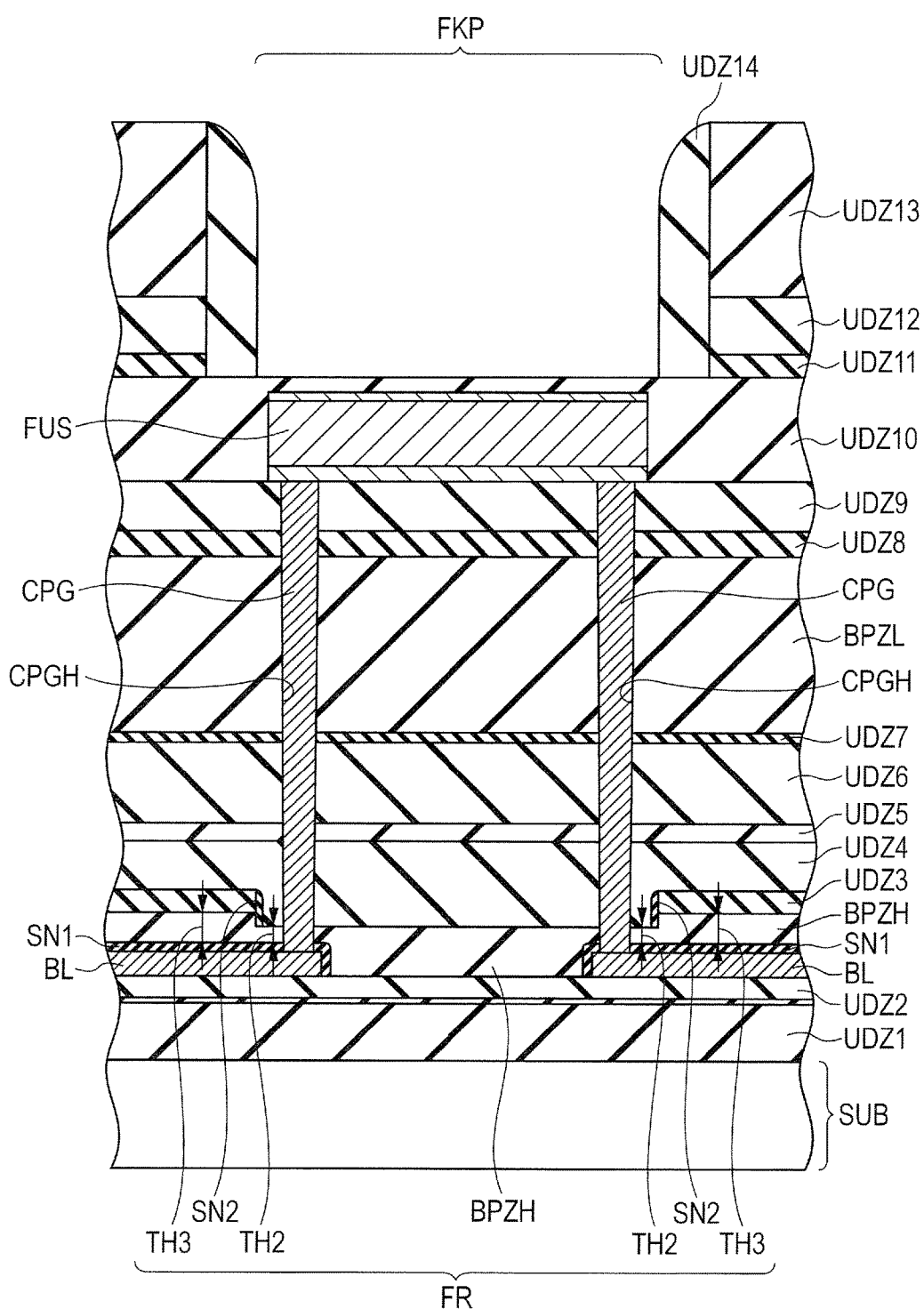
FIG. 71 is a cross-sectional view showing the structure of a fuse portion of the semiconductor device of Second Example of Third Embodiment.

In Second Example, the series of steps for partially removing the interlayer insulating film BPZH located in the fuse portion FR are performed before formation of the local wiring 2G to additionally form a sidewall insulating film in the fuse portion FR. As shown in FIGS. 70 and 71, in the fuse portion FR of the semiconductor device, a silicon nitride film SN2 is formed as a sidewall insulating film so as to cover the end surface of each of the residual interlayer insulating film BPZH and interlayer insulating film UDZ3.

This silicon nitride film SN2 is made of a silicon nitride film same as the silicon nitride film SN2 that cover the side wall of the contact hole CH located in the memory cell portion MR. The other configuration is similar to the configuration of the semiconductor device (First Example of Third Embodiment) shown in FIGS. 66 and 67 so that like members are denoted by like reference characters and an overlapping description is omitted unless otherwise necessary.

Figure 72:
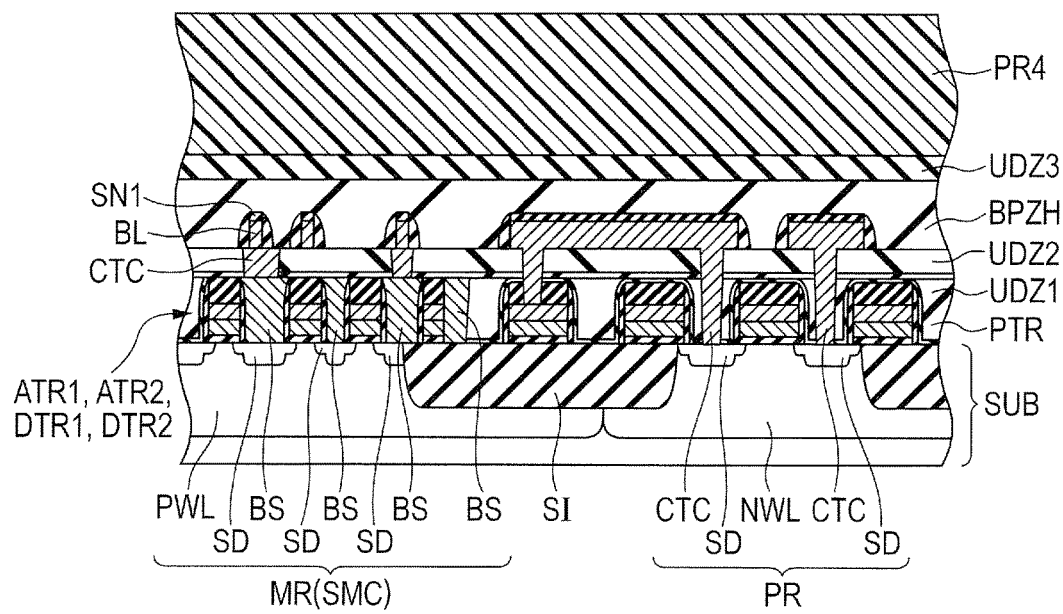
FIG. 72 is a cross-sectional view of the memory cell portion and the peripheral circuit portion showing a step of a method of manufacturing the semiconductor device of Second Example of Third Embodiment.
Figure 73:
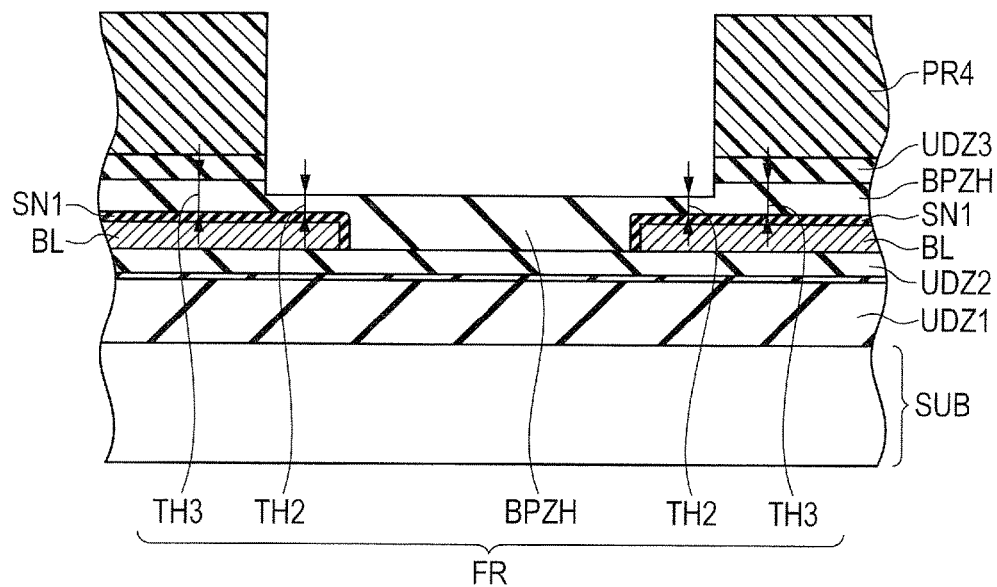
FIG. 73 is a cross-sectional view of the fuse portion in the step shown in FIG. 72 in Third Embodiment.

Next, a method of manufacturing the semiconductor device of Second Example will be described. After steps similar to those from the step shown in FIGS. 46 and 47 to the step shown in FIGS. 48 and 49, predetermined photolithography is performed as shown in FIGS. 72 and 73 to form a photoresist pattern PR4 that exposes a portion of the interlayer insulating film UDZ3 located in the fuse portion FR and covers the memory cell portion MR and the like. This photoresist pattern PR4 is, similar to the photoresist pattern PR1 shown in FIG. 10, formed so as not to cover a region including a place where the contact plug CPG (refer to FIG. 71) is in contact with the bit line BL.

Next, with the photoresist pattern PR4 as an etching mask, etching is performed. An exposed portion of the interlayer insulating film BPZH is removed so that the film thickness TH2 of the exposed portion of the interlayer insulating film BPZH becomes thinner than the film thickness TH3 of a portion of the interlayer insulating film BPZH covered with the photoresist pattern PR4. The photoresist pattern PR4 is then removed.

Next, after steps similar to those from the step shown in FIGS. 51 and 52 to the step shown in FIG. 57, steps similar to those from the step shown in FIGS. 14 and 15 to the step shown in FIGS. 30 and 31 are performed to manufacture the semiconductor device shown in FIGS. 62 and 63.

In the fuse portion of the semiconductor device of Second Example, similar to that of the semiconductor device of First Example, the interlayer insulating film BPZH has a portion that covers the bit lines BL with the film thickness TH2 thinner than the original film thickness TH3 as a result of partial etching. The contact plugs CPG penetrate this thin portion and are coupled to the bit lines BL.

Similar to the semiconductor device of First Example described above, the semiconductor device of the present example is presumed to be able to suppress HAST failures more compared with the semiconductor device of Comparative Example. In addition, the interlayer insulating film BPZH is allowed to remain in a region including a place where the contact plug CP is in contact with the bit line insofar as HAST failures can be suppressed, making it possible to facilitate process control upon etching of the interlayer insulating film BPZH.

In the semiconductor device of Second Example of each Embodiment, a sidewall insulating film formed to cover the end surface of the interlayer insulating film BPZH can completely inhibit diffusion of boron in the interlayer insulating film BPZH into the interlayer insulating film UDZ4.

The semiconductor device of each Embodiment has been described with SRAM memory cell as an example of a memory cell. The above-described technology can also be applied to, for example, a semiconductor device equipped with a memory cell such as DRAM (dynamic random access memory). The fuse described above may be a LT fuse, but it can be applied to a fuse for switching a power source or the like. Further, it can be applied not only to the memory cell but also a semiconductor device equipped with a structure having a boron-doped interlayer insulating film buried between wirings.

The semiconductor devices described above in various Embodiments can be used in combination as needed.

The inventions made by the present inventors have been described specifically based on embodiments. It is needless to say that the invention is not limited to or by these embodiments and can be changed without departing from the gist of the invention.

The above-described Third Embodiment includes following modes.

(Addition Mode 1)

A method of manufacturing a semiconductor device, including the steps:

forming wirings including a first wiring extending in one direction on the main surface of a semiconductor substrate;

forming interlayer insulating films including a step of forming a first interlayer insulating film containing first boron so as to cover the semiconductor substrate, forming contact plugs including a first contact plug that penetrates the interlayer insulating films and is in contact with the first wiring; and forming a fuse in contact with the first contact plug on the surface of the interlayer insulating film;

wherein the step of forming a first interlayer insulating film is including the steps:

forming the first interlayer insulating film so as to cover, with a first film thickness thereof, the first wiring; and removing a portion of the first interlayer insulating film located in a region including a place where the first contact plug is in contact with the first wiring to form a portion that covers the first wiring with a second film thickness smaller than the first film thickness; and wherein the step of forming contact plugs includes a step of forming the first contact plug so that it penetrates a portion of the first interlayer insulating film that covers the first wiring with the second film thickness.

(Addition Mode 2)

The method of manufacturing a semiconductor device as described above in Addition mode 1, including a step of forming a plurality of memory cells on the main surface of the semiconductor substrate;

wherein the step of forming a first interlayer insulating film includes a step of forming the first interlayer insulating film so as to cover the plurality of memory cells therewith; and wherein the step of forming wirings includes a step of forming, as the first firing, a bit line to be electrically coupled to one of the memory cells.

What is claimed is:

1. A semiconductor device, comprising
a semiconductor substrate having a main surface;
wirings formed over the main surface of the semiconductor substrate and including a first wiring extending in one direction;
a fuse separated from the wirings in a direction separating from the main surface;
contact plugs including a first contact plug in contact with each of the first wiring and the fuse and electrically coupling the first wiring to the fuse;
a first interlayer insulating film containing boron formed on the first wiring; and
a second interlayer insulating film, distinct from the first interlayer insulating film, formed between the first interlayer insulating film and the first contact plug so as to separate the first interlayer insulating film from the first contact plug,
wherein the first interlayer insulating film and the second interlayer insulating film are formed between the fuse and the first wiring.

2. The semiconductor device according to claim 1, wherein the wirings include a second wiring extending in the one direction,
wherein the first wiring and the second wiring are placed so that an end portion of the first wiring and an end portion of the second wiring are placed so as to face to each other with a distance in the one direction,
wherein the contact plugs include a second contact plug in contact with each of the second wiring and the fuse and electrically coupling the second wiring to the fuse,
wherein the first interlayer insulating film is formed so as to cover the second wiring while being separated from the second contact plug and is formed in a region located between the end portion of the first wiring and the end portion of the second wiring, and
wherein a portion of the first interlayer insulating film formed in a region located between the end portion of the first wiring and the end portion of the second wiring is separated from each of the first contact plug and the second contact plug.

3. The semiconductor device according to claim 1, wherein the wirings include a second wiring extending in the one direction,
wherein the first wiring and the second wiring are placed so that an end portion of the first wiring and an end portion of the second wiring are placed so as to face to each other with a distance in the one direction,
wherein the contact plugs include a second contact plug in contact with each of the second wiring and the fuse and electrically coupling the second wiring to the fuse, and
wherein the first interlayer insulating film is formed so as to cover the second wiring while being separated from the second contact plug and is not formed in a region located between the end portion of the first wiring and the end portion of the second wiring.

4. The semiconductor device according to claim 1,
wherein the interlayer insulating films include a second-boron-containing second interlayer insulating film formed between the first interlayer insulating film and the fuse, and
wherein a concentration of the first boron contained in the first interlayer insulating film is set higher than a concentration of the second boron contained in the second interlayer insulating film.

5. The semiconductor device according to claim 1,
wherein the semiconductor substrate has, over the main surface thereof, a plurality of memory cells,
wherein the first interlayer insulating film covers the memory cells, and
wherein the wirings include, as the first wiring, a bit line electrically coupled to one of the memory cells.

6. The semiconductor device according to claim 5,
wherein the memory cells include a static random access memory cell.

7. The semiconductor device according to claim 1,
wherein a sidewall insulating film is formed so as to cover an end surface of the first interlayer insulating film.

8. A semiconductor device, comprising:
a semiconductor substrate having a main surface;
wirings formed over the main surface of the semiconductor substrate and including a first wiring extending in one direction;
a fuse separated from the wirings in a direction separating from the main surface;
contact plugs including a first contact plug in contact with each of the first wiring and the fuse and electrically coupling the first wiring to the fuse;
a first interlayer insulating film containing boron formed on the first wiring; and
a second interlayer insulating film, distinct from the first interlayer insulating film, formed between the fuse and the first interlayer insulating film;
wherein the first interlayer insulating film comprises a first portion and a second portion, wherein the first portion has first thickness in a first direction from the fuse to the first wiring and the second portion has a second thickness in the first direction, wherein the second thickness is smaller than the first thickness, and
wherein the first contact plug is in contact with the first wiring while penetrating through the second portion.

9. The semiconductor device according to claim 8,
wherein the semiconductor substrate has, over the main surface thereof, a plurality of memory cells,
wherein the first interlayer insulating film covers the memory cells; and
wherein the wirings include, as the first wiring, a bit line that is electrically coupled to one of the memory cells.

10. The semiconductor device according to claim 9,
wherein the memory cells include a static random access memory cell.

11. The semiconductor device according to claim 8,
wherein a sidewall insulating film covers an end surface of the first interlayer insulating film.

* * * * *